(12) United States Patent
Yamazaki et al.

(10) Patent No.: US 9,754,973 B2
(45) Date of Patent: Sep. 5, 2017

(54) DISPLAY DEVICE

(71) Applicant: Semiconductor Energy Laboratory Co., Ltd., Atsugi-shi, Kanagawa-ken (JP)

(72) Inventors: Shunpei Yamazaki, Tokyo (JP); Hiroki Ohara, Kanagawa (JP); Toshinari Sasaki, Kanagawa (JP); Kosei Noda, Kanagawa (JP); Hideaki Kuwabara, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/063,664

(22) Filed: Mar. 8, 2016

(65) Prior Publication Data

US 2016/0190175 A1   Jun. 30, 2016

Related U.S. Application Data

(60) Continuation of application No. 14/732,874, filed on Jun. 8, 2015, now Pat. No. 9,293,601, which is a
(Continued)

(30) Foreign Application Priority Data

Jul. 31, 2009   (JP) ................ 2009-179773

(51) Int. Cl.
*H01L 29/00*   (2006.01)
*H01L 27/00*   (2006.01)
(Continued)

(52) U.S. Cl.
CPC ........ *H01L 27/1225* (2013.01); *G02F 1/1337* (2013.01); *G02F 1/1368* (2013.01);
(Continued)

(58) Field of Classification Search
CPC ............... H01L 27/124; H01L 27/1248; H01L 27/1225; H01L 29/7869; H01L 29/24;
(Continued)

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

CN   001806322 A   7/2006
CN   101183679 A   5/2008
(Continued)

OTHER PUBLICATIONS

Asakuma.N. et al., "Crystallization and Reduction of Sol-Gel-Derived Zinc Oxide Films by Irradiation With Ultraviolet lamp", Journal of Sol-Gel Science and Technology, 2003, vol. 26, pp. 181-184.
(Continued)

*Primary Examiner* — Nikolay Yushin
(74) *Attorney, Agent, or Firm* — Fish & Richardson P.C.

(57) ABSTRACT

An object is to provide a semiconductor device having a structure with which parasitic capacitance between wirings can be sufficiently reduced. An oxide insulating layer serving as a channel protective layer is formed over part of an oxide semiconductor layer overlapping with a gate electrode layer. In the same step as formation of the oxide insulating layer, an oxide insulating layer covering a peripheral portion of the oxide semiconductor layer is formed. The oxide insulating layer which covers the peripheral portion of the oxide semiconductor layer is provided to increase the distance between the gate electrode layer and a wiring layer formed above or in the periphery of the gate electrode layer, whereby parasitic capacitance is reduced.

17 Claims, 39 Drawing Sheets

Related U.S. Application Data continuation of application No. 14/472,618, filed on Aug. 29, 2014, now Pat. No. 9,224,870, which is a continuation of application No. 13/751,189, filed on Jan. 28, 2013, now Pat. No. 8,822,990, which is a division of application No. 12/846,534, filed on Jul. 29, 2010, now Pat. No. 8,546,180.

(51) Int. Cl.

| | | |
|---|---|---|
| *H01L 27/12* | (2006.01) | |
| *G02F 1/1337* | (2006.01) | |
| *G02F 1/1368* | (2006.01) | |
| *G02F 1/1333* | (2006.01) | |
| *G02F 1/1343* | (2006.01) | |
| *G02F 1/1362* | (2006.01) | |
| *H01L 29/24* | (2006.01) | |
| *H01L 29/51* | (2006.01) | |
| *H01L 29/786* | (2006.01) | |

(52) U.S. Cl.
CPC .. *G02F 1/133345* (2013.01); *G02F 1/134309* (2013.01); *G02F 1/136227* (2013.01); *G02F 1/136277* (2013.01); *H01L 27/124* (2013.01); *H01L 27/1214* (2013.01); *H01L 27/1248* (2013.01); *H01L 29/24* (2013.01); *H01L 29/517* (2013.01); *H01L 29/7869* (2013.01); *H01L 29/78609* (2013.01)

(58) Field of Classification Search
CPC .............. H01L 29/78621; G02F 1/1337; G02F 1/133345; G02F 1/136277; G02F 1/136227; G02F 1/134309; G02F 1/1368
See application file for complete search history.

(56) References Cited

U.S. PATENT DOCUMENTS

| | | | |
|---|---|---|---|
| 6,261,881 B1 | 7/2001 | Yamazaki et al. | |
| 6,281,552 B1 | 8/2001 | Kawasaki et al. | |
| 6,294,274 B1 | 9/2001 | Kawazoe et al. | |
| 6,500,701 B2 | 12/2002 | Higashi et al. | |
| 6,525,379 B2 | 2/2003 | Nomoto et al. | |
| 6,563,174 B2 | 5/2003 | Kawasaki et al. | |
| 6,614,076 B2 | 9/2003 | Kawasaki et al. | |
| 6,653,216 B1 | 11/2003 | Shimomaki et al. | |
| 6,674,136 B1 | 1/2004 | Ohtani | |
| 6,678,017 B1 | 1/2004 | Shimomaki et al. | |
| 6,700,134 B2 | 3/2004 | Yamazaki et al. | |
| 6,727,522 B1 | 4/2004 | Kawasaki et al. | |
| 6,809,382 B2 | 10/2004 | Kawasaki et al. | |
| 6,838,308 B2 | 1/2005 | Haga | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,132,687 B2 | 11/2006 | Kawasaki et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,382,421 B2 | 6/2008 | Hoffman et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,576,394 B2 | 8/2009 | Furuta et al. | |
| 7,601,984 B2 | 10/2009 | Sano et al. | |
| 7,642,038 B2 | 1/2010 | Fujii | |
| 7,674,650 B2 | 3/2010 | Akimoto et al. | |
| 7,732,819 B2 | 6/2010 | Akimoto et al. | |
| 7,968,885 B2 | 6/2011 | Kobayashi et al. | |
| 7,994,500 B2 | 8/2011 | Kim et al. | |
| 8,093,589 B2 | 1/2012 | Sugihara et al. | |
| 8,110,436 B2 | 2/2012 | Hayashi et al. | |
| 8,148,779 B2 | 4/2012 | Jeong et al. | |
| 8,178,884 B2 | 5/2012 | Ha et al. | |
| 8,188,480 B2 | 5/2012 | Itai | |
| 8,193,535 B2 | 6/2012 | Ha et al. | |
| 8,203,143 B2 | 6/2012 | Imai | |
| 8,222,092 B2 | 7/2012 | Yamazaki et al. | |
| 8,487,308 B2 | 7/2013 | Ikeda et al. | |
| 8,728,862 B2 | 5/2014 | Ha et al. | |
| 8,748,879 B2 | 6/2014 | Yano et al. | |
| 9,054,206 B2 | 6/2015 | Yamazaki et al. | |
| 2001/0017371 A1 | 8/2001 | Tanaka et al. | |
| 2001/0030323 A1 | 10/2001 | Ikeda | |
| 2001/0045558 A1 | 11/2001 | Kawasaki et al. | |
| 2001/0046027 A1 | 11/2001 | Tai et al. | |
| 2002/0056838 A1 | 5/2002 | Ogawa | |
| 2002/0075423 A1 | 6/2002 | Fujino | |
| 2002/0132454 A1 | 9/2002 | Ohtsu et al. | |
| 2003/0127680 A1 | 7/2003 | Nomoto et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0119072 A1 | 6/2004 | Lee et al. | |
| 2004/0127038 A1 | 7/2004 | Carcia et al. | |
| 2005/0017302 A1 | 1/2005 | Hoffman | |
| 2005/0127380 A1 | 6/2005 | Kawasaki et al. | |
| 2005/0199959 A1 | 9/2005 | Chiang et al. | |
| 2005/0221203 A1 | 10/2005 | Fujii | |
| 2005/0275038 A1 | 12/2005 | Shih et al. | |
| 2006/0035452 A1 | 2/2006 | Carcia et al. | |
| 2006/0043377 A1 | 3/2006 | Hoffman et al. | |
| 2006/0043447 A1 | 3/2006 | Ishii et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0004202 A1 | 1/2007 | Fujii | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0058121 A1 | 3/2007 | Yamazaki et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0023703 A1 | 1/2008 | Hoffman et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |

(56) References Cited

U.S. PATENT DOCUMENTS

| | | |
|---|---|---|
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0173871 A1 | 7/2008 | Noda et al. |
| 2008/0182358 A1 | 7/2008 | Cowdery-Corvan et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0006833 A1 | 1/2010 | Ha et al. |
| 2010/0025678 A1 | 2/2010 | Yamazaki et al. |
| 2010/0032665 A1 | 2/2010 | Yamazaki et al. |
| 2010/0044701 A1 | 2/2010 | Sano et al. |
| 2010/0051938 A1 | 3/2010 | Hayashi et al. |
| 2010/0051943 A1 | 3/2010 | Fujii |
| 2010/0051949 A1 | 3/2010 | Yamazaki et al. |
| 2010/0065844 A1 | 3/2010 | Tokunaga |
| 2010/0072467 A1 | 3/2010 | Yamazaki et al. |
| 2010/0078633 A1 | 4/2010 | Watanabe |
| 2010/0084648 A1 | 4/2010 | Watanabe |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0136743 A1 | 6/2010 | Akimoto et al. |
| 2010/0140612 A1 | 6/2010 | Omura et al. |
| 2010/0163868 A1 | 7/2010 | Yamazaki et al. |
| 2010/0283049 A1 | 11/2010 | Sato et al. |
| 2011/0024740 A1 | 2/2011 | Yamazaki et al. |
| 2011/0024751 A1 | 2/2011 | Yamazaki et al. |
| 2011/0031491 A1 | 2/2011 | Yamazaki et al. |
| 2011/0037068 A1 | 2/2011 | Yamazaki et al. |
| 2011/0175090 A1 | 7/2011 | Sugihara et al. |
| 2011/0193083 A1 | 8/2011 | Kim et al. |
| 2011/0210328 A1 | 9/2011 | Yamazaki et al. |
| 2011/0212571 A1 | 9/2011 | Yamazaki et al. |
| 2011/0215318 A1 | 9/2011 | Yamazaki et al. |
| 2011/0215319 A1 | 9/2011 | Yamazaki et al. |
| 2012/0132908 A1 | 5/2012 | Sugihara et al. |
| 2012/0220077 A1 | 8/2012 | Ha et al. |
| 2012/0273779 A1 | 11/2012 | Yamazaki et al. |
| 2012/0273780 A1 | 11/2012 | Yamazaki et al. |
| 2012/0280230 A1 | 11/2012 | Akimoto et al. |

FOREIGN PATENT DOCUMENTS

| | | |
|---|---|---|
| CN | 101626036 A | 1/2010 |
| EP | 1737044 A | 12/2006 |
| EP | 2144294 A | 1/2010 |
| EP | 2226847 A | 9/2010 |
| GB | 2153589 | 8/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-136419 A | 6/1993 |
| JP | 05-251705 A | 9/1993 |
| JP | 06-317809 A | 11/1994 |
| JP | 08-264794 A | 10/1996 |
| JP | 09-263974 A | 10/1997 |
| JP | 11-505377 | 5/1999 |
| JP | 2000-044236 A | 2/2000 |
| JP | 2000-150900 A | 5/2000 |
| JP | 2000-150903 A | 5/2000 |
| JP | 2000-340801 A | 12/2000 |
| JP | 2000-357586 A | 12/2000 |
| JP | 2001-343659 A | 12/2001 |
| JP | 2002-050704 A | 2/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-227538 A | 8/2005 |
| JP | 2006-332497 A | 12/2006 |
| JP | 2007-073559 A | 3/2007 |
| JP | 2007-096055 A | 4/2007 |
| JP | 2007-123861 A | 5/2007 |
| JP | 2007-194594 A | 8/2007 |
| JP | 2008-124215 A | 5/2008 |
| JP | 2008-140984 A | 6/2008 |
| JP | 2009-099953 A | 5/2009 |
| JP | 2009-122253 A | 6/2009 |
| JP | 2009-141002 A | 6/2009 |
| JP | 2009-231613 A | 10/2009 |
| JP | 2010-016347 A | 1/2010 |
| JP | 2010-021520 A | 1/2010 |
| JP | 2010-040552 A | 2/2010 |
| JP | 2010-067954 A | 3/2010 |
| JP | 2010-263182 A | 11/2010 |
| KR | 2010-0005900 A | 1/2010 |
| KR | 2010-0061555 A | 6/2010 |
| TW | 583456 | 4/2004 |
| WO | WO-2004/114391 | 12/2004 |
| WO | WO-2008/126879 | 10/2008 |
| WO | WO-2008/136505 | 11/2008 |
| WO | WO-2009/041713 | 4/2009 |
| WO | WO-2009/072532 | 6/2009 |
| WO | WO-2009/136645 | 11/2009 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AmOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No1 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—Zn-oxide TFT", AM-FPD '09 Digest of Technical Papers, Jul. 1, 2009, pp. 41-44.

Godo.H et al., "P-9:Numerical Analysis on Temperature Dependence of Characteristics of Amorphous In—Ga—Zn-oxide TFT", SID Digest '09 : SID International Symposium Digest of Technical Papers, May 31, 2009, pp. 1110-1112.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Oxygen Vacancies in ZnO", Appl. Phys. Lett. (Applied Physics Letters), 2005, vol. 87, pp. 122102-1-122102-3.

Janotti.A et al., "Native Point Defects in ZnO", Phys. Rev. B (Physical Review. B), Oct. 4, 2007, vol. 76, No. 16, pp. 165202-1-165202-22.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.H et al., "22.1: Invited Paper: Technological Challenges for Large-Size AMOLED Display", SID Digest '08 : SID International Symposium Digest of Technical Papers, May 20, 2008, vol. 39, No. 1, pp. 291-294.

Kim.S et al., "High-Performance oxide thin film transistors passivated by various gas plasmas", 214th ECS Meeting, 2008, No. 2317, ECS.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M, "Synthesis of Homologous Compound with New Long-Period Structure", Nirim Newsletter, Mar. 1, 1995, vol. 150, pp. 1-4.

Nakamura.M et al., "The phase relations in the In2O3—Ga2ZnO4—ZnO system at 1350° C.", Journal of Solid-State Chemistry, Aug. 1, 1991, vol. 93, No. 2, pp. 298-315.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B) 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 16, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Amorphous Indium-Gallium-Zinc Oxide TFTs and Their Application for Large Size AMOLED", '08 Digest of Technical Papers, Jul. 2, 2008, pp. 275-278.

Park.J et al., "High performance amorphous oxide thin film transistors with self-aligned top-gate structure", IEDM 09 : Technical Digest of International Electron Devices Meeting, Dec. 7, 2009, pp. 191-194.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Quirk.M et al., "Semiconductor manufacturing technology", Prentice-Hall, 2001, pp. 314-320, Prentice-Hall, Inc.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Invitation to pay additional fees (application No. PCT/JP2010/062287), International Searching Authority, dated Aug. 24, 2010.

Chinese Office Action (Application No. 201080034955.9) Dated Mar. 24, 2014.

Taiwanese Office Action (Application No. 099125102) Dated Mar. 24, 2015.

Chinese Office Action (Application No. 201310317861.8) Dated May 27, 2015.

European Search Report (Application No. 10804307.6) Dated Sep. 9, 2015.

European Office Action (Application No. 10804307.6) dated Apr. 20, 2017.

Chinese Office Action (Application No. 20150037603.6) dated Jul. 4, 2017

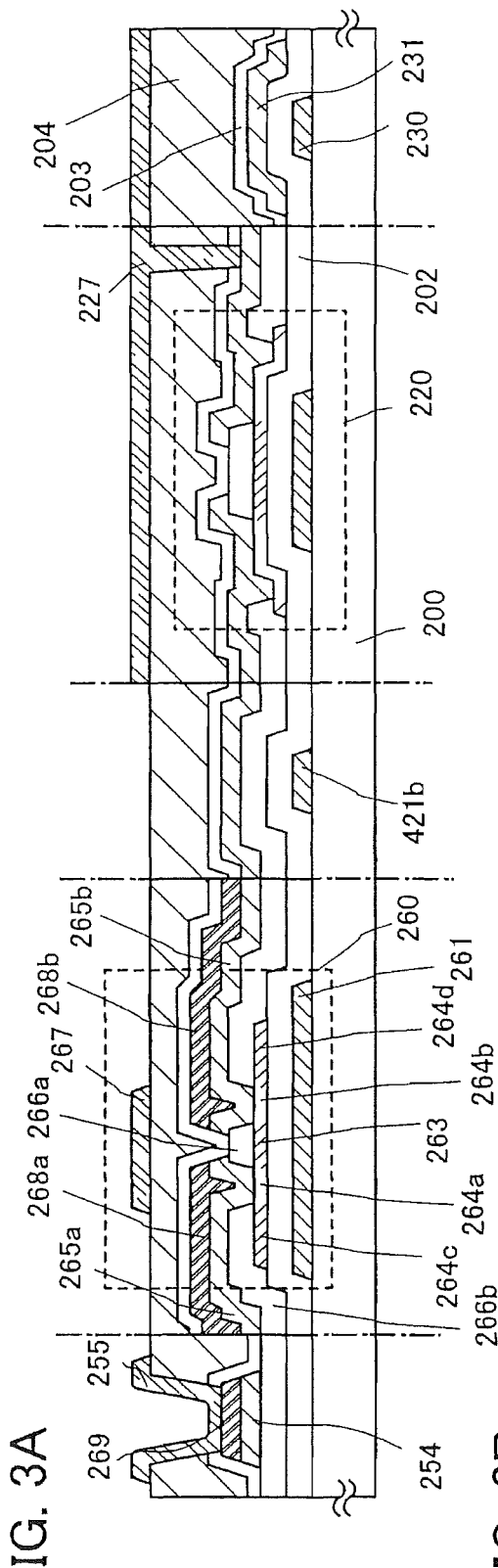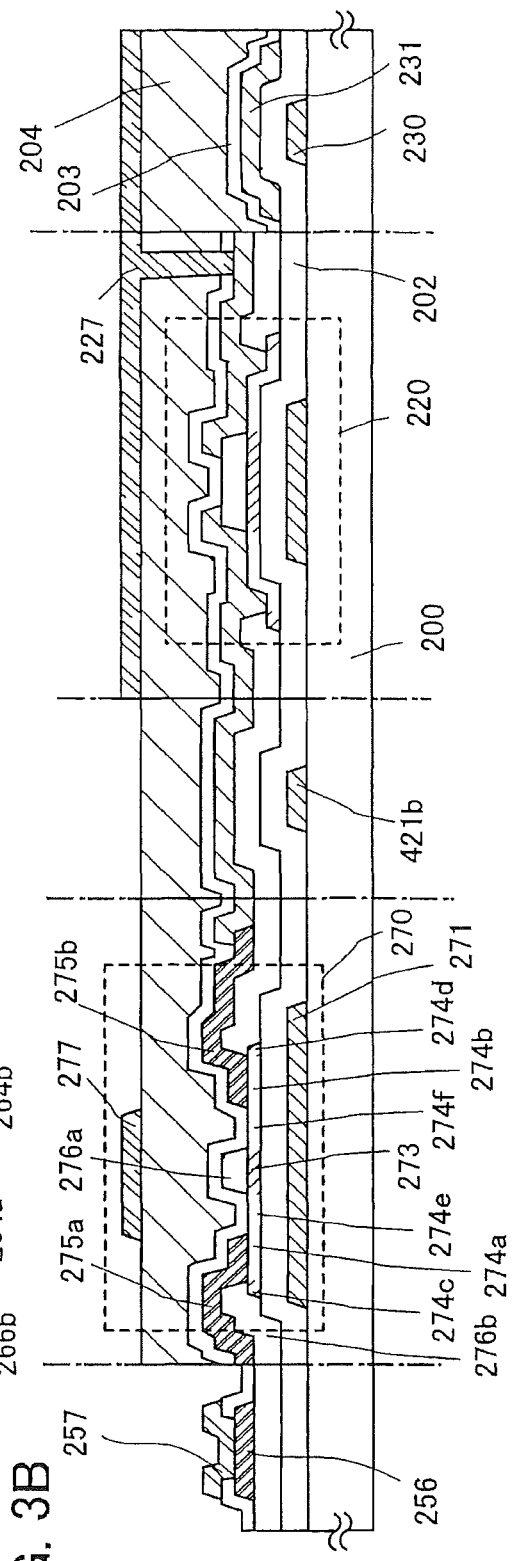

FIG. 4A1
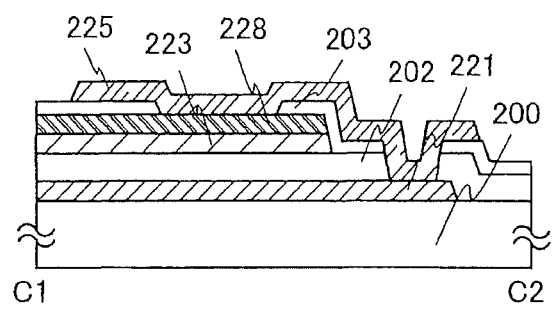
FIG. 4A2
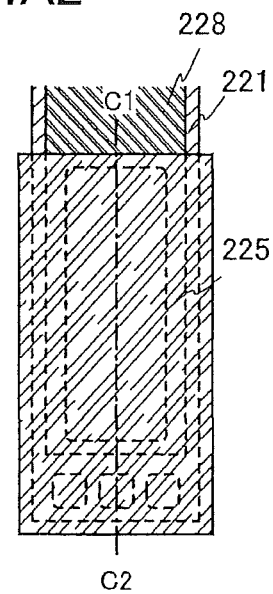
FIG. 4B1
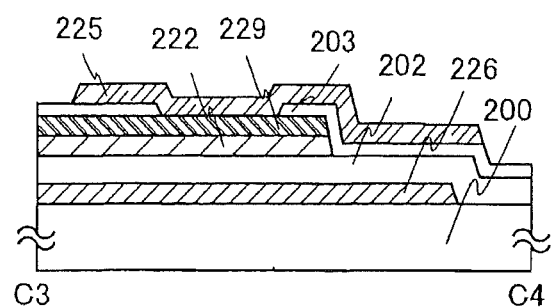
FIG. 4B2
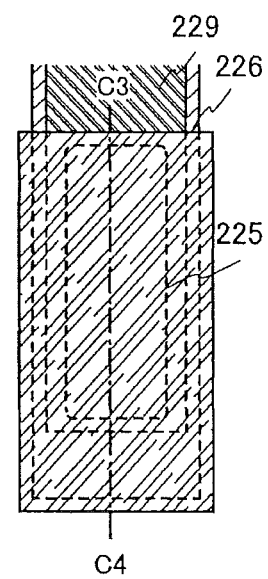

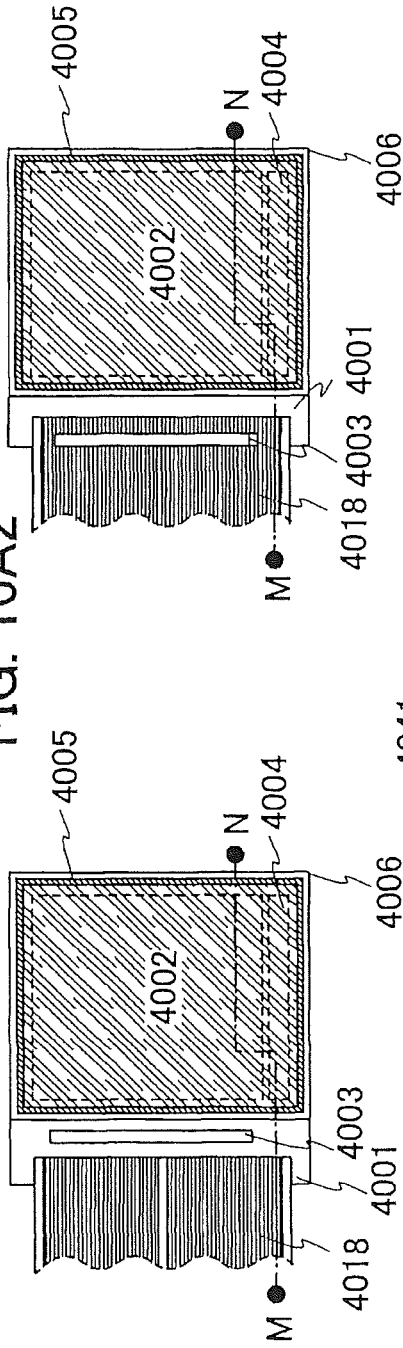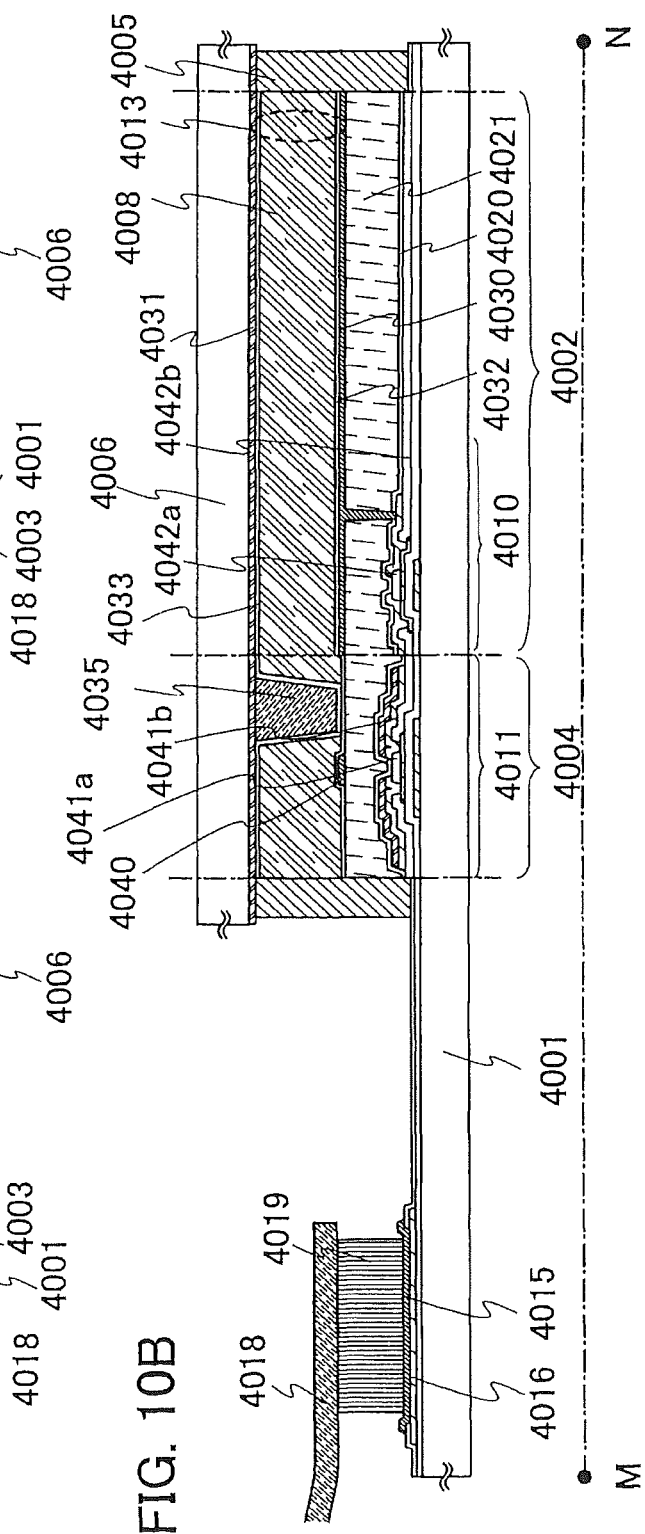

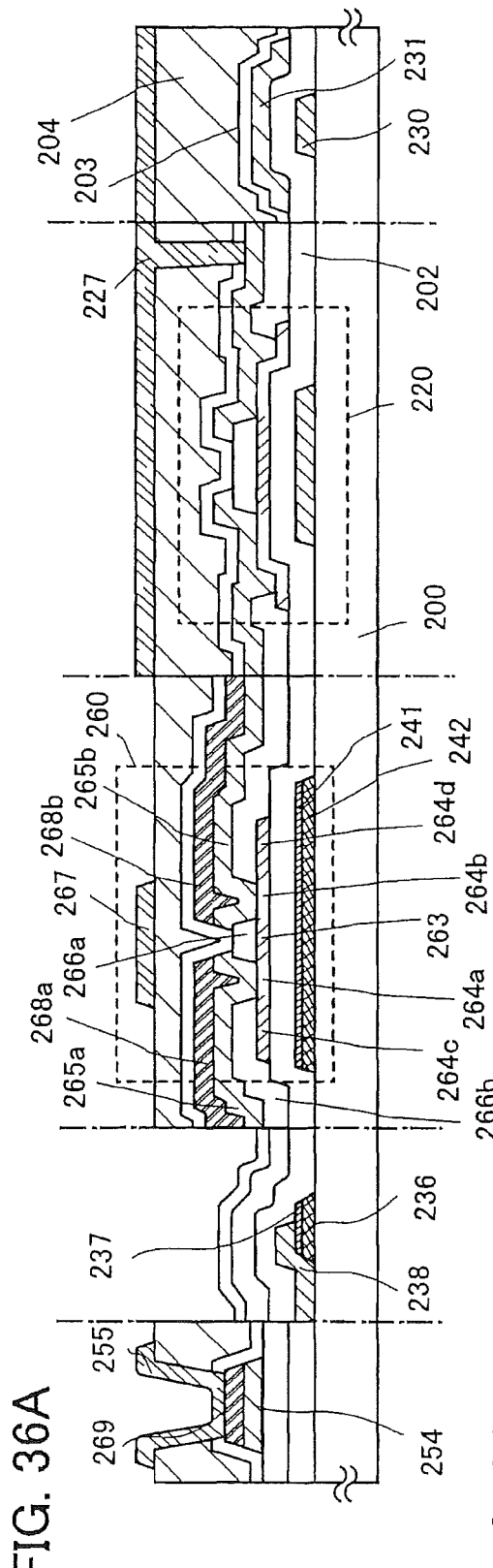
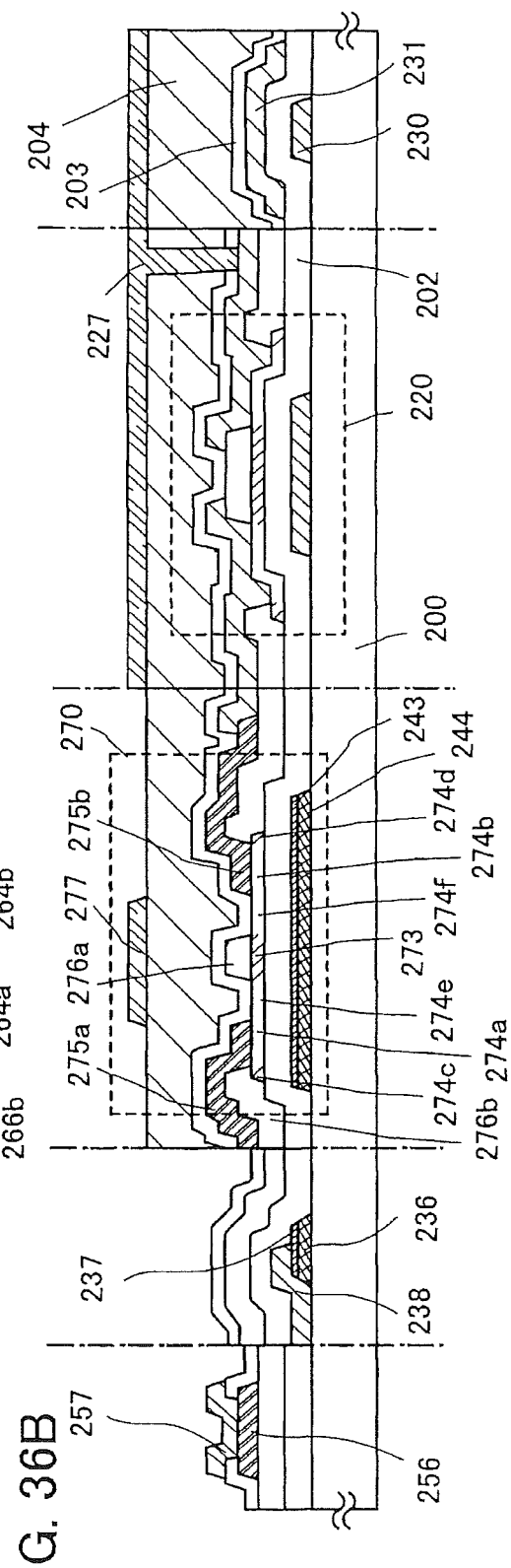
FIG. 36A
FIG. 36B

DISPLAY DEVICE

CROSS-REFERENCE TO RELATED APPLICATIONS

This application is a continuation of U.S. application Ser. No. 14/732,874, filed Jun. 8, 2015, now allowed, which is a continuation of U.S. application Ser. No. 14/472,618, filed Aug. 29, 2014, now U.S. Pat. No. 9,224,870, which is a continuation of U.S. application Ser. No. 13/751,189, filed Jan. 28, 2013, now U.S. Pat. No. 8,822,990, which is a divisional of U.S. application Ser. No. 12/846,534, filed Jul. 29, 2010, now U.S. Pat. No. 8,546,180, which claims the benefit of a foreign priority application filed in Japan as Serial No. 2009-179773 on Jul. 31, 2009, all of which are incorporated by reference.

TECHNICAL FIELD

The present invention relates to a semiconductor device using an oxide semiconductor and a method for manufacturing the semiconductor device.

In this specification, a semiconductor device generally means a device which can function by utilizing semiconductor characteristics, and an electro-optical device such as a display device, a semiconductor circuit, and an electronic appliance are all semiconductor devices.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide range of electronic devices such as ICs and electro-optical devices, and prompt development of thin film transistors that are to be used particularly as switching elements in image display devices is being pushed. Various metal oxides are used for a variety of applications. Indium oxide is a well-known material and is used as a transparent electrode material which is necessary for liquid crystal displays and the like.

Some metal oxides have semiconductor characteristics. Examples of such metal oxides having semiconductor characteristics are tungsten oxide, tin oxide, indium oxide, zinc oxide, and the like. A thin film transistor in which a channel formation region is formed using such metal oxides having semiconductor characteristics is known (Patent Documents 1 and 2).

REFERENCE

Patent Document

[Patent Document 1] Japanese Published Patent Application No. 2007-123861
[Patent Document 2] Japanese Published Patent Application No. 2007-96055

DISCLOSURE OF INVENTION

In the case where a plurality of thin film transistors is formed over an insulating surface, for example, there is a portion where a gate wiring and a source wiring intersect with each other. At the intersection, capacitance is formed between the gate wiring and the source wiring whose potential is different from that of the gate wiring, in which an insulating layer serving as a dielectric is provided between the wirings. The capacitance is also referred to as parasitic capacitance between wirings and distortion of a signal waveform may occur. In addition, when the parasitic capacitance is large, delay of transmission of a signal may occur.

Further, increase in the parasitic capacitance causes a cross talk phenomenon in which an electric signal leaks between wirings or increase in power consumption.

Furthermore, in an active matrix display device, particularly when large parasitic capacitance is formed between a signal wiring supplying a video signal and another wiring or an electrode, display quality may deteriorate.

Also in the case of miniaturizing a circuit, a distance between wirings is reduced and parasitic capacitance between the wirings may be increased.

An object of an embodiment of the present invention is to provide a semiconductor device having a structure which enables sufficient reduction in parasitic capacitance between wirings.

In the case where a driver circuit is formed over an insulating surface, it is preferable that the operation speed of a thin film transistor used for the driver circuit be high.

For example, the operation speed is increased when a channel length (L) of the thin film transistor is reduced or a channel width (W) thereof is increased. However, when the channel length is reduced, there is a problem in that a switching characteristic, for example, an on-off ratio is lowered. In addition, when the channel width (W) is increased, there is a problem in that the capacity load of the thin film transistor itself is increased.

Another object of an embodiment of the present invention is to provide a semiconductor device including a thin film transistor having stable electric characteristics even if a channel length is small.

When a plurality of circuits which are different from each other is formed over an insulating surface, for example, when a pixel portion and a driver circuit are formed over one substrate, excellent switching characteristics such as a high on-off ratio is needed for a thin film transistor used for the pixel portion, while high operation speed is needed for a thin film transistor used for the driver circuit. In particular, as the definition of a display device is higher, writing time of a displayed image is reduced. Therefore, it is preferable that the thin film transistor used for the driver circuit operate at high speed.

Another object of an embodiment of the present invention is to provide a semiconductor device in which plural kinds of circuits are formed over one substrate and plural kinds of thin film transistors are provided corresponding to characteristics of the plural kinds of circuits.

In a bottom-gate thin film transistor, an oxide insulating layer serving as a channel protective layer is formed over part of an oxide semiconductor layer overlapping with a gate electrode layer. In the same step as formation of the oxide insulating layer, an oxide insulating layer covering a peripheral portion (including a side surface) of the oxide semiconductor layer is formed.

When the oxide insulating layer covering the peripheral portion (including the side surface) of the oxide semiconductor layer is provided, a distance between the gate electrode layer and wiring layers (such as a source wiring layer and a capacitor wiring layer) forming over or at the periphery of the gate electrode layer is increased so that parasitic capacitance is reduced. The oxide insulating layer covering the peripheral portion of the oxide semiconductor layer is formed in the same step as the channel protective layer. Therefore, parasitic capacitance can be reduced without increase in the number of steps.

The oxide insulating layer covering the peripheral portion (including the side surface) of the oxide semiconductor layer enables reduction in parasitic capacitance and suppression of distortion of a signal waveform.

In order to reduce parasitic capacitance, it is preferable that an insulating material with a low dielectric constant be used for the oxide insulating layer between the wirings.

When the oxide insulating layer covering the peripheral portion (including the side surface) of the oxide semiconductor layer is provided, parasitic capacitance is reduced as much as possible and high speed operation of the thin film transistor can be achieved. In addition, with the use of the thin film transistor operating at high speed, integration degree of circuits is improved.

One embodiment of the present invention disclosed in this specification is a semiconductor device including: a gate electrode layer; a gate insulating layer over the gate electrode layer; an oxide semiconductor layer over the gate insulating layer; an oxide insulating layer over the oxide semiconductor layer; and a source electrode layer and a drain electrode layer over the oxide insulating layer, wherein the oxide semiconductor layer includes a first region which is in contact with the oxide insulating layer and a second region which is in contact with the source electrode layer or the drain electrode layer, wherein the first region includes a channel formation region which overlaps with the gate electrode layer with the gate insulating layer interposed therebetween and a region which overlaps with the oxide insulating layer covering a periphery and a side surface of the oxide semiconductor layer, and wherein an end surface of the oxide semiconductor layer overlaps with the source electrode layer or the drain electrode layer with the oxide insulating layer interposed therebetween.

With the above structure, at least one of the above problems can be solved.

In order to realize the above structure, another embodiment of the present invention is a semiconductor device including: a gate electrode layer; a gate insulating layer over the gate electrode layer; an oxide semiconductor layer over the gate insulating layer; an oxide insulating layer over the oxide semiconductor layer; a source electrode layer and a drain electrode layer over the oxide insulating layer; and a protective insulating layer over the source electrode layer and the drain electrode layer, wherein the oxide semiconductor layer includes a first region which is in contact with the oxide insulating layer, a second region which is in contact with the source electrode layer or the drain electrode layer, and a third region which is in contact with the protective insulating layer, wherein in the first region, a channel formation region is a region overlapping with the gate electrode layer with the gate insulating layer interposed therebetween, and wherein the third region is provided between the channel formation region and the second region.

For example, the oxide semiconductor used in this specification is formed into a thin film represented by $InMO_3(ZnO)_m$ (m>0), and a thin film transistor whose oxide semiconductor layer is formed using the thin film is manufactured. Note that M represents one or more metal elements selected from Ga, Fe, Ni, Mn, and Co. As an example, M may be Ga or may include the above metal element in addition to Ga; for example, M may be Ga and Ni or Ga and Fe. Moreover, in the above oxide semiconductor, in some cases, a transition metal element such as Fe or Ni or an oxide of the transition metal is included as an impurity element in addition to a metal element included as M. In this specification, among the oxide semiconductor layers whose composition formulas are represented by $InMO_3(ZnO)_m$ (m>0), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based non-single-crystal film.

As a metal oxide applied to the oxide semiconductor layer, any of the following metal oxides can be applied besides the above: an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. Silicon oxide may be included in the oxide semiconductor layer formed using the above metal oxide.

In the case where heat treatment is performed in an atmosphere of an inert gas such as nitrogen or a rare gas (such as argon or helium), the oxide semiconductor layer is changed into an oxygen-deficient oxide semiconductor layer by the heat treatment so as to be a low-resistance oxide semiconductor layer, that is, an n-type (such as $n^-$-type) oxide semiconductor layer. Then, the oxide semiconductor layer is placed in an oxygen-excess state by formation of an oxide insulating film which is in contact with the oxide semiconductor layer and heat treatment after the formation so as to be a high-resistance oxide semiconductor layer, that is, an i-type oxide semiconductor layer. In addition, it also can be said that solid phase oxidation by which the oxide semiconductor layer is in an oxygen-excess state is performed. Accordingly, it is possible to manufacture and provide a semiconductor device including a highly reliable thin film transistor having favorable electric characteristics.

As dehydration or dehydrogenation, heat treatment is performed in an atmosphere of an inert gas such as nitrogen or an rare gas (such as argon or helium) at higher than or equal to 400° C. and lower than a strain point of the substrate, preferably higher than or equal to 420° C. and lower than or equal to 570° C., so that impurities such as moisture included in the oxide semiconductor layer is reduced.

The oxide semiconductor layer is subjected to dehydration or dehydrogenation under a heat treatment condition that two peaks of water or at least one peak of water at around 300° C. is not detected even if TDS is performed at up to 450° C. on the oxide semiconductor layer subjected to dehydration or dehydrogenation. Therefore, even if TDS is performed at up to 450° C. on a thin film transistor including an oxide semiconductor layer subjected to dehydration or dehydrogenation, at least the peak of water at around 300° C. is not detected.

In addition, it is important to prevent water and hydrogen from being reincorporated into the oxide semiconductor layer, without exposure to air, with the use of a furnace in which dehydration or dehydrogenation is performed on the oxide semiconductor layer when the temperature is lowered from a heat temperature T at which dehydration or dehydrogenation is performed. When a thin film transistor is formed using an oxide semiconductor layer obtained by changing an oxide semiconductor layer into a low-resistance oxide semiconductor layer, that is, an n-type (such as $n^-$-type) oxide semiconductor layer by dehydration or dehydrogenation and by changing the low-resistance oxide semiconductor layer into a high-resistance oxide semiconductor layer so as to be an i-type oxide semiconductor layer, the threshold voltage value of the thin film transistor can be positive, so that a so-called normally-off switching element can be realized. It is desirable for a semiconductor device (a display device) that a channel be formed with gate threshold voltage that is a positive value and as close to 0 V as possible. If the threshold voltage value of the thin film transistor is negative, it tends to be normally on; in other words, current flows between the source electrode and the drain electrode even when the gate voltage is 0 V. In an active matrix display device, electric characteristics of thin film transistors included in a circuit are important and performance of the display device depends on the electric characteristics. Among the electric characteristics of thin film transistors, in particular, threshold voltage ($V_{th}$) is important. When the threshold voltage value is high or is on the minus side although the field effect mobility is high, it is difficult to control the circuit. When a thin film transistor has a large threshold voltage value and a large absolute value of its threshold voltage, the thin film transistor cannot perform the switching function as a TFT and may be a load when the transistor is driven at low voltage. In the case of an n-channel thin film transistor, it is preferable that a channel be formed and drain current begin to flow after the positive voltage is applied as gate voltage. A transistor in which a channel is not formed unless the driving voltage is increased and a transistor in which a channel is formed and drain current flows even in the case of the negative voltage state are unsuitable for a thin film transistor used in a circuit.

In addition, a gas atmosphere in which the temperature is lowered from the heating temperature T may be switched to a gas atmosphere which is different from the gas atmosphere in which the temperature is raised to the heating temperature T. For example, cooling is performed by using the furnace in which dehydration or dehydrogenation is performed and by filling the furnace with a high-purity oxygen gas, a high-purity $N_2O$ gas, or ultra-dry air (having a dew point of −40° C. or lower, preferably −60° C. or lower) without exposure to air.

The electric characteristics of a thin film transistor are improved using an oxide semiconductor film cooled slowly (or cooled) in an atmosphere (having a dew point of −40° C. or lower, preferably −60° C. or lower) which does not include moisture after moisture which is included in the film is reduced by heat treatment for dehydration or dehydrogenation, and a high-performance thin film transistor which can be mass-produced are realized.

In this specification, heat treatment in an atmosphere of an inert gas such as nitrogen or a rare gas (such as argon or helium) is referred to as heat treatment for dehydration or dehydrogenation. In this specification, dehydrogenation does not refer to only elimination in the form of $H_2$ by the heat treatment, and dehydration or dehydrogenation also refers to elimination of H, OH, and the like for convenience.

In the case where heat treatment is performed in an atmosphere of an inert gas such as nitrogen or a rare gas (argon, helium, or the like), the oxide semiconductor layer is changed into an oxygen-deficient oxide semiconductor layer by the heat treatment so as to be a low-resistance oxide semiconductor layer, that is, an n-type (such as n⁻-type) oxide semiconductor layer.

Further, a region overlapping with the drain electrode layer is formed as a high-resistance drain region (also referred to as an HRD region) which is an oxygen-deficient region. In addition, a region overlapping with the source electrode layer is formed as a high-resistance source region (also referred to as an HRS region) which is an oxygen-deficient region.

Specifically, the carrier concentration of the high-resistance drain region is higher than or equal to $1\times10^{18}/cm^3$ and is at least higher than the carrier concentration of a channel formation region (lower than $1\times10^{18}/cm^3$). Note that the carrier concentration in this specification is a carrier concentration obtained by Hall effect measurement at room temperature.

Then, the channel formation region is formed by placing at least part of the dehydrated or dehydrogenated oxide semiconductor layer in an oxygen-excess state so as to be a high-resistance oxide semiconductor layer, that is, an i-type oxide semiconductor layer. Note that as the treatment for placing the dehydrated or dehydrogenated oxide semiconductor layer in an oxygen-excess state, the following treatment is given, for example: deposition of an oxide insulating film which is in contact with the dehydrated or dehydrogenated oxide semiconductor layer by a sputtering method; heat treatment or heat treatment in an atmosphere including oxygen, or cooling treatment in an oxygen atmosphere or ultra-dry air (having a dew point of −40° C. or lower, preferably −60° C. or lower) after heat treatment in an inert gas atmosphere, after the deposition of the oxide insulating film; or the like.

At least part (a portion overlapping with the gate electrode layer) of the dehydrated or dehydrogenated oxide semiconductor layer serves as the channel formation region; therefore, the oxide semiconductor layer can be selectively placed in an oxygen-excess state and can be a high-resistance oxide semiconductor layer, that is, an i-type oxide semiconductor layer.

Accordingly, it is possible to manufacture and provide a semiconductor device including a highly reliable thin film transistor having favorable electric characteristics.

Note that by forming the high-resistance drain region in the oxide semiconductor layer overlapping with the drain electrode layer, the reliability when a driver circuit is formed can be improved. Specifically, by forming the high-resistance drain region, a structure can be obtained in which conductivity can be varied from the drain electrode layer to the high-resistance drain region and the channel formation region. Therefore, in the case where the thin film transistor operates with the drain electrode layer connected to a wiring for supplying a high power supply potential VDD, the high-resistance drain region serves as a buffer and a high electric field is not applied locally even if a high electric field is applied between the gate electrode layer and the drain electrode layer, so that the withstand voltage of the transistor can be improved.

In addition, the high-resistance drain region is formed in the oxide semiconductor layer overlapping with the drain electrode layer (and the source electrode layer), so that reduction in leakage current can be achieved in the channel formation region in forming the driver circuit. In particular, when the high-resistance drain region is formed, leakage current between the drain electrode layer and the source electrode layer of the transistor flows through the drain electrode layer, the high-resistance drain region on the drain electrode layer side, the channel formation region, the high-resistance source region on the source electrode layer side, and the source electrode layer in this order. In this case, in the channel formation region, leakage current flowing from the high-resistance drain region on the drain electrode layer side to the channel region can be concentrated on the vicinity of an interface between the channel formation region and a gate insulating layer which has high resistance when the transistor is of Thus, the amount of leakage current in a back channel portion (part of a surface of the channel formation which is apart from the gate electrode layer) can be reduced.

Further, the high-resistance source region which overlaps with the source electrode layer and the high-resistance drain region which overlaps with the drain electrode layer overlap with each other with part of the gate electrode layer and the gate insulating layer interposed therebetween, depending on the width of the gate electrode layer, and the intensity of an electric field in the vicinity of an end portion of the drain electrode layer can be reduced more effectively.

Moreover, as a display device including a driver circuit, a light-emitting display device in which a light-emitting element is used and a display device in which an electrophoretic display element is used, which is also referred to as "electronic paper", are given in addition to a liquid crystal display device.

In a light-emitting display device in which a light-emitting element is used, a plurality of thin film transistors is included in a pixel portion, and in the pixel portion, there is a region where a gate electrode of a thin film transistor is connected to a source wiring or a drain wiring of another thin film transistor. In addition, in a driver circuit of a light-emitting display device in which a light-emitting element is used, there is a region where a gate electrode of a thin film transistor is connected to a source wiring or a drain wiring of the thin film transistor.

Since a thin film transistor is easily broken due to static electricity or the like, a protective circuit for protecting the thin film transistor for the pixel portion is preferably provided over the same substrate for a gate line or a source line. The protective circuit is preferably formed using a non-linear element including an oxide semiconductor layer.

Note that the ordinal numbers such as "first" and "second" in this specification are used for convenience and do not denote the order of steps and the stacking order of layers. In addition, the ordinal numbers in this specification do not denote particular names which specify the present invention.

A semiconductor device in which parasitic capacitance is sufficiently reduced and which includes a thin film transistor having stable electric characteristics even if a channel length is small.

BRIEF DESCRIPTION OF DRAWINGS

In the accompanying drawings:

FIGS. 3A and 3B are cross-sectional views illustrating an embodiment of the present invention;

FIGS. 4A1 and 4B1 are cross-sectional views and 4A2 and 4B2 are plan views illustrating an embodiment of the present invention;

FIGS. 10A1, 10A2, and 10B illustrate a semiconductor device;

FIGS. 36A and 36B illustrate semiconductor devices.

BEST MODE FOR CARRYING OUT THE INVENTION

Figure 1A:
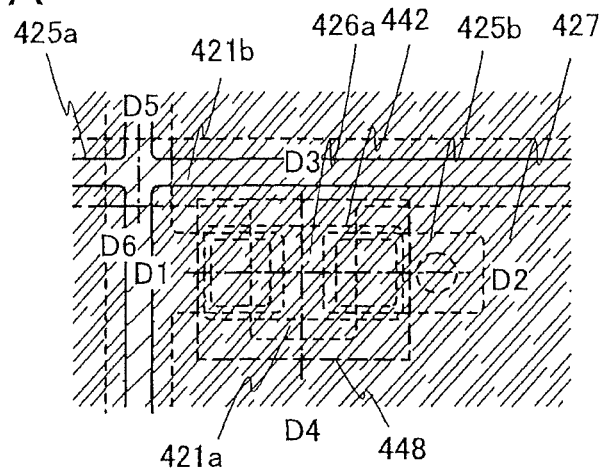
FIG. 1A is a plan view and FIGS. 1B and 1C are cross-sectional views illustrating an embodiment of the present invention.

Embodiments of the present invention will be described in detail below with reference to drawings. Note that the present invention is not limited to the description below, and it is easily understood by those skilled in the art that modes and details of the present invention can be modified in various ways. Therefore, the present invention should not be construed as being limited to description of the embodiments below. In the structures to be given below, the same portions or portions having similar functions are denoted by the same reference numerals in different drawings, and explanation thereof will not be repeated.

Embodiment 1

In this embodiment, one embodiment of a semiconductor device and a method for manufacturing the semiconductor device will be described with reference to FIGS. 1A to 1C, FIGS. 2A to 2E, FIGS. 3A and 3B, and FIGS. 4A1, 4A2, 4B1, and 4B2.

Figure 1B:
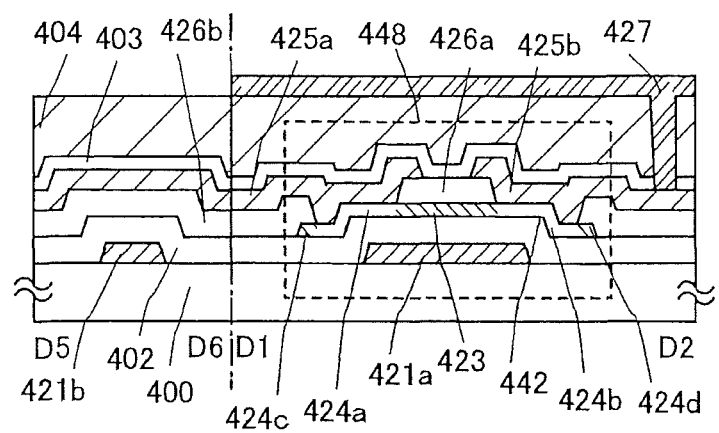
Figure 1C:
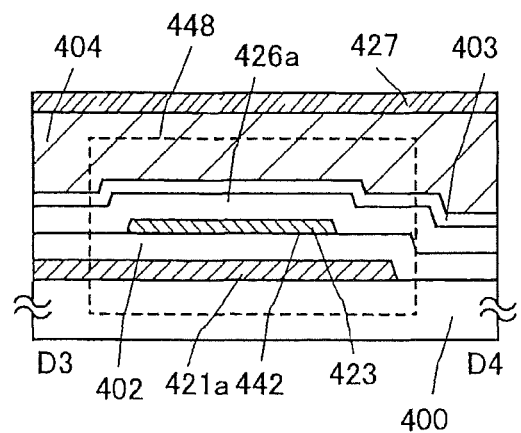

FIG. 1A is a plan view of a channel protective thin film transistor 448 provided in a pixel, and FIG. 1B is a cross-sectional view taken along line D1-D2 and D5-D6 of FIG. 1A. FIG. 1C is a cross-sectional view taken along line D3-D4. Note that FIG. 2E is the same as FIG. 1B.

The thin film transistor 448 provided in the pixel is a channel protective (also referred to as channel-stop) thin film transistor, which includes, over a substrate 400 having an insulating surface, a gate electrode layer 421a, a gate insulating layer 402, an oxide semiconductor layer 442 including a channel formation region 423, an oxide insulating layer 426a functioning as a channel protective layer, a source electrode layer 425a, and a drain electrode layer 425b. In addition, a protective insulating layer 403 is provided to cover the thin film transistor 448 and be in contact with the oxide insulating layer 426a, the source electrode layer 425a, and the drain electrode layer 425b, and a planarization insulating layer 404 is stacked thereover. Over the planarization insulating layer 404, a pixel electrode layer 427 is provided, which is in contact with the drain electrode layer 425b and thus is electrically connected to the thin film transistor 448.

The thin film transistor 448 in the pixel is provided with the oxide semiconductor layer 442 which includes a high-resistance source region 424a, a high-resistance drain region 424b, and the channel formation region 423. The high-resistance source region 424a is formed in contact with the lower surface of the source electrode layer 425a. The high-resistance drain region 424b is formed in contact with the lower surface of the drain electrode layer 425b. Even when a high electric field is applied, the high-resistance drain region or the high-resistance source region serves as a buffer, so that the thin film transistor 448 is prevented from being supplied with a high electric field locally and has improved withstand voltage.

The channel formation region of the thin film transistor 448 provided in the pixel is a region which is included in the oxide semiconductor layer 442, is in contact with the oxide insulating layer 426a serving as a channel protective layer, and overlaps with the gate electrode layer 421a. Since the thin film transistor 448 is protected by the oxide insulating layer 426a, the oxide semiconductor layer 442 can be prevented from being etched in the etching step where the source electrode layer 425a and the drain electrode layer 425b are formed.

In order to realize a display device having a high aperture ratio, the source electrode layer 425a and the drain electrode layer 425b are formed using a light-transmitting conductive film, whereby the thin film transistor 448 is formed as a light-transmitting thin film transistor.

In addition, the gate electrode layer 421a of the thin film transistor 448 is formed using a light-transmitting conductive film.

In the pixel provided with the thin film transistor 448, the pixel electrode layer 427, another electrode layer such as a capacitor electrode layer, or a wiring layer such as a capacitor wiring layer is formed using a conductive film that transmits visible light, so that a display device having a high aperture ratio is realized. Needless to say, each of the gate insulating layer 402 and the oxide insulating layer 426a is preferably formed using a film that transmits visible light.

In this specification, a film that transmits visible light indicates a film having such a thickness as to have transmittance of visible light of 75% to 100%. In the case where the film has conductivity, the film is referred to as a transparent conductive film. Further, a conductive film which is semi-transmissive with respect to visible light may be used for metal oxide applied to the gate electrode layer, the source electrode layer, the drain electrode layer, the pixel electrode layer, another electrode layer, and a wiring layer. The conductive film which is semi-transmissive with respect to visible light indicates a film having transmittance of visible light of 50% to 75%.

In order to reduce parasitic capacitance, in a wiring intersection where a gate wiring and a source wiring intersect with each other, the gate insulating layer 402 and an oxide insulating layer 426b are provided between a gate electrode layer 421b and the source electrode layer 425a. Note that although the oxide insulating layer 426a which overlaps with the channel formation region 423 and the oxide insulating layer 426b which does not overlap with the channel formation region 423 are denoted by reference numerals different from each other, they are formed using the same material in the same step.

Hereinafter, a process of manufacturing the thin film transistor 448 and the wiring intersection over one substrate is described with reference to FIGS. 2A to 2E. Besides the thin film transistor in the pixel portion, a thin film transistor in a driver circuit may be formed. The thin film transistor in the driver circuit can be manufactured over the same substrate in the same process.

First, a light-transmitting conductive film is formed over the substrate 400 having an insulating surface, and then a first photolithography step is performed to form the gate electrode layers 421a and 421b. In the pixel portion, with the use of the same light-transmitting material as the gate electrode layers 421a and 421b, a capacitor wiring layer is formed by the first photolithography step. In the case of forming the driver circuit as well as the pixel portion, a capacitor wiring layer is provided for the driver circuit if a capacitor is needed therefor. Note that a resist mask may be formed by an inkjet method. Formation of the resist mask by an inkjet method needs no photomask; thus, manufacturing cost can be reduced.

There is no particular limitation on a substrate that can be used as the substrate 400 having an insulating surface as long as it has at least heat resistance to withstand heat treatment performed later. A glass substrate can be used as the substrate 400 having an insulating surface.

In addition, when the temperature of the heat treatment performed later is high, a glass substrate having a strain point of 730° C. or higher is preferably used. In addition, for example, a glass material such as aluminosilicate glass, aluminoborosilicate glass, or barium borosilicate glass is used for a glass substrate. Note that by containing a larger amount of barium oxide (BaO) than boric oxide, a more practical heat-resistant glass substrate is obtained. Therefore, a glass substrate containing BaO and $B_2O_3$ so that the amount of BaO is larger than that of $B_2O_3$ is preferably used.

Note that a substrate formed of an insulator such as a ceramic substrate, a quartz substrate, or a sapphire substrate may be used instead of the glass substrate. Alternatively, crystallized glass or the like can be used.

An insulating film serving as a base film may be provided between the substrate 400 and the gate electrode layers 421a and 421b. The base film has a function of preventing diffusion of an impurity element from the substrate 400, and can be formed to have a single-layer or stacked structure using any of a silicon nitride film, a silicon oxide film, a silicon nitride oxide film, and a silicon oxynitride film.

As a material of the gate electrode layers 421a and 421b, a conductive material that transmits visible light can be used. For example, any of the following metal oxides can be applied: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness thereof is set in the range of greater than or equal to 50 nm and less than or equal to 300 nm as appropriate. The metal oxide used for the gate electrode layers 421a and 421b is deposited by a sputtering method, a vacuum evaporation method (such as an electron beam evaporation method), an arc discharge ion plating method, or a spray method. In the case of using a sputtering method, deposition is performed with the use of a target containing $SiO_2$ at greater than or equal to 2 wt % and less than or equal to 10 wt %, so that $SiO_x$ (x>0) which hinders crystallization is contained in the light-transmitting conductive film. Thus, it is preferable that the light-transmitting conductive film be prevented from being crystallized in heat treatment for dehydration or dehydrogenation performed later.

The oxide semiconductor is preferably an oxide semiconductor containing In, more preferably an oxide semiconductor containing In and Ga. In order to obtain an i-type (intrinsic) oxide semiconductor layer, a process including dehydration or dehydrogenation is effective.

Next, the gate insulating layer 402 is formed over the gate electrode layers 421a and 421b.

The gate insulating layer 402 can be formed to have a single layer of a silicon oxide layer, a silicon nitride layer, a silicon oxynitride layer, a silicon nitride oxide layer, or an aluminum oxide layer or a stacked layer thereof by a plasma CVD method, a sputtering method, or the like. For example, a silicon oxynitride layer may be formed by a plasma CVD method using $SiH_4$, oxygen, and nitrogen as a film formation gas. The gate insulating layer 402 has a thickness of greater than or equal to 100 nm and less than or equal to 500 nm. In the case of a stacked structure, a first gate insulating layer with a thickness of greater than or equal to 50 nm and less than or equal to 200 nm is formed, and a second gate insulating layer with a thickness of greater than or equal to 5 nm and less than or equal to 300 nm is stacked over the first gate insulating layer.

In this embodiment, the gate insulating layer 402 is a silicon nitride layer with a thickness of 200 nm or less formed by a plasma CVD method.

Figure 2A:
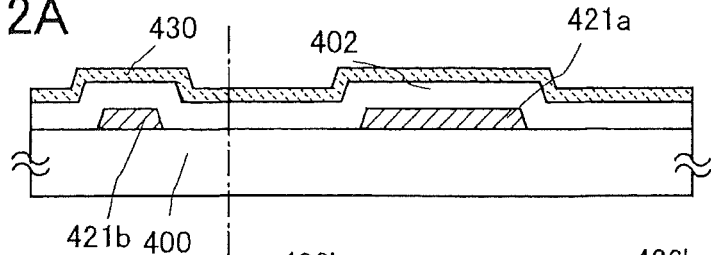
FIGS. 2A to 2E are process cross-sectional views illustrating an embodiment of the present invention.

Next, an oxide semiconductor film 430 with a thickness greater than or equal to 2 nm and less than or equal to 200 nm is formed over the gate insulating layer 402 (see FIG. 2A). The preferable thickness is 50 nm or less so that the oxide semiconductor film 430 can have an amorphous structure even when heat treatment for dehydration or dehydrogenation is performed after formation of the oxide semiconductor film. By formation of the oxide semiconductor film with a small thickness, crystallization of the oxide semiconductor layer in the case of performing heat treatment after the film formation can be suppressed.

The oxide semiconductor film 430 is formed using an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film 430 is formed by a sputtering method with the use of an In—Ga—Zn—O-based oxide semiconductor target. Further, the oxide semiconductor film 430 can be formed by a sputtering method in a rare gas (typically argon) atmosphere, an oxygen atmosphere, or an atmosphere of a rare gas (typically argon) and oxygen. In the case of using a sputtering method, deposition is performed with the use of a target containing $SiO_2$ at greater than or equal to 2 wt % and less than or equal to 10 wt %, so that $SiO_x$ (x>0) which hinders crystallization is contained in the oxide semiconductor film 430. Thus, it is preferable that the oxide semiconductor film 430 be prevented from being crystallized in heat treatment for dehydration or dehydrogenation performed later.

Here, the oxide semiconductor film is formed in an atmosphere of argon and oxygen (argon:oxygen=30 sccm:20 sccm and the oxygen flow ratio is 40%), with the use of an oxide semiconductor target containing In, Ga, and Zn ($In_2O_3$:$Ga_2O_3$:ZnO=1:1:1 [molar ratio]), under conditions as follows: the distance between the substrate and the target is 100 mm; the pressure is 0.2 Pa; and the direct current (DC) power source is 0.5 kW. Note that a pulse direct current (DC) power source is preferable because dust can be reduced and the film thickness can be uniform. The In—Ga—Zn—O-based non-single-crystal film is formed to a thickness of 5 nm to 200 nm. In this embodiment, as the oxide semiconductor film, a 20-nm-thick In—Ga—Zn—O-based non-single-crystal film is formed by a sputtering method with the use of an In—Ga—Zn—O-based oxide semiconductor target.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a deposition method by sputtering, there are a reactive sputtering method in which a target substance and a sputtering gas component are chemically reacted with each other during deposition to form a thin compound film thereof, and a bias sputtering in which voltage is also applied to a substrate during deposition.

Then, by a second photolithography step, the oxide semiconductor film 430 is processed into an island-shaped oxide semiconductor layer. A resist mask used for formation of the island-shaped oxide semiconductor layer may be formed by an inkjet method. Formation of the resist mask by an inkjet method needs no photomask; thus, manufacturing cost can be reduced.

Next, the oxide semiconductor layer is subjected to dehydration or dehydrogenation. First heat treatment for dehydration or dehydrogenation is performed at a temperature which is higher than or equal to 400° C. and lower than a strain point of the substrate, preferably 425° C. or higher. Note that the heat treatment time may be 1 hour or shorter when the temperature of the heat treatment is 425° C. or higher, but is set to longer than 1 hour when the temperature of the heat treatment is lower than 425° C. Here, the substrate is introduced into an electric furnace which is one of heat treatment apparatuses, and heat treatment is performed on the oxide semiconductor layer in a nitrogen atmosphere. After that, the oxide semiconductor layer is not exposed to air, which prevents reincorporation of water and hydrogen into the oxide semiconductor layer, so that an oxide semiconductor layer is obtained. In this embodiment, one furnace used in heat treatment is continuously used up to the time when the temperature is lowered from the heat temperature T at which dehydration or dehydrogenation of the oxide semiconductor layer is performed to the temperature which is enough to prevent reincorporation of water. Specifically, slow cooling is performed in a nitrogen atmosphere up to the time when the temperature becomes lower than the heat temperature T by 100° C. or more. Without being limited to a nitrogen atmosphere, dehydration or dehydrogenation is performed in an atmosphere of a rare gas such as helium, neon, or argon.

Note that in the first heat treatment, it is preferable that moisture, hydrogen, or the like be not contained in nitrogen or a rare gas such as helium, neon, or argon. In addition, nitrogen or a rare gas such as helium, neon, or argon which is introduced into a heat treatment apparatus preferably has a purity of 6N (99.9999%) or higher, more preferably 7N (99.99999%) or higher (that is, the concentration of impurities is 1 ppm or lower, preferably 0.1 ppm or lower).

Further, depending on the conditions of the first heat treatment or a material of the oxide semiconductor layer, the oxide semiconductor layer is crystallized to be a microcrystalline film or a polycrystalline film in some cases.

Alternatively, the first heat treatment may be performed on the oxide semiconductor film 430 which has not yet been processed into the island-shaped oxide semiconductor layer. In that case, the substrate is taken out of the heating apparatus after the first heat treatment, and then a photolithography step is performed.

Further, before the oxide semiconductor film 430 is formed, heat treatment (at higher than or equal to 400° C. and lower than a strain point of the substrate) may be performed in an atmosphere of an inert gas (such as nitrogen, helium, neon, or argon) or an oxygen atmosphere so that impurities such as hydrogen or water, which are included in the gate insulating layer, are removed.

Next, after an oxide insulating film is formed over the gate insulating layer 402 and the oxide semiconductor layer, a resist mask is formed by a third photolithography step and selective etching is performed, whereby the oxide insulating layers 426a and 426b are formed. After that, the resist mask is removed. At this stage, a region which is in contact with the oxide insulating layers is formed in the oxide semiconductor layer. Among these regions, the region that overlaps with the gate electrode layer with the gate insulating layer interposed therebetween and also overlaps with the oxide insulating layer 426a is the channel formation region. In addition, a region which overlaps with the oxide insulating layer 426b covering a periphery and a side surface of the oxide semiconductor layer is also formed.

The oxide insulating film can be formed to have a thickness at least 1 nm or more as appropriate by a sputtering method, or the like, with which impurities such as water or hydrogen are not mixed into the oxide insulating film. In this embodiment, a 300-nm-thick silicon oxide film is formed by a sputtering method, as the oxide insulating film. The substrate temperature in film formation may be higher than or equal to room temperature and lower than or equal to 300° C., and in this embodiment, room temperature. The formation of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target can be used. For example, with the use of a silicon target, a silicon oxide film can be formed by a sputtering method in an atmosphere of oxygen and nitrogen. As the oxide insulating film which is formed in contact with the oxide semiconductor layer whose resistance is reduced, an inorganic insulating film which does not include impurities such as moisture, a hydrogen ion, or OH⁻ and blocks entry of these from the outside is used. Typically, a silicon oxide film, a silicon nitride oxide film, an aluminum oxide film, an aluminum oxynitride film, or the like is used.

Figure 2B:
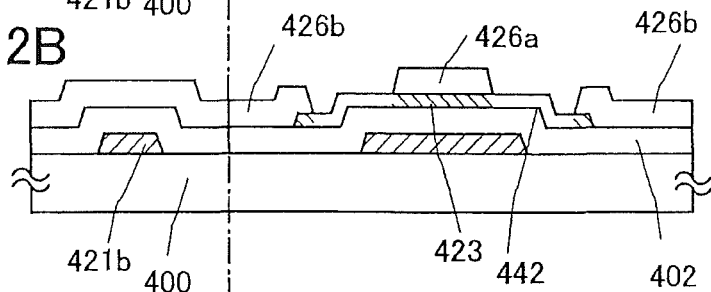
Figure 2C:
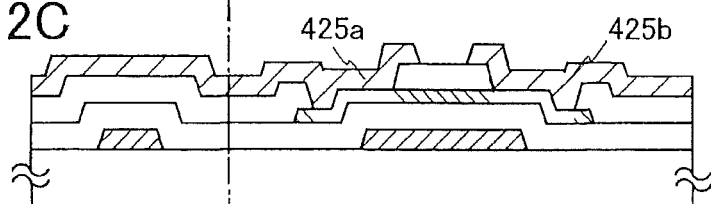

Next, second heat treatment (preferably at higher than or equal to 200° C. and lower than or equal to 400° C., for example, higher than or equal to 250° C. and lower than or equal to 350° C.) is performed in an inert gas atmosphere or a nitrogen gas atmosphere (see FIG. 2B). For example, second heat treatment is performed at 250° C. for one hour in a nitrogen atmosphere. In the second heat treatment, the oxide semiconductor layer 442 is heated in such a condition that the oxide semiconductor layer 442 is partly in contact with the oxide insulating layer. The contact portions in the oxide semiconductor layer 442 are end portions overlapping with the oxide insulating layer 426b and a part overlapping with the oxide insulating layer 426a. Note that in the second heat treatment, the oxide semiconductor layer 442 is heated with a portion which does not overlap with the oxide insulating layer exposed. When heat treatment is performed in a nitrogen atmosphere or an inert gas atmosphere with the oxide semiconductor layer 442 exposed, the resistance can be reduced in the high-resistance (i-type) region which is exposed in the oxide semiconductor layer 442. The oxide insulating layer 426a is provided over and in contact with the channel formation region of the oxide semiconductor layer 442 and functions as a channel protective layer.

Next, a light-transmitting conductive film is formed over the gate insulating layer 402, the oxide insulating layers 426a and 426b, and the oxide semiconductor layer 442. After that, by a fourth photolithography step, a resist mask is formed and etching is performed selectivity to form the source electrode layer 425a and the drain electrode layer 425b (see FIG. 2C). The light-transmitting conductive film is formed by a sputtering method, a vacuum evaporation method (such as an electron beam evaporation method), an arc discharge ion plating method, or a spray method. As a material of the conductive film, a conductive material that transmits visible light can be used. For example, any of the following metal oxides can be used: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness of the conductive film is set in the range of greater than or equal to 50 nm and less than or equal to 300 nm as appropriate. In the case of using a sputtering method, deposition is performed with the use of a target containing $SiO_2$ at greater than or equal to 2 wt % and less than or equal to 10 wt %, so that $SiO_x$ (x>0) which hinders crystallization is contained in the light-transmitting conductive film. Thus, it is preferable that the light-transmitting conductive film be prevented from being crystallized in heat treatment performed later.

Note that a resist mask used for formation of the source electrode layer 425a and the drain electrode layer 425b may be formed by an inkjet method. Formation of the resist mask by an inkjet method needs no photomask; thus, manufacturing cost can be reduced.

Next, the protective insulating layer 403 is formed over the oxide insulating layers 426a and 426b, the source electrode layer 425a, and the drain electrode layer 425b. In this embodiment, a silicon nitride film is formed by an RF sputtering method. An RF sputtering method has superiority in mass production and thus is a preferable method for forming the protective insulating layer 403. The protective insulating layer 403 is formed using an inorganic insulating film which does not include impurities such as moisture, a hydrogen ion, or $OH^-$ and blocks entry of these from the outside. Specifically, a silicon nitride film, an aluminum nitride film, a silicon nitride oxide film, an aluminum oxynitride film, or the like is used. Needless to say, the protective insulating layer 403 is a light-transmitting insulating film.

Then, the planarization insulating layer 404 is formed over the protective insulating layer 403. The planarization insulating layer 404 can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, phosphosilicate glass (PSG), borophosphosilicate glass (BPSG), or the like. The planarization insulating layer 404 may be formed by stacking a plurality of insulating films formed using any of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. The organic group may include a fluoro group.

The formation method of the planarization insulating layer 404 is not limited to a particular method, and the following method can be used depending on the material: a sputtering method, an SOG method, a spin coating method, a dipping method, a spray coating method, a droplet discharge method (such as an inkjet method, screen printing, offset printing, or the like), or the like. Further, the planarization insulating layer 404 can be formed with a doctor knife, a roll coater, a curtain coater, a knife coater, or the like.

Figure 2D:
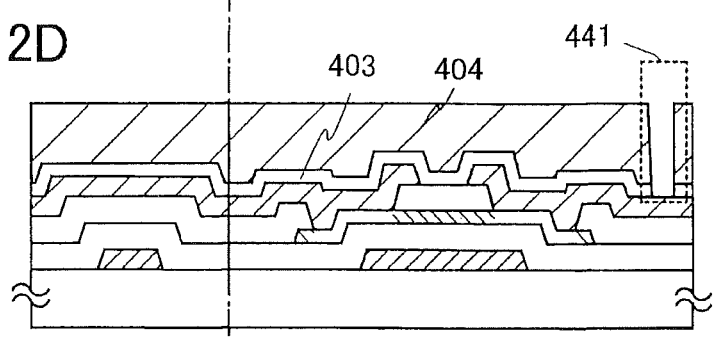
Figure 2E:
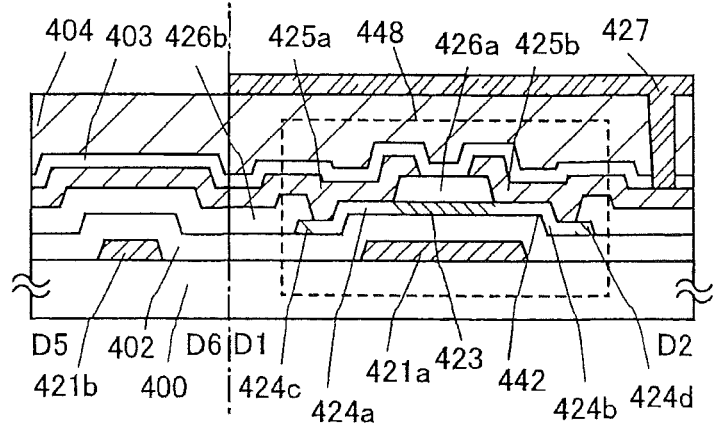

Next, by a fifth photolithography step, a resist mask is formed and the planarization insulating layer 404 and the protective insulating layer 403 are etched, so that a contact hole 441 which reaches the drain electrode layer 425b is formed. Then, the resist mask is removed (see FIG. 2D). As illustrated in FIG. 2D, the oxide insulating layer 426b is provided below the contact hole, which results in that the thickness of the planarization insulating layer to be removed can be small as compared to the case where the oxide insulating layer is not provided below the contact hole; accordingly, etching time can be shortened. In addition, as compared to the case where the oxide insulating layer is not provided below the contact hole, the depth of the contact hole 441 can be shallow; accordingly, the coverage with a light-transmitting conductive film can be favorable, which is formed later and located in a region overlapping with the contact hole 441. Besides, a contact hole reaching the gate electrode layer 421b is also formed by this etching. A resist mask used for formation of the contact hole reaching the drain electrode layer 425b may be formed by an inkjet method. Formation of the resist mask by an inkjet method needs no photomask; thus, manufacturing cost can be reduced.

Then, the light-transmitting conductive film is formed. The light-transmitting conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Alternatively, an Al—Zn—O-based non-single-crystal film containing nitrogen, that is, an Al—Zn—O—N-based non-single-crystal film, a Zn—O—N-based non-single-crystal film, or a Sn—Zn—O—N-based non-single-crystal film may be used. Note that the percentage (at %) of zinc in the Al—Zn—O—N-based non-single-crystal film is less than or equal to 47 at % and is higher than that of aluminum in the non-single-crystal film; the percentage (at %) of aluminum in the non-single-crystal film is higher than that of nitrogen in the non-single-crystal film. Such a material is etched with a hydrochloric acid-based solution. However, since a residue is easily generated particularly in etching ITO, an alloy of indium oxide-zinc oxide ($In_2O_3$—ZnO) may be used to improve etching processability.

Note that the unit of the percentage of components in the light-transmitting conductive film is atomic percent, and the percentage of components is evaluated by analysis using an electron probe X-ray microanalyzer (EPMA).

Next, by a sixth photolithography step, a resist mask is formed and unnecessary portions are removed by etching so that the pixel electrode layer 427 is formed. Then, the resist mask is removed (see FIG. 2E).

Through the above process, with the use of the six masks, the thin film transistor 448 and the wiring intersection with reduced parasitic capacitance can be formed over one substrate. The thin film transistor 448 provided in the pixel is a channel protective thin film transistor having the oxide semiconductor layer 442 which includes the high-resistance source region 424a, the high-resistance drain region 424b, and the channel formation region 423. Thus, even when a high electric field is applied, the high-resistance drain region 424b or the high-resistance source region 424a serves as a buffer, so that the thin film transistor 448 is prevented from being supplied with a high electric field locally and has improved withstand voltage.

In addition, a storage capacitor formed with the capacitor wiring layer and the capacitor electrode, in which the gate insulating layer 402 is used as a dielectric, can be formed over the same substrate. By arranging the thin film transistor 448 and the storage capacitor in each pixel of a pixel portion in which pixels are arranged in a matrix form, one of the substrates for manufacturing an active matrix display device can be obtained. In this specification, such a substrate is referred to as an active matrix substrate for convenience.

Further, a thin film transistor for a driver circuit can be provided over the same substrate. By providing the driver circuit and the pixel portion over one substrate, a connection wiring between the driver circuit and a circuit that transmits an external signal can be shortened; thus, reduction in size and cost of the semiconductor device can be achieved.

In the thin film transistor 448 for the pixel illustrated in FIG. 1B, the oxide semiconductor layer 442 is provided with a first region 424c and a second region 424d which overlap with the oxide insulating layer 426b and are positioned in the peripheral portion of the oxide semiconductor layer 442. The first region 424c and the second region 424d which are peripheral portions of the oxide semiconductor layer 442 are in an oxygen-excess state, as well as the channel formation region 423. Therefore, reduction in leakage current and parasitic capacitance can be achieved when the oxide semiconductor layer and a wiring having a potential different from that of the oxide semiconductor layer are arranged to be closed each other.

In terms of high integration, it is preferable that especially in the driver circuit, a plurality of wirings and a plurality of oxide semiconductor layers be arranged at small distances therebetween. In such a driver circuit, it is effective to provide the first region 424c and the second region 424d by overlapping the oxide semiconductor layer with the oxide insulating layer 426b so as to reduce leakage current and parasitic capacitance. Further, in the case where a plurality of thin film transistors are arranged in series or in parallel, an oxide semiconductor layer is formed in one island among the plurality of thin film transistors, and the oxide semiconductor layer overlaps with the oxide insulating layer 426b, whereby element isolation is performed. Thus, a region overlapping with the oxide insulating layer 426b is an element isolation region. In such a manner, a plurality of thin film transistors can be arranged in a small area, so that the driver circuit can be highly integrated.

Embodiment 2

In this embodiment, description is provided of an example in which an active matrix liquid crystal display device is manufactured by using the thin film transistor described in Embodiment 1 to form a pixel portion and a driver circuit over one substrate.

FIG. 3A illustrates an example of a cross-sectional structure of the active matrix substrate.

Although the thin film transistor in the pixel portion and the wiring intersection are described in Embodiment 1, the thin film transistor in the driver circuit, the storage capacitor, the gate wiring, and a terminal portion of the source wiring are also described in this embodiment as well as the thin film transistor and the wiring intersection. The capacitor, the gate wiring, and the terminal portion of the source wiring can be formed in the same process as the manufacturing process described in Embodiment 1. Further, in a portion serving as a display region of the pixel portion, the gate wiring, the source wiring, and a capacitor wiring layer are all formed using light-transmitting conductive films and have a high aperture ratio.

In FIG. 3A, a thin film transistor 220 electrically connected to a pixel electrode layer 227 is a channel protective thin film transistor and is provided in the pixel portion. In this embodiment, the transistor having the same structure as the thin film transistor 448 of Embodiment 1 is used. In addition, the width in the channel direction of a gate electrode layer of the thin film transistor 220 is smaller than the width in the channel direction of an oxide semiconductor layer of the thin film transistor 220.

A capacitor wiring layer 230 which is formed using the same light-transmitting material and step as the gate electrode layer of the thin film transistor 220 overlaps with a capacitor electrode 231 with a gate insulating layer 202 serving as a dielectric interposed therebetween, thereby forming the storage capacitor. Note that the capacitor electrode 231 is formed using the same light-transmitting material and step as the source electrode layer and the drain electrode layer of the thin film transistor 220. Therefore, since each storage capacitor transmits light as well as the thin film transistor 220, the aperture ratio can be increased.

It is important for the storage capacitor to have a light-transmitting property in improving an aperture ratio. Especially in a small-size liquid crystal display panel of 10 inches or less, high definition of a displayed image is achieved by increasing the number of gate wirings; therefore, a high aperture ratio can be realized even when the pixel size is reduced. Moreover, since light-transmitting films are used for components of the thin film transistor 220 and the storage capacitor in order to obtain a wide viewing angle, a high aperture ratio can be realized even when one pixel is divided into a plurality of sub-pixels. That is, even when thin film transistors are arranged in high density, a high aperture ratio can be obtained and an enough area of a display region can be secured. For example, when two to four sub-pixels and a storage capacitor are provided in one pixel, each storage capacitor transmits light as well as the thin film transistor, and thus the aperture ratio can be increased.

Note that the storage capacitor is provided below the pixel electrode layer 227, and the capacitor electrode 231 is electrically connected to the pixel electrode layer 227.

An example in which the storage capacitor is formed using the capacitor electrode 231 and the capacitor wiring layer 230 is described in this embodiment, but there is no particular limitation on the structure of the storage capacitor. For instance, the storage capacitor may be formed in such a manner that the pixel electrode layer overlaps with the gate wiring of an adjacent pixel with the planarization insulating layer, the protective insulating layer, and the gate insulating layer interposed therebetween, without provision of the capacitor wiring layer.

In FIG. 3A, the storage capacitor includes only the gate insulating layer 202 between the capacitor wiring layer and the capacitor electrode so that large capacitance is formed, while the wiring intersection includes the gate insulating layer 202 and an oxide insulating layer 266b which are provided between the gate electrode layer 421b and a wiring formed above the gate electrode layer 421b so that parasitic capacitance is reduced. In the storage capacitor, in order that only the gate insulating layer 202 be provided between the capacitor wiring layer and the capacitor electrode, an etching condition or a material of the gate insulating layer is selected such that etching for removing the oxide insulating layer 266b allows only the gate insulating layer 202 to remain. In this embodiment, since the oxide insulating layer 266b is a silicon oxide film formed by a sputtering method and the gate insulating layer 202 is a silicon nitride film formed by a plasma CVD method, the selective removal can be realized. Note that when a material that causes the oxide insulating layer 266b and the gate insulating layer 202 to be removed under the same etching conditions is used, the thicknesses are preferably set such that at least part of the gate insulating layer can remain and form the capacitor even if the thickness of the gate insulating layer is partly reduced. Since the thickness of the gate insulating layer is preferably reduced in order to form large capacitance in the storage capacitor, the thickness of part of the gate insulating layer above the capacitor wiring may be reduced during the etching for removing the oxide insulating layer 266b.

A thin film transistor 260 is a channel protective thin film transistor and is provided in the driver circuit. The thin film transistor 260 has a shorter channel length L than the thin film transistor 220 so that higher operation speed is realized. The channel length L of the channel protective thin film transistor which is provided in the driver circuit is preferably set to greater than or equal to 0.1 μm and less than or equal to 2 μm. The width in the channel length direction of a gate electrode layer 261 of the thin film transistor 260 is larger than that of the oxide semiconductor layer of the thin film transistor 260. End surfaces of the gate electrode layer 261 overlap with a source electrode layer 265a and a drain electrode layer 265b with the gate insulating layer 202 and the oxide insulating layer 266b interposed therebetween.

The thin film transistor 260 includes: over a substrate 200 having an insulating surface, the gate electrode layer 261; the gate insulating layer 202; the oxide semiconductor layer having at least a channel formation region 263, a high-resistance source region 264a, and a high-resistance drain region 264b; the source electrode layer 265a; and the drain electrode layer 265b. Further, an oxide insulating layer 266a in contact with the channel formation region 263 is provided.

The gate electrode layer of the thin film transistor 260 in the driver circuit may be electrically connected to a conductive layer 267 provided above the oxide semiconductor layer. In that case, a planarization insulating layer 204, a protective insulating layer 203, the oxide insulating layer 266b, and the gate insulating layer 202 are selectively etched using the same photomask as the contact hole for electrically connecting the drain electrode layer of the thin film transistor 220 to the pixel electrode layer 227, whereby a contact hole is formed. Through this contact hole, the conductive layer 267 is electrically connected to the gate electrode layer 261 of the thin film transistor 260 in the driver circuit.

For the protective insulating layer 203, an inorganic insulating film such as a silicon nitride film, an aluminum nitride film, a silicon nitride oxide film, or an aluminum oxynitride film is used. In this embodiment, a silicon nitride film is used.

In the thin film transistor 260, the width of the gate electrode layer 261 is larger than that of the oxide semiconductor layer. The oxide insulating layer 266b overlaps with a peripheral portion of the oxide semiconductor layer and also overlaps with the gate electrode layer 261. The oxide insulating layer 266b serves to increase the distance between the drain electrode layer 265b and the gate electrode layer 261, and reduce the parasitic capacitance formed between the drain electrode layer 265b and the gate electrode layer 261. A first region 264c and a second region 264d in the oxide semiconductor layer which overlap with the oxide insulating layer 266b are in an oxygen-excess state as well as the channel formation region 263, and reduce leakage current and the parasitic capacitance.

When a liquid crystal display panel has a size of more than 10 inches, such as 60 inches or 120 inches, there is a possibility that wiring resistance of a wiring having a light-transmitting property is a problem; therefore, a metal wiring is preferably used as part of the wiring so that wiring resistance is reduced. For example, the source electrode layer 265a and the drain electrode layer 265b are formed using a metal wiring of Ti or the like. Since a metal wiring is formed, the number of photomasks is increased by one as compared to the case of Embodiment 1.

In that case, a source electrode layer and a drain electrode layer which are formed using metal electrodes of Ti or the like are formed over and in contact with the dehydrated or dehydrogenated oxide semiconductor layer, a high-resistance source region overlapping with the source electrode layer and a high-resistance drain region overlapping with the drain electrode layer are formed, and a region between the high-resistance source region and the high-resistance drain region serves as a channel formation region.

Further, in order to reduce wiring resistance, auxiliary electrode layers 268a and 268b which are formed using a metal electrode having lower resistance are formed over the source electrode layer 265a and the drain electrode layer 265b as illustrated in FIG. 3A. Also in this case, since a metal wiring (metal electrode) is formed, the number of photomasks is further increased by one as compared to the case of Embodiment 1. Although a structure in which only a light-transmitting source electrode layer and a light-transmitting drain electrode layer are provided may be employed, wiring resistance can be reduced by providing the auxiliary electrode layers formed using a metal electrode over the source electrode layer and the drain electrode layer.

The source electrode layer 265a, the drain electrode layer 265b, the auxiliary electrode layers 268a and 268b, and the source electrode layer and the drain electrode layer of the thin film transistor 220 are formed in such a manner that a light-transmitting conductive film and a metal conductive film are stacked and then the stack is selectively etched by a photolithography step. The metal conductive film over the source electrode layer and the drain electrode layer of the thin film transistor 220 is removed.

In order to prevent the source electrode layer and the drain electrode layer of the thin film transistor 220 from being removed in the etching of the metal conductive film, a material and etching conditions of each of them are adjusted as appropriate.

In order to etch the metal conductive film selectively, an alkaline etchant is used, for example. As a material for the metal conductive film, an element selected from Al, Cr, Ta, Ti, Mo, and W; an alloy containing any of the above elements as its component; an alloy film containing a combination of any of the above elements; and the like can be given. The metal conductive film may have a single-layer structure or a stacked structure of two or more layers. For example, a single-layer structure of an aluminum film containing silicon; a two-layer structure of an aluminum film and a titanium film stacked thereover; a three-layer structure in which a Ti film, an aluminum film, and a Ti film are stacked in this order; and the like can be given. Alternatively, a film, an alloy film, or a nitride film which contains Al and one or more elements selected from titanium (Ti), tantalum (Ta), tungsten (W), molybdenum (Mo), chromium (Cr), neodymium (Nd), and scandium (Sc) may be used.

In this embodiment, a Ti film is used as the metal conductive film, and an In—Sn—O-based oxide is used for the source electrode layer and the drain electrode layer. As an etchant, an ammonia hydrogen peroxide mixture (a mixed solution of ammonia, water, and a hydrogen peroxide solution) is used.

The drain electrode layer 265b which is provided between the oxide semiconductor layer and the auxiliary electrode layer 268b including a metal material also functions as a low-resistance drain (LRD) region (also referred to as a low resistance N-type conductivity (LRN) region). The structure in which the oxide semiconductor layer, the low-resistance drain region, and the auxiliary electrode layer 268b which is a metal electrode are provided enables increase in withstand voltage of the transistor. Specifically, the carrier concentration of the low-resistance drain region is higher than that of the high-resistance drain region (HRD region) and is preferably in the range of higher than or equal to $1\times10^{20}/cm^3$ and lower than or equal to $1\times10^{21}/cm^3$, for example.

Plural gate wirings, source wirings, and capacitor wiring layers are provided in accordance with the pixel density. In the terminal portion, plural first terminal electrodes at the same potential as the gate wiring, plural second terminal electrodes at the same potential as the source wiring, plural third terminal electrodes at the same potential as the capacitor wiring layer, and the like are arranged. The number of each of the terminal electrodes may be any number determined as appropriate by the practitioner.

In the terminal portion, the first terminal electrode at the same potential as the gate wiring can be formed using the same light-transmitting material as the pixel electrode layer 227. The first terminal electrode is electrically connected to the gate wiring through a contact hole reaching the gate wiring. The contact hole reaching the gate wiring is formed in such a manner that the planarization insulating layer 204, the protective insulating layer 203, the oxide insulating layer 266b, and the gate insulating layer 202 are selectively etched using the same photomask as the contact hole for electrically connecting the drain electrode layer of the thin film transistor 220 to the pixel electrode layer 227.

The second terminal electrode 255 at the same potential as the source wiring 254 in the terminal portion can be formed using the same light-transmitting material as the pixel electrode layer 227. The second terminal electrode 255 is electrically connected to the source wiring 254 through a contact hole reaching the source wiring 254. The source wiring is a metal wiring formed using the same material and step as the source electrode layer 265a of the thin film transistor 260, and is at the same potential as the source electrode layer 265a.

The third terminal electrode at the same potential as the capacitor wiring layer 230 can be formed using the same light-transmitting material as the pixel electrode layer 227. A contact hole reaching the capacitor wiring layer 230 can be formed by using the same photomask and step as a contact hole for electrically connecting the capacitor electrode 231 to the pixel electrode layer 227.

When an active matrix liquid crystal display device is manufactured, an active matrix substrate and a counter substrate provided with a counter electrode are fixed with a liquid crystal layer therebetween. Note that a common electrode electrically connected to the counter electrode provided for the counter substrate is provided over the active matrix substrate, and a fourth terminal electrode electrically connected to the common electrode is provided in the terminal portion. This fourth terminal electrode is a terminal for setting the common electrode at a fixed potential such as GND or 0 V. The fourth terminal electrode can be formed using the same light-transmitting material as the pixel electrode layer 227.

When the gate electrode layer, the source electrode layer, the drain electrode layer, the pixel electrode layer, another electrode layer, and another wiring layer are formed using the same material, a common sputtering target or a common manufacturing apparatus can be used. Accordingly, the cost of the material of these layers and an etchant (or an etching gas) used in etching can be reduced, resulting in a reduction in manufacturing cost.

In the structure of FIG. 3A, when a photosensitive resin material is used for the planarization insulating layer 204, the step of forming a resist mask can be omitted.

FIG. 3B illustrates a cross-sectional structure that is partly different from that illustrated in FIG. 3A. FIG. 3B is the same as FIG. 3A except that there is no planarization insulating layer 204 in the terminal portion and except the structure of the thin film transistor in the driver circuit. Therefore, the same portions are denoted by the same reference numerals and detailed description thereof is omitted. In FIG. 3B, a thin film transistor 270 using a metal wiring is provided. The terminal electrode is also formed by using the same material and process as the metal wiring.

In the structure of FIG. 3B, a photosensitive resin material is used for the planarization insulating layer 204, and the step of forming a resist mask is omitted. Thus, without use of a resist mask, a structure in which there is no planarization insulating layer 204 in the terminal portion can be formed. When there is no planarization insulating layer in the terminal portion, favorable connection to an FPC can easily be obtained.

The thin film transistor 270 includes: over the substrate 200 having an insulating surface, a gate electrode layer 271; the gate insulating layer 202; an oxide semiconductor layer having at least a channel formation region 273, a high-resistance source region 274a, and a high-resistance drain region 274b; a source electrode layer 275a; and a drain electrode layer 275b. Further, an oxide insulating layer 276a in contact with the channel formation region 273 is provided.

A first region 274c and a second region 274d in the oxide semiconductor layer which overlap with the oxide insulating layer 276b are in an oxygen-excess state as well as the channel formation region 273, and serve to reduce leakage current and parasitic capacitance. A third region 274e in the oxide semiconductor layer which is in contact with the protective insulating layer 203 is provided between the channel formation region 273 and the high-resistance source region 274a. A fourth region 274f in the oxide semiconductor layer which is in contact with the protective insulating layer 203 is provided between the channel formation region 273 and the high-resistance drain region 274b. The third region 274e and the fourth region 274f in the oxide semiconductor layer which are in contact with the protective insulating layer 203 enables reduction in off current.

In the channel protective thin film transistor, when the source electrode layer and the drain electrode layer are provided over the oxide insulator layer having a small width which is reduced so as to shorten the channel length L of the channel formation region, a short circuit may be caused over the oxide insulating layer. Therefore, the source electrode layer 275a and the drain electrode layer 275b are provided so that their end portions are apart from the oxide insulating layer 276a having a small width.

In order to prevent the oxide semiconductor layer of the thin film transistor 270 from being removed in etching of the metal conductive film, a material and etching conditions of each of them are adjusted as appropriate.

In this embodiment, a Ti film is used as the metal conductive film, and an In—Ga—Zn—O-based oxide is used for the oxide semiconductor layer. As an etchant, an ammonia hydrogen peroxide mixture (a mixed solution of ammonia water, water, and a hydrogen peroxide solution) is used.

The gate electrode layer of the thin film transistor 270 in the driver circuit may be electrically connected to a conductive layer 277 provided above the oxide semiconductor layer.

A second terminal electrode 257 at the same potential as the source wiring 256 in the terminal portion can be formed using the same light-transmitting material as the pixel electrode layer 227. The source wiring is a metal wiring formed using the same material and step as the source electrode layer 275a of the thin film transistor 270, and is at the same potential as the source electrode layer 275a.

Since a thin film transistor is easily broken due to static electricity or the like, a protective circuit is preferably provided over the same substrate as the pixel portion or the driver circuit. The protective circuit is preferably formed using a non-linear element including an oxide semiconductor layer. For example, protective circuits are provided between the pixel portion and a scan line input terminal and between the pixel portion and a signal line input terminal. In this embodiment, a plurality of protective circuits are provided so as to prevent breakage of the a pixel transistor and the like which can be caused when surge voltage due to static electricity or the like is applied to a scan line, a signal line, and a capacitor bus line. Therefore, the protective circuit is formed so as to release charge to a common wiring when surge voltage is applied to the protective circuit. Further, the protective circuit includes non-linear elements arranged in parallel to each other with the scan line therebetween. The non-linear element includes a two-terminal element such as a diode or a three-terminal element such as a transistor. For example, the non-linear element can also be formed through the same process as the thin film transistor 220 in the pixel portion, and can be made to have the same properties as a diode by connecting a gate terminal to a drain terminal of the non-linear element.

A structure in which the planarization insulating layer 204 is not provided may be employed by omitting the step of forming the planarization insulating layer 204. In this case, the conductive layer 267, the conductive layer 277, the pixel electrode layer 227, and the second terminal electrodes 255 and 257 are provided over and in contact with the protective insulating layer 203.

This embodiment can be combined with Embodiment 1 as appropriate.

Embodiment 3

In this embodiment, an example of a structure of a terminal portion provided over the same substrate as the thin film transistor is described. Although an example of the terminal portion of the source wiring is described in Embodiment 2, a terminal portion of the source wiring which is different from the terminal portion described in Embodiment 2 and a terminal portion of the gate wiring are described in this embodiment. Note that in FIGS. 4A1 to 4B2, the same portions as FIGS. 3A and 3B are denoted by the same reference numerals.

FIGS. 4A1 and 4A2 respectively illustrate a cross-sectional view and a top view of the terminal portion of the gate wiring. FIG. 4A1 is a cross-sectional view taken along line C1-C2 of FIG. 4A2. In FIG. 4A1, a conductive layer 225 formed over the protective insulating layer 203 is a connection terminal electrode which functions as an input terminal. Furthermore, in the terminal portion of FIG. 4A1, a first terminal 221 formed using the same material as the gate electrode layer 421b and connection electrode layers 223 and 228 formed using the same material as the source wiring overlap with each other with the gate insulating layer 202 interposed therebetween, and are electrically connected to each other through the conductive layer 225. When the structure illustrated in FIG. 3B is employed, the first terminal 221 can be formed using a metal wiring material.

FIGS. 4B1 and 4B2 are respectively a cross-sectional view and a top view of the terminal portion of the source wiring which is different from the terminal portion of the source wiring illustrated in FIG. 3B. FIG. 4B1 is a cross-sectional view taken along line C3-C4 of FIG. 4B2. In FIG. 4B1, the conductive layer 225 formed over the protective insulating layer 203 is a connection terminal electrode which functions as an input terminal. Furthermore, in the terminal portion of FIG. 4B1, an electrode layer 226 formed using the same material as the gate wiring is located below and overlaps with second terminals 222 and 229 with the gate insulating layer 202 interposed therebetween. The electrode layer 226 is not electrically connected to the second terminals 222 and 229. When the potential of the electrode layer 226 is set to a potential different from that of the second terminals 222 and 229, such as floating, GND, or 0 V, a capacitor for preventing noise or static electricity can be formed. In addition, the second terminals 222 and 229 which are formed as a stack of conductive materials are electrically connected to the conductive layer 225 with the protective insulating layer 203 therebetween. Furthermore, when the structure illustrated in FIG. 3B is employed, the second terminals 222 and 229 can be formed as a single layer of a metal wiring material.

Plural gate wirings, source wirings, and capacitor wirings are provided in accordance with the pixel density. In the terminal portion, plural first terminals at the same potential as the gate wiring, plural second terminals at the same potential as the source wiring, plural third terminals at the same potential as the capacitor wiring, and the like are arranged. The number of each of the terminal electrodes may be any number determined as appropriate by the practitioner.

This embodiment can be combined with Embodiment 1 or 2 as appropriate.

Embodiment 4

In this embodiment, a description is provided of an example of a liquid crystal display device in which a liquid crystal layer is sealed between a first substrate and a second substrate, and a common connection portion electrically connected to the counter electrode provided for the second substrate is formed over the first substrate. Note that a thin film transistor is formed as a switching element over the first substrate, and the common connection portion is manufactured in the same process as the switching element in the pixel portion, thereby being obtained without complicating the process.

The common connection portion is provided in a position that overlaps with a sealant for bonding the first substrate and the second substrate, and is electrically connected to the counter electrode through conductive particles contained in the sealant. Alternatively, the common connection portion is provided in a position that does not overlap with the sealant (except for the pixel portion) and a paste containing conductive particles is provided separately from the sealant so as to overlap with the common connection portion, whereby the common connection portion is electrically connected to the counter electrode.

Figure 5A:
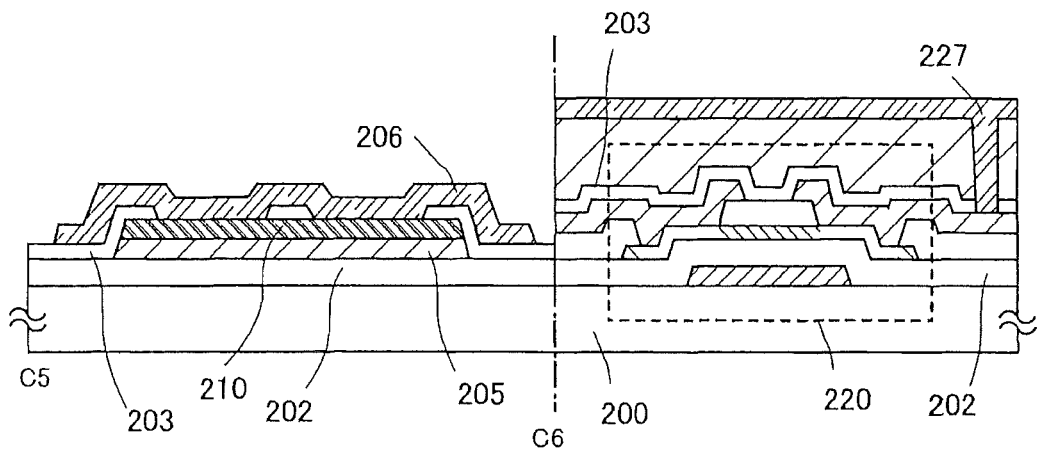
FIGS. 5A and 5C are cross-sectional views and FIG. 5B is a plan view illustrating an embodiment of the present invention.

FIG. 5A is a cross-sectional view of a semiconductor device in which a thin film transistor and a common connection portion are formed over one substrate.

In FIG. 5A, the thin film transistor 220 electrically connected to the pixel electrode layer 227 is a channel protective thin film transistor and is provided in the pixel portion. In this embodiment, the thin film transistor 220 has the same structure as the thin film transistor 448 of Embodiment 1.

Figure 5B:
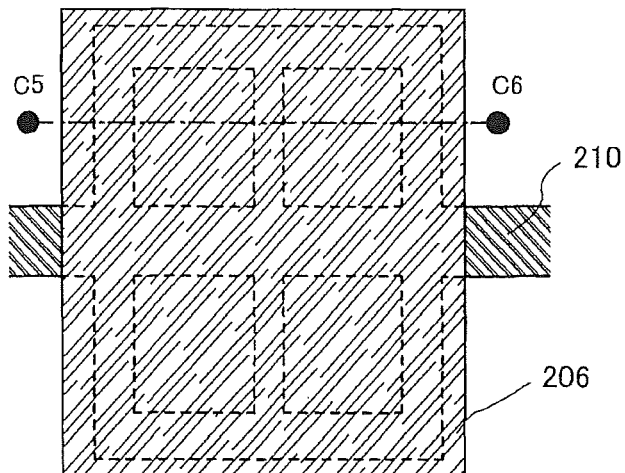

FIG. 5B illustrates an example of a top view of the common connection portion, and dashed line C5-C6 in FIG. 5B corresponds to a cross section of the common connection portion of FIG. 5A. Note that in FIG. 5B, the same portions as FIG. 5A are denoted by the same reference numerals.

Common potential lines 205 and 210 are provided over the gate insulating layer 202, and formed by using the same material and step as the source electrode layer and the drain electrode layer of the thin film transistor 220.

Further, the common potential lines 205 and 210 are covered with the protective insulating layer 203. The protective insulating layer 203 has a plurality of opening portions overlapping with the common potential lines 205 and 210. This opening portion is formed in the same step as the contact hole that connects the drain electrode layer of the thin film transistor 220 to the pixel electrode layer 227.

Note that because of a significant difference in area, a distinction is made here between the contact hole in the pixel portion and the opening portion in the common connection portion. Further, in FIG. 5A, the pixel portion and the common connection portion are not illustrated on the same scale. For example, the length of the dashed line C5-C6 in the common connection portion is approximately 500 μM while the width of the thin film transistor is less than 50 μm; thus, the common connection portion actually has greater than or equal to ten times as large area as the thin film transistor. However, for simplicity, the pixel portion and the common connection portion are illustrated on different scales in FIG. 5A.

A common electrode layer 206 is provided over the protective insulating layer 203, and formed by using the same material and step as the pixel electrode layer 227 in the pixel portion.

In this manner, the common connection portion is manufactured in the same process as the switching element in the pixel portion.

The first substrate provided with the pixel portion and the common connection portion and the second substrate having the counter electrode are fixed with the sealant.

When the sealant contains conductive particles, the pair of substrates are aligned so that the sealant overlaps with the common connection portion. For example, in a small-size liquid crystal panel, two common connection portions are arranged so as to overlap with the sealant at opposite corners of the pixel portion and the like. In a large-size liquid crystal panel, four or more common connection portions are arranged so as to overlap with the sealant.

Note that the common electrode layer 206 is an electrode in contact with the conductive particles contained in the sealant, and is electrically connected to the counter electrode of the second substrate.

When a liquid crystal injection method is used, the pair of substrates are fixed with the sealant, and then liquid crystal is injected between the pair of substrates. Alternatively, when a liquid crystal dropping method is used, the sealant is drawn on the second substrate or the first substrate, liquid crystal is dropped thereon, and then the pair of substrates are bonded to each other under reduced pressure.

An example of the common connection portion electrically connected to the counter electrode is described in this embodiment, but without any limitation thereto, such a common connection portion can be used as a connection portion connected to any other wiring, an external connection terminal, or the like.

Figure 5C:
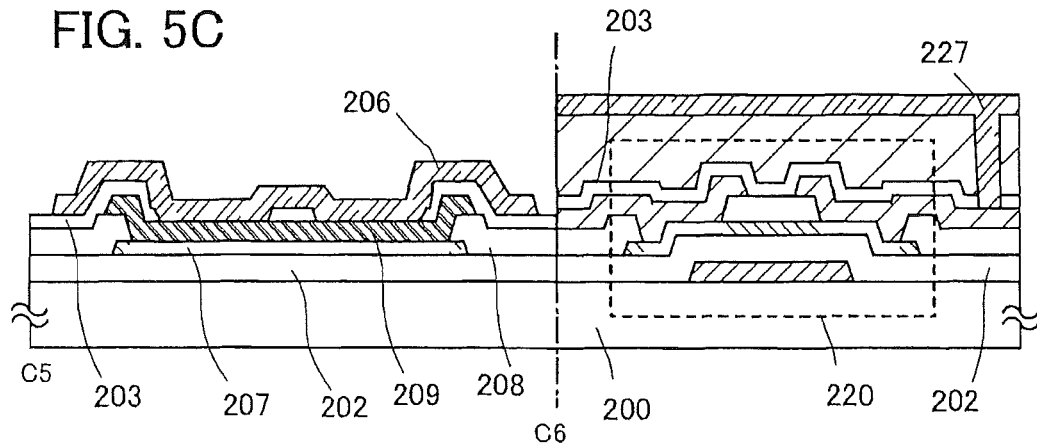

Further, FIG. 5C illustrates a cross-sectional structure which is partly different from that in FIG. 5A. FIG. 5C is the same as FIG. 5A except that an oxide semiconductor layer overlapping with the common electrode layer 206 and an oxide insulating layer which covers an end portion of the oxide semiconductor layer are provided and that a metal wiring is used as a common potential line. Therefore, the same portions are denoted by the same reference numerals and detailed description thereof is omitted.

An oxide semiconductor layer 207 is provided over the gate insulating layer 202, and formed using the same material and the same step as the oxide semiconductor layer of the thin film transistor 220. Further, an oxide insulating layer 208 is formed to cover the oxide semiconductor layer 207. Then, a common potential line 209 formed using a metal wiring is formed over the oxide semiconductor layer 207. The common potential line 209 formed using a metal wiring is formed in the same step as the source electrode layer and the drain electrode layer of the thin film transistor in the driver circuit, as described in Embodiment 2 with reference to FIG. 3B.

The common potential line 209 is covered with the protective insulating layer 203, and the protective insulating layer 203 has a plurality of openings in positions overlapping with the common potential line 209. These openings are formed in the same step as the contact hole which connects the drain electrode layer of the thin film transistor 220 and the pixel electrode layer 227.

The common electrode layer 206 is provided over the protective insulating layer 203 and formed using the same material and the same step as the pixel electrode layer 227 in the pixel portion.

In this manner, the switching element in the pixel portion and the common connection portion may be manufactured through a common manufacturing process, and the common potential line may be formed using a metal wiring so that wiring resistance is reduced.

This embodiment can be combined with any one of Embodiments 1 to 3 as appropriate.

Embodiment 5

An example in which a gate insulating layer has a single-layer structure is described in Embodiment 1 or Embodiment 2. In Embodiment 5, an example of a stacked structure will be described. Note that in FIGS. 6A and 6B, the same portions as FIG. 3A or FIG. 3B are denoted by the same reference numerals.

Figure 6A:
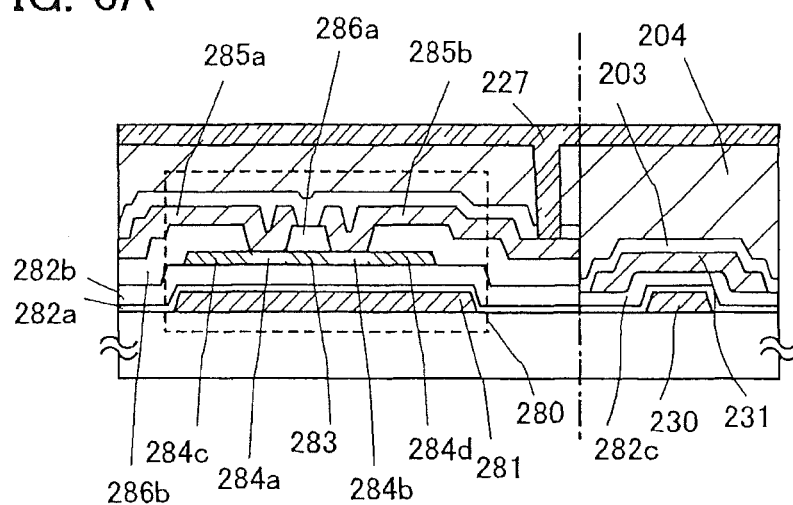
FIGS. 6A and 6B are cross-sectional views illustrating an embodiment of the present invention.

In FIG. 6A, a thin film transistor 280 is an example of a channel protective thin film transistor provided in a pixel portion, in which a gate insulating layer has a two-layer structure.

In this embodiment, the gate insulating layer has a stacked structure of a first gate insulating layer 282a with a thickness of greater than or equal to 50 nm and less than or equal to 200 nm and a second gate insulating layer 282b with a thickness of greater than or equal to 50 nm and less than or equal to 300 nm. As the first gate insulating layer 282a, a silicon nitride film or a silicon nitride oxide film with a thickness of 100 nm is used. As the second gate insulating layer 282b, a silicon oxide film with a thickness of 100 nm is used.

The thin film transistor 280 includes: over a substrate having an insulating surface, a gate electrode layer 281; the first gate insulating layer 282a; the second gate insulating layer 282b; an oxide semiconductor layer having at least a channel formation region 283, a high-resistance source region 284a, and a high-resistance drain region 284b, a source region 284c, and a drain region 284d; a source electrode layer 285a; and a drain electrode layer 285b. Further, an oxide insulating layer 286a is provided in contact with the channel formation region 283. In addition, the pixel electrode layer 227 is electrically connected to the drain electrode layer 285b.

Note that a storage capacitor is provided below the pixel electrode layer 227, and the capacitor electrode 231 is electrically connected to the pixel electrode layer 227.

In this embodiment, the storage capacitor is formed using the capacitor electrode 231 and the capacitor wiring layer 230.

In FIG. 6A, the storage capacitor includes only the gate insulating layer between the capacitor wiring and the capacitor electrode so as to have large capacitance.

In this embodiment, as an example, an oxide insulating layer 286b is formed using a silicon oxide film obtained by a sputtering method, and the second gate insulating layer formed using a silicon oxide film is etched to be thin when the oxide insulating layer which overlaps with the capacitor wiring layer 230 is removed, whereby a third gate insulating layer 282c is formed. Note that the first gate insulating layer 282a is formed using a silicon nitride film or a silicon nitride oxide film, and functions as an etching stopper to prevent etching damage on the gate electrode layer or the substrate.

When the third gate insulating layer 282c has a small thickness, storage capacitance can be increased.

Figure 6B:
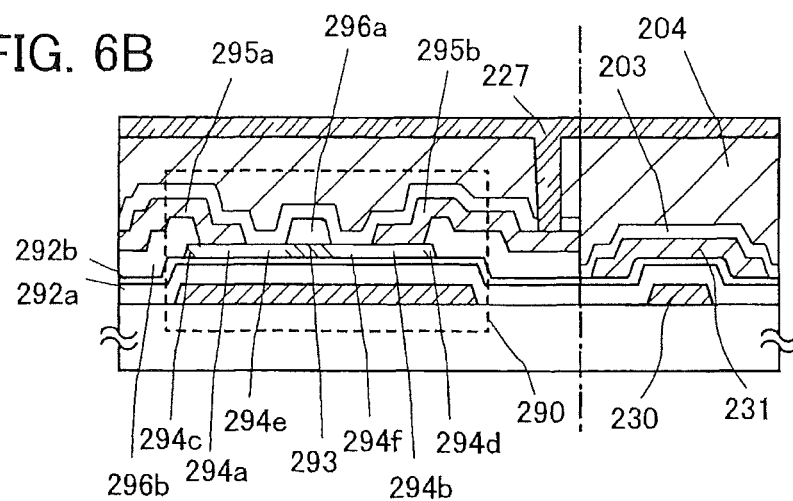

FIG. 6B illustrates a cross-sectional structure which is partly different from that in FIG. 6A.

In a thin film transistor 290 illustrated in FIG. 6B, a gate insulating layer has a stacked structure of a first gate insulating layer 292a with a thickness of greater than or equal to 50 nm and less than or equal to 200 nm and a second gate insulating layer 292b with a thickness of greater than or equal to 1 nm and less than or equal to 50 nm. As the first gate insulating layer 292a, a silicon oxide film with a thickness of 100 nm is used. As the second gate insulating layer 292b, a silicon nitride film or a silicon nitride oxide film with a thickness of 10 nm is used.

The thin film transistor 290 includes: over the substrate 200 having an insulating surface, a gate electrode layer 291; the first gate insulating layer 292a; the second gate insulating layer 292b; an oxide semiconductor layer having at least a channel formation region 293, a high-resistance source region 294a, and a high-resistance drain region 294b; a source electrode layer 295a; and a drain electrode layer 295b. Further, an oxide insulating layer 296a is provided in contact with the channel formation region 293.

In addition, a first region 294c and a second region 294d of the oxide semiconductor layer, which overlap with an oxide insulating layer 296b, are in the same oxygen-excess state as the channel formation region 293 and have a function of reducing leakage current or parasitic capacitance. Furthermore, a third region 294e of the oxide semiconductor layer, which is in contact with the protective insulating layer 203, is provided between the channel formation region 293 and the high-resistance source region 294a. A fourth region 294f of the oxide semiconductor layer, which is in contact with the protective insulating layer 203, is provided between the channel formation region 293 and the high-resistance drain region 294b. With the third region 294e and the fourth region 294f of the oxide semiconductor layer, which are in contact with the protective insulating layer 203, off current can be reduced.

The third region 294e and the fourth region 294f of the oxide semiconductor layer are also in contact with the second gate insulating layer 292b formed using a silicon nitride film or a silicon nitride oxide film. The protective insulating layer 203 is formed using an inorganic insulating film which does not include impurities such as moisture, a hydrogen ion, and OH⁻ and blocks entry of these from the outside; for example, a silicon nitride film, an aluminum nitride film, a silicon nitride oxide film, an aluminum oxynitride film, or the like is used.

In this embodiment, as an example, the oxide insulating layer 296b is formed using a silicon oxide film obtained by a sputtering method, and the oxide insulating layer is etched using the second gate insulating layer which is formed using a silicon nitride film or a silicon nitride oxide film as an etching stopper when the oxide insulating layer which overlaps with the capacitor wiring layer 230 is removed.

In a channel protective thin film transistor, when the width of an oxide insulating layer is reduced so that a channel length L of a channel formation region is reduced and a source electrode layer and a drain electrode layer are provided over the oxide insulating layer with a small width, there is a possibility that a short circuit may be caused over the oxide insulating layer. Therefore, the source electrode layer 295a and the drain electrode layer 295b are provided so that their end portions are apart from the oxide insulating layer 296a having a small width.

This embodiment can be freely combined with any one of Embodiments 1 to 4.

Embodiment 6

In this embodiment, an example of a thin film transistor whose manufacturing process is partly different from that of Embodiment 1 will be described with reference to FIGS. 7A to 7C and FIGS. 8A to 8E. FIGS. 7A to 7C and FIGS. 8A to 8E are the same as FIGS. 1A to 1C and FIGS. 2A to 2E except that there is a difference in part of the process. Therefore, the same portions are denoted by the same reference numerals, and detailed description of the same portions is omitted.

First, in accordance with Embodiment 1, a gate electrode layer, a gate insulating layer, and the oxide semiconductor film 430 are formed over a substrate; thus, steps until FIG. 2A of Embodiment 1 are performed. FIG. 2A is the same as FIG. 8A.

Then, the oxide semiconductor film 430 is processed into an island-shaped oxide semiconductor layer by a second photolithography step.

Next, dehydration or dehydrogenation of the oxide semiconductor layer is performed. The temperature of first heat treatment for dehydration or dehydrogenation is set at higher than or equal to 400° C. and lower than a strain point of the substrate, preferably 425° C. or higher. Note that the heat treatment time may be 1 hour or shorter when the temperature of the heat treatment is 425° C. or higher, but is set to longer than 1 hour when the temperature of the heat treatment is lower than 425° C. In this embodiment, the substrate is introduced into an electric furnace, which is one of heat treatment apparatuses, and heat treatment is performed on the oxide semiconductor layer in a nitrogen atmosphere. Then, the oxide semiconductor layer is not exposed to air, which prevents reincorporation of water and hydrogen into the oxide semiconductor layer, so that an oxide semiconductor layer is obtained. After that, cooling is performed by introduction of a high-purity oxygen gas, a high-purity $N_2O$ gas, or ultra-dry air (having a dew point of −40° C. or lower, preferably −60° C. or lower) into the same furnace. It is preferable that the oxygen gas and the $N_2O$ gas do not include water, hydrogen, and the like. Alternatively, the purity of an oxygen gas or an $N_2O$ gas which is introduced into the heat treatment apparatus is preferably 6N (99.9999%) or higher, more preferably 7N (99.99999%) or higher (that is, the impurity concentration of the oxygen gas or the N$_2$O gas is 1 ppm or lower, preferably 0.1 ppm or lower).

Further, after the first heat treatment for dehydration or dehydrogenation, heat treatment may be performed at higher than or equal to 200° C. and lower than or equal to 400° C., preferably higher than or equal to 200° C. and lower than or equal to 300° C., in an atmosphere of an oxygen gas or an N$_2$O gas.

Alternatively, the first heat treatment of the oxide semiconductor layer can be performed on the oxide semiconductor film 430 before it is processed into the island-shaped oxide semiconductor layer. In that case, after the first heat treatment, the substrate is taken out of the heating apparatus and subjected to a photolithography step.

Through the above process, the whole oxide semiconductor film is placed in an oxygen-excess state; accordingly, a high-resistance (i-type) oxide semiconductor film is formed.

Next, an oxide insulating film is formed over the gate insulating layer 402 and the oxide semiconductor layer by a sputtering method. Then, a resist mask is formed by a third photolithography step, and the oxide insulating layers 426a and 426b are formed by selective etching. After that, the resist mask is removed (see FIG. 8B).

Next, a light-transmitting conductive film is formed over the gate insulating layer 402, the oxide insulating layers 426a and 426b, and an oxide semiconductor layer 422. Then, a resist mask is formed by a fourth photolithography step, and the source electrode layer 425a and the drain electrode layer 425b are formed by selective etching (see FIG. 8C).

Next, in order to reduce variation in electric characteristics of the thin film transistor, heat treatment (preferably at higher than or equal to 150° C. and lower than 350° C.) may be performed in an inert gas atmosphere or a nitrogen gas atmosphere. For example, heat treatment is performed at 250° C. for 1 hour in a nitrogen atmosphere.

Next, the protective insulating layer 403 is formed over the oxide insulating layers 426a and 426b, the source electrode layer 425a, and the drain electrode layer 425b.

Next, the planarization insulating layer 404 is formed over the protective insulating layer 403.

Next, a fifth photolithography step is performed. A resist mask is formed, and the planarization insulating layer 404 and the protective insulating layer 403 are etched, so that the contact hole 441 which reaches the drain electrode layer 425b is formed. Then, the resist mask is removed (see FIG. 8D).

Next, a light-transmitting conductive film is formed.

Next, a sixth photolithography step is performed. A resist mask is formed, and unnecessary portions are removed by etching, so that the pixel electrode layer 427 is forming. Then, the resist mask is removed (see FIG. 8E).

Through the above process, a thin film transistor 420 and a wiring intersection in which parasitic capacitance is reduced can be manufactured over the same substrate with the use of six masks.

The thin film transistor 420 used for a pixel is a channel protective thin film transistor which includes the oxide semiconductor layer 422 having a channel formation region.

Figure 7A:
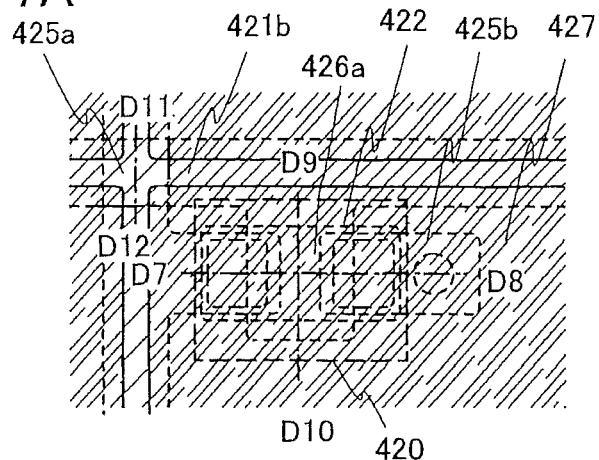
FIG. 7A is a plan view and FIGS. 7B and 7C are cross-sectional views illustrating an embodiment of the present invention.
Figure 7B:
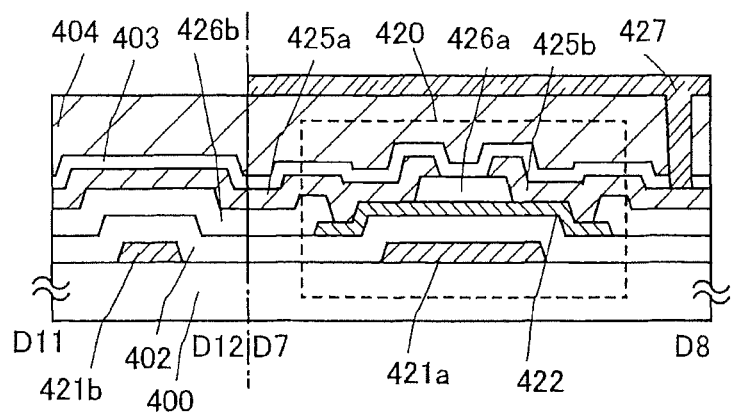
Figure 7C:
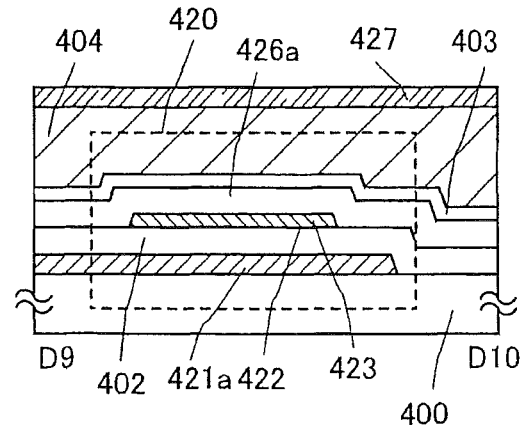
Figure 8A:
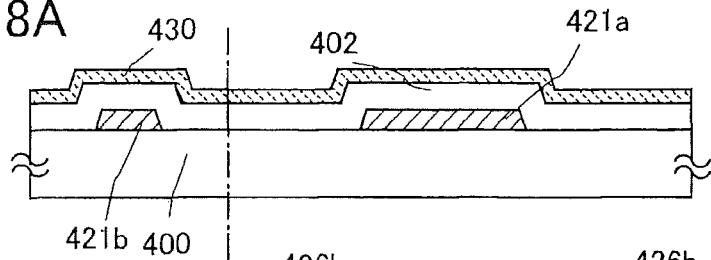
FIGS. 8A to 8E are process cross-sectional views illustrating an embodiment of the present invention.
Figure 8B:
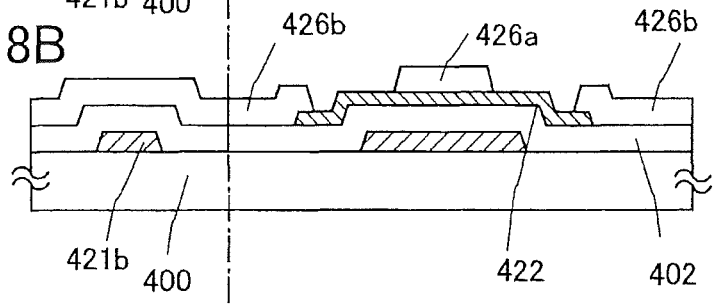
Figure 8C:
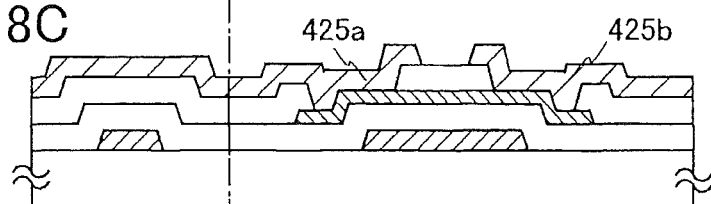
Figure 8D:
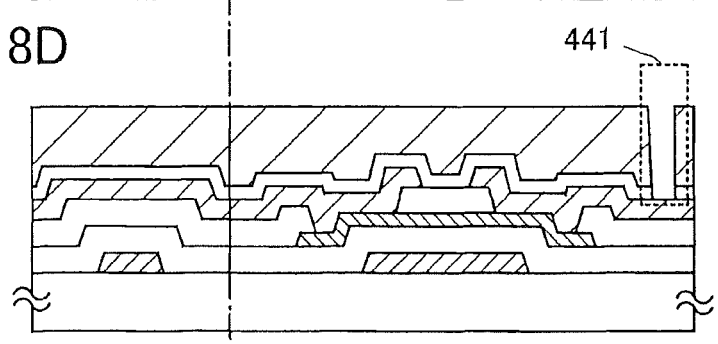
Figure 8E:
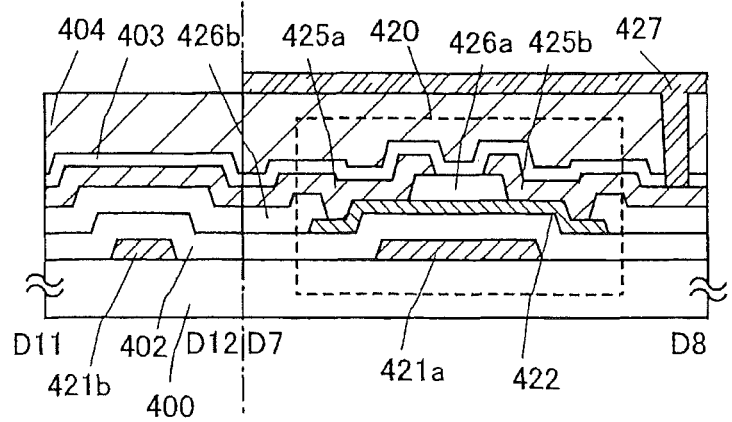

In addition, FIG. 7A is a plan view of the channel protective thin film transistor 420 which is provided in a pixel, and FIG. 7B is a cross-sectional view taken along line D7-D8 and line D11-D12 of FIG. 7A. FIG. 7C is a cross-sectional view taken along line D9-D10 of FIG. 7A. Note that FIG. 8E is the same as FIG. 7B.

This embodiment can be freely combined with any one of Embodiments 1 to 5.

Embodiment 7

Figure 9A:
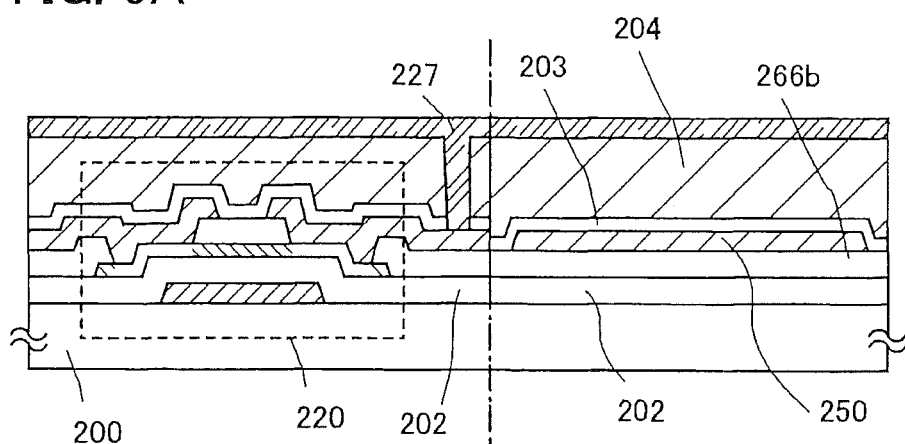
FIGS. 9A and 9B illustrate a semiconductor device.

In this embodiment, an example of a structure of a storage capacitor, which is different from that of Embodiment 2, will be described with reference to FIGS. 9A and 9B. FIG. 9A is the same as FIG. 3A except that there is a difference in the structure of a storage capacitor. Therefore, the same portions are denoted by the same reference numerals and detailed description of the same portions is omitted. Note that FIG. 9A illustrates a cross-sectional structure of the thin film transistor 220 in a pixel portion and the storage capacitor.

FIG. 9A illustrates an example in which a storage capacitor is formed by the pixel electrode layer 227 and a capacitor wiring layer 250 which overlaps with the pixel electrode layer 227 with the use of the protective insulating layer 203 and the planarization insulating layer 204 as a dielectric. The capacitor wiring layer 250 is formed using the same light-transmitting material and in the same step as the source electrode layer of the thin film transistor 220 in the pixel portion; therefore, the capacitor wiring layer 250 is disposed so as not to overlap with the source wiring layer of the thin film transistor 220.

In the storage capacitor illustrated in FIG. 9A, the pair of electrodes and the dielectric have a light-transmitting property, and thus the whole storage capacitor has a light-transmitting property.

Figure 9B:
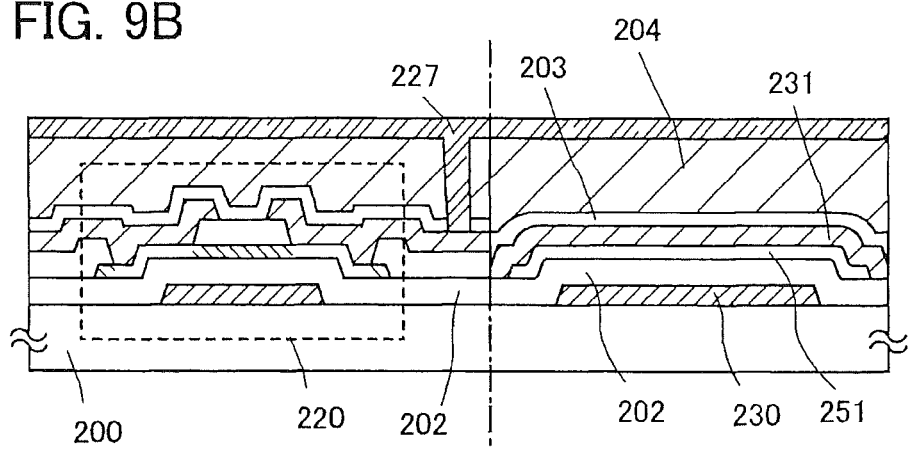

FIG. 9B illustrates an example of a storage capacitor having a structure different from that in FIG. 9A. FIG. 9B is also the same as FIG. 3A except that there is a difference in the structure of the storage capacitor. Therefore, the same portions are denoted by the same reference numerals and detailed description of the same portions is omitted.

FIG. 9B illustrates an example in which a storage capacitor is formed by the capacitor wiring layer 230 and a stack of an oxide semiconductor layer 251 and the capacitor electrode 231 which overlap with the capacitor wiring layer 230 with the use of the gate insulating layer 202 as a dielectric. Further, the capacitor electrode 231 is stacked over and in contact with the oxide semiconductor layer 251 and functions as one of electrodes of the storage capacitor. Note that the oxide semiconductor layer 251 is formed using the same light-transmitting material and in the same step as the oxide semiconductor layer of the thin film transistor 220. The capacitor wiring layer 230 is formed using the same light-transmitting material and in the same step as the gate electrode layer of the thin film transistor 220; therefore, the capacitor wiring layer 230 is disposed so as not to overlap with a gate wiring layer of the thin film transistor 220. In addition, the capacitor electrode 231 is electrically connected to the pixel electrode layer 227.

Also in the storage capacitor illustrated in FIG. 9B, the pair of electrodes and the dielectric have a light-transmitting property, and thus the whole storage capacitor has a light-transmitting property.

The storage capacitors illustrated in FIGS. 9A and 9B have a light-transmitting property, and high definition of a displayed image is achieved by increasing the number of gate wirings, for example. Therefore, even when the pixel size is reduced, sufficient capacitance and a high aperture ratio can be obtained.

This embodiment can be freely combined with any of the other embodiments.

Embodiment 8

In this embodiment, an example will be described below in which at least some of driver circuits and a thin film transistor disposed in a pixel portion are formed over one substrate.

The thin film transistor disposed in the pixel portion is formed in accordance with any of Embodiments 1, 2, 5, and 6. Since the thin film transistor described in any of Embodiments 1, 2, 5, and 6 is an n-channel TFT, some of driver circuits that can be constituted by n-channel TFTs among the driver circuits are formed over the substrate where the thin film transistor in the pixel portion is formed.

Figure 14A:
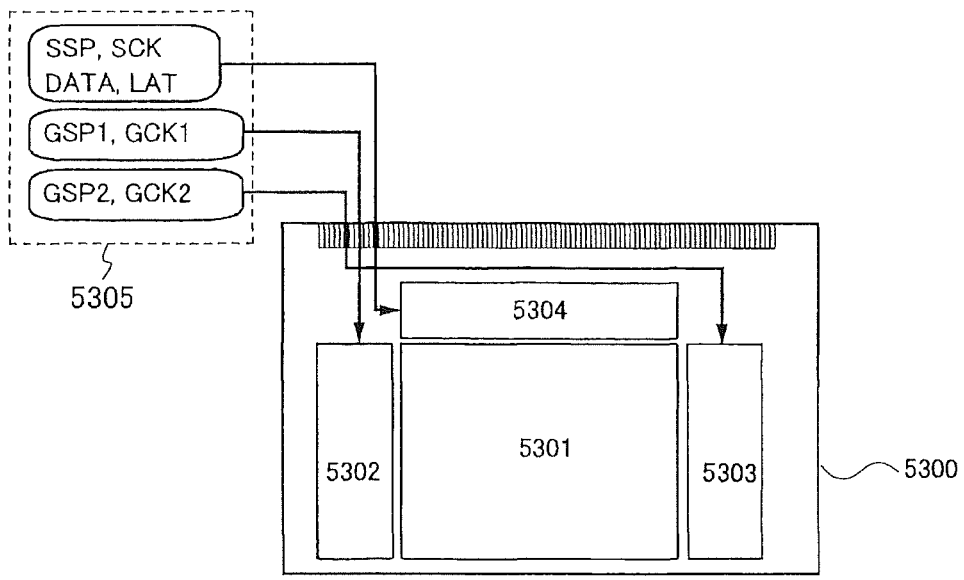
FIGS. 14A and 14B are block diagrams of semiconductor devices.

FIG. 14A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that in cross regions of the scan lines and the signal lines, pixels each having a display element are arranged in a matrix. The substrate 5300 of the display device is connected to a timing control circuit 5305 (also referred to as a controller or a control IC) through a connection portion such as a flexible printed circuit (FPC).

In FIG. 14A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are externally provided is reduced, so that cost can be reduced. Moreover, the number of connections in the connection portion which are formed when wirings are extended from a driver circuit provided outside the substrate 5300 can be reduced, and the reliability or yield can be increased.

Note that the timing control circuit 5305 supplies, for example, a first scan line driver circuit start signal (GSP1) and a scan line driver circuit clock signal (GCK1) to the first scan line driver circuit 5302. Furthermore, the timing control circuit 5305 supplies, for example, a second scan line driver circuit start signal (GSP2) (which is also referred to as a start pulse) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 14B:
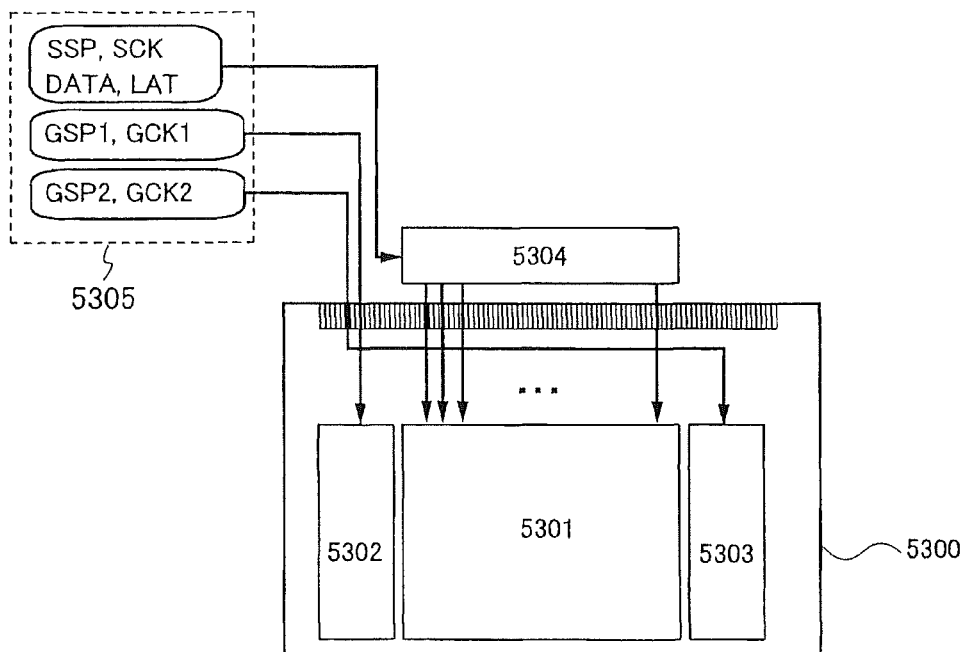

FIG. 14B illustrates a structure in which circuits with lower driving frequency (e.g., the first scan line driver circuit 5302 and the second scan line driver circuit 5303) are formed over the substrate 5300 where the pixel portion 5301 is formed, and the signal line driver circuit 5304 is formed over a substrate which is different from the substrate 5300 where the pixel portion 5301 is formed. With this structure, the driver circuits formed over the substrate 5300 can be constituted by thin film transistors whose field effect mobility is lower than that of transistors including a single crystal semiconductor. Thus, increase in size of the display device, reduction in cost, improvement in yield, or the like can be achieved.

Figure 15A:
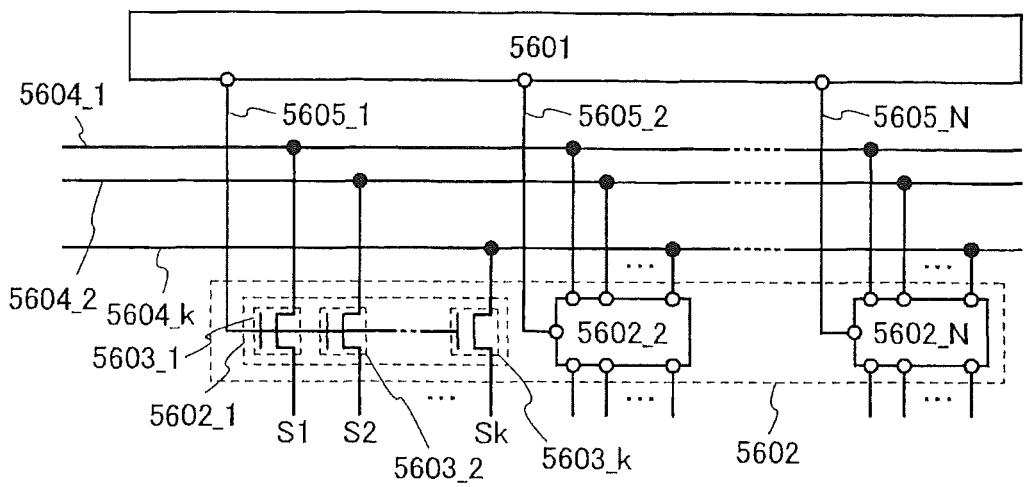
FIG. 15A illustrates a configuration of a signal line driver circuit and FIG. 15B is a timing chart illustrating operation thereof.
Figure 15B:
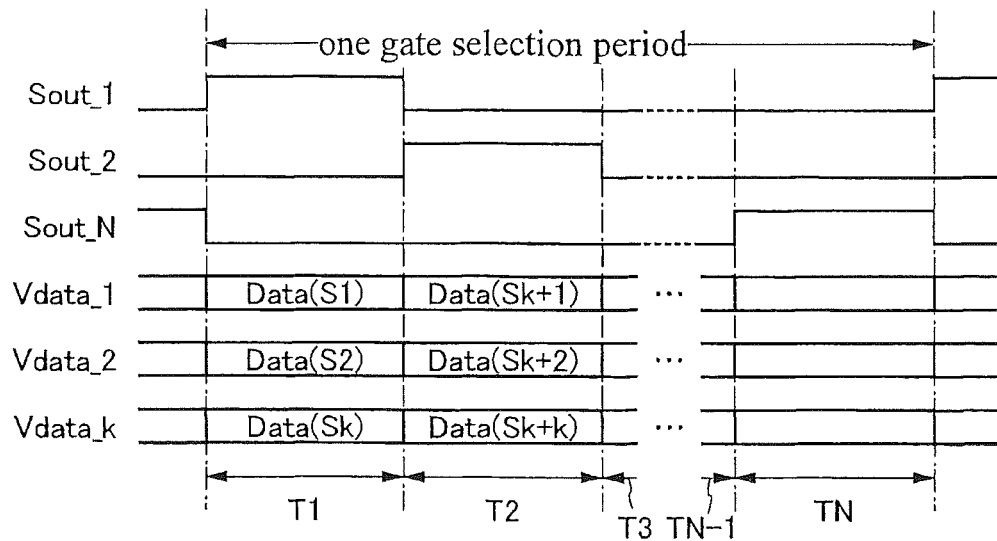

The thin film transistors described in Embodiments 1, 2, 5, and 6 are n-channel TFTs. FIGS. 15A and 15B illustrate an example of a configuration and operation of a signal line driver circuit constituted by n-channel TFTs.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_k (k is a natural number). The example where the thin film transistors 5603_1 to 5603_k are n-channel TFTs is described below.

A connection relation in the signal line driver circuit is described by using the switching circuit 5602_1 as an example. First terminals of the thin film transistors 5603_1 to 5603_k are connected to wirings 5604_1 to 5604_k, respectively. Second terminals of the thin film transistors 5603_1 to 5603_k are connected to signal lines S1 to Sk, respectively. Gates of the thin film transistors 5603_1 to 5603_k are connected to a wiring 5605_1.

The shift register 5601 has a function of sequentially selecting the switching circuits 5602_1 to 5602_N by sequentially outputting H-level signals (also referred to as H signals or signals at a high power supply potential level) to wirings 5605_1 to 5605_N.

The switching circuit 5602_1 has a function of controlling electrical continuity between the wirings 5604_1 to 5604_k and the signal lines S1 to Sk (electrical continuity between the first terminals and the second terminals), that is, a function of controlling whether potentials of the wirings 5604_1 to 5604_k are supplied to the signal lines S1 to Sk. In this manner, the switching circuit 5602_1 functions as a selector. Moreover, the thin film transistors 5603_1 to 5603_k have functions of controlling conduction states between the wirings 5604_1 to 5604_k and the signal lines S1 to Sk, respectively, that is, functions of supplying potentials of the wirings 5604_1 to 5604_k to the signal lines S1 to Sk, respectively. In this manner, each of the thin film transistors 5603_1 to 5603_k functions as a switch.

The video signal data (DATA) is input to each of the wirings 5604_1 to 5604_k. The video signal data (DATA) is often an analog signal that corresponds to an image signal or image data.

Next, the operation of the signal line driver circuit in FIG. 15A is described with reference to a timing chart in FIG. 15B. FIG. 15B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_k. Note that one operation period of the signal line driver circuit corresponds to one gate selection period in a display device. For example, one gate selection period is divided into periods T1 to TN. Each of the periods T1 to TN is a period for writing the video signal data (DATA) into a pixel in a selected row.

Note that signal waveform distortion and the like in each structure illustrated in drawings and the like in this embodiment are exaggerated for simplicity in some cases. Therefore, this embodiment is not necessarily limited to the scale illustrated in the drawings and the like.

In the periods T1 to TN, the shift register 5601 sequentially outputs H-level signals to the wirings 5605_1 to 5605_N. For example, in the period T1, the shift register 5601 outputs an H-level signal to the wiring 5605_1. Then, the thin film transistors 5603_1 to 5603k are turned on, so that the wirings 5604_1 to 5604_k and the signal lines S1 to Sk are brought into conduction. At this time, Data(S1) to Data(Sk) are input to the wirings 5604_1 to 5604_k, respectively. The Data(S1) to Data(Sk) are written into pixels in a first to kth columns in the selected row through the thin film transistors 5603_1 to 5603_k, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when a video signal is written into pixels by a plurality of columns; thus, insufficient writing of a video signal can be prevented.

Note that any of the circuits constituted by the thin film transistors in any of Embodiments 1, 2, 5, and 6 can be used for the shift register 5601 and the switching circuit 5602. In that case, the shift register 5601 can be constituted by only n-channel transistors or only p-channel transistors.

One embodiment of a shift register which is used for part of the scan line driver circuit and/or the signal line driver circuit is described with reference to FIGS. 16A to 16D and FIGS. 17A and 17B.

The scan line driver circuit includes a shift register. Additionally, the scan line driver circuit may include a level shifter, a buffer, or the like in some cases. In the scan line driver circuit, a clock signal (CLK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to the scan line. Since the transistors in the pixels of one line have to be turned on at the same time, a buffer that can supply large current is used.

Figure 16A:
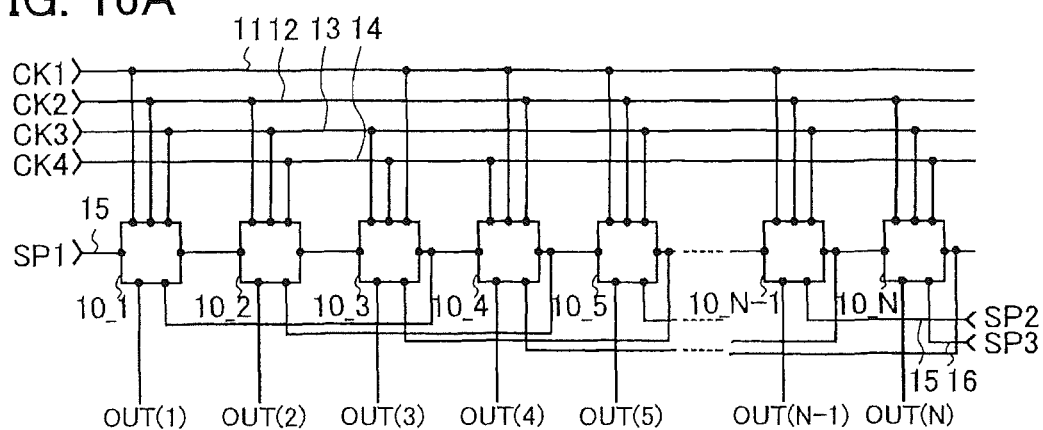
FIGS. 16A to 16D are circuit diagrams illustrating a configuration of a shift register.

The shift registers of the scan line driver circuit and the signal line driver circuit are described with reference to FIGS. 16A to 16D and FIGS. 17A and 17B. The shift register includes a first to Nth pulse output circuits 10_1 to 10_N (N is a natural number greater than or equal to 3) (see FIG. 16A). In the shift register illustrated in FIG. 16A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n of the second or subsequent stage (n is a natural number greater than or equal to 2 and less than or equal to N), a signal from the pulse output circuit of the preceding stage (such a signal is referred to as a preceding-stage signal OUT(n−1)) (n is a natural number greater than or equal to 2 and less than or equal to N) is input. To the first pulse output circuit 10_1, a signal from the third pulse output circuit 10_3 of the stage following the next stage is input. Similarly, to the nth pulse output circuit 10_n of the second or subsequent stage, a signal from the (n+2)th pulse output circuit 10_(n+2) of the stage following the next stage (such a signal is referred to as a subsequent-stage signal OUT(n+2)) is input. Therefore, the pulse output circuits of the respective stages output first output signals (OUT(1)(SR) to OUT(N)(SR)) to be input to the pulse output circuit of the subsequent stage and/or the pulse output circuit of the stage before the preceding stage and second output signals (OUT(1) to OUT(N)) to be input to another circuit or the like. Note that since the subsequent-stage signal OUT(n+2) is not input to the last two stages of the shift register as illustrated in FIG. 16A, a second start pulse SP2 and a third start pulse SP3 may be input to the pulse output circuits of the last two stages, for example.

Note that a clock signal (CK) is a signal that alternates between an H level and an L level (also referred to as an L signal or a signal at low power supply potential level) at regular intervals. Here, the first clock signal (CK1) to the fourth clock signal (CK4) are delayed by ¼ cycle sequentially (i.e., they are 90° out of phase with each other). In this embodiment, driving or the like of the pulse output circuit is controlled with the first to fourth clock signals (CK1) to (CK4). Note that the clock signal is also referred to as GCK or SCK in some cases depending on a driver circuit to which the clock signal is input; the clock signal is referred to as CK in the following description.

A first input terminal 21, a second input terminal 22, and a third input terminal 23 are electrically connected to any of the first to fourth wirings 11 to 14. For example, in the first pulse output circuit 10_1 in FIG. 16A, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

Figure 16B:
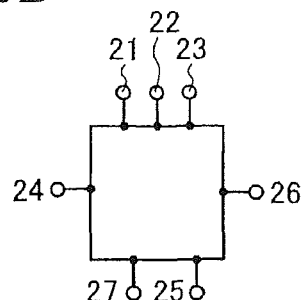

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 16B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1)(SR) is output from the first output terminal 26; and the second output signal OUT(1) is output from the second output terminal 27.

Figure 16C:
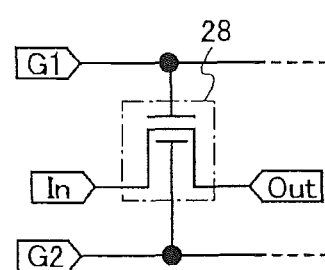

In the first to Nth pulse output circuits 10_1 to 10_N, the thin film transistor (TFT) having four terminals described in the above embodiment can be used in addition to a thin film transistor having three terminals. FIG. 16C illustrates the symbol of a thin film transistor 28 having four terminals, which is described in the above embodiment. The symbol of the thin film transistor 28 illustrated in FIG. 16C represents the thin film transistor having four terminals which is described in any of Embodiments 1, 2, 5, and 6 and is used in the drawings and the like. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode. The thin film transistor 28 is an element which can control electric current between an In terminal and an Out terminal with a first control signal G1 which is input to a lower gate electrode and a second control signal G2 which is input to an upper gate electrode.

When an oxide semiconductor is used for a semiconductor layer including a channel formation region in a thin film transistor, the threshold voltage sometimes shifts in the positive or negative direction depending on a manufacturing process. For that reason, the thin film transistor in which an oxide semiconductor is used for a semiconductor layer including a channel formation region preferably has a structure with which the threshold voltage can be controlled. The threshold voltage of the four-terminal thin film transistor 28 illustrated in FIG. 16C can be controlled to be a desired level by providing gate electrodes above and below a channel formation region of the thin film transistor 28 with a gate insulating film interposed between the upper gate electrode and the channel formation region and between the lower gate electrode and the channel formation region, and by controlling a potential of the upper gate electrode and/or the lower gate electrode.

Next, an example of a specific circuit configuration of the pulse output circuit illustrated in FIG. 16B will be described with reference to FIG. 16D.

Figure 16D:
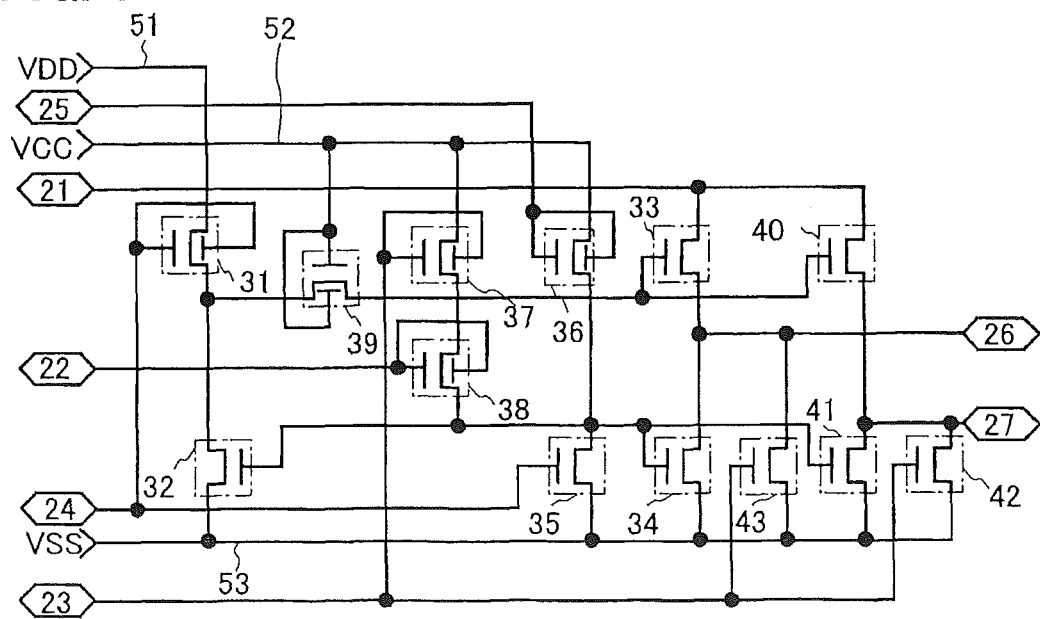

The first pulse output circuit 10_1 illustrated in FIG. 16D includes a first to thirteenth transistors 31 to 43. A signal or a power supply potential is supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27, which are described above. The relation of the power supply potentials of the power supply lines in FIG. 16D is as follows: the first power supply potential VDD is higher than or equal to the second power supply potential VCC, and the second power supply potential VCC is higher than the third power supply potential VSS. Note that the first to fourth clock signals (CK1) to (CK4) each alternate between an H level and an L level at regular intervals; the clock signal at the H level is VDD and the clock signal at the L level is VSS. By making the potential VDD of the power supply line 51 higher than the potential VCC of the power supply line 52, a potential applied to a gate electrode of a transistor can be lowered, shift in threshold voltage of the transistor can be reduced, and deterioration of the transistor can be suppressed without an adverse effect on the operation of the transistor. Note that as in FIG. 16D, the thin film transistor 28 having four terminals which is illustrated in FIG. 16C is preferably used as the first transistor 31 and the sixth to ninth transistors 36 to 39 among the first to thirteenth transistors 31 to 43. The first transistor 31 and the sixth to ninth transistors 36 to 39 need to switch a potential of a node to which one electrode serving as a source or a drain is connected depending on a control signal of the gate electrode, and can reduce a malfunction of the pulse output circuit by quick response (sharp rising of on-current) to the control signal input to the gate electrode. By using the thin film transistor 28 having four terminals which is illustrated in FIG. 16C, the threshold voltage can be controlled, and a malfunction of the pulse output circuit can be further reduced. Note that although the first control signal G1 and the second control signal G2 are the same control signals in FIG. 16D, the first control signal G1 and the second control signal G2 may be different control signals.

In FIG. 16D, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode, of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 16D, a connection point where the gate electrode of the third transistor 33, the gate electrode of the tenth transistor 40, and the second terminal of the ninth transistor 39 are connected is referred to as a node A. A connection point where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B.

Figure 17A:
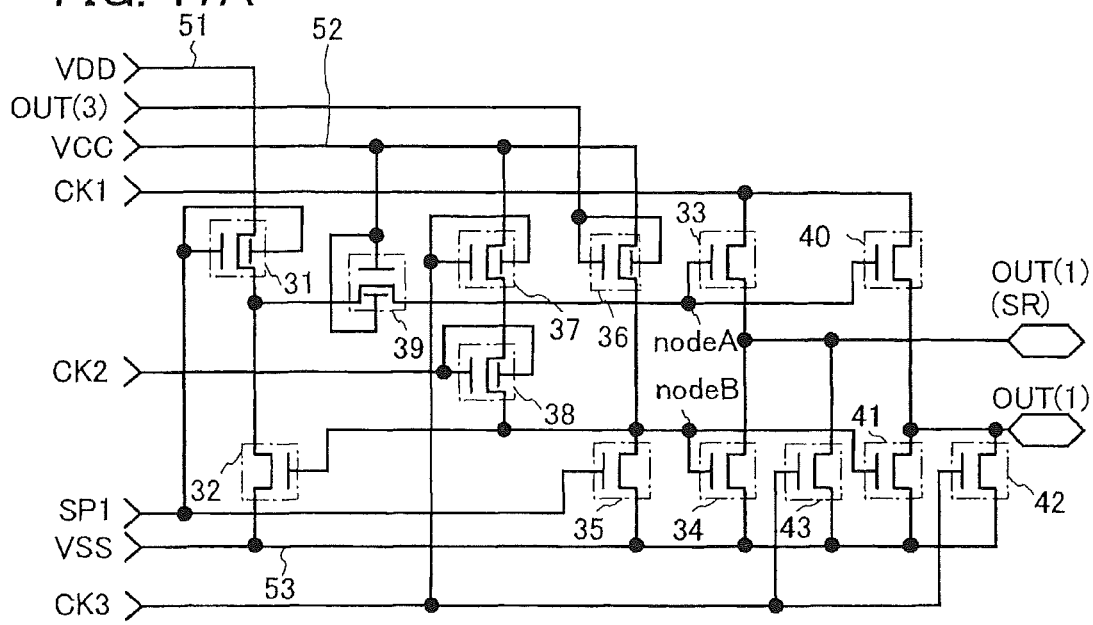
FIG. 17A is a circuit diagram illustrating a configuration of a shift register and FIG. 17B is a timing chart illustrating operation thereof.

FIG. 17A illustrates signals that are input to or output from the first to fifth input terminals 21 to 25 and the first and second output terminals 26 and 27 in the case where the pulse output circuit illustrated in FIG. 16D is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that a thin film transistor is an element having at least three terminals of a gate, a drain, and a source. The thin film transistor has a semiconductor including a channel region formed in a region overlapping with the gate. Current that flows between the drain and the source through the channel region can be controlled by controlling a potential of the gate. Here, since the source and the drain of the thin film transistor may interchange depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal.

Note that in FIG. 16D and FIG. 17A, a capacitor for performing bootstrap operation by bringing the node A into a floating state may be additionally provided. Furthermore, a capacitor having one electrode electrically connected to the node B may be additionally provided in order to hold a potential of the node B.

Figure 17B:
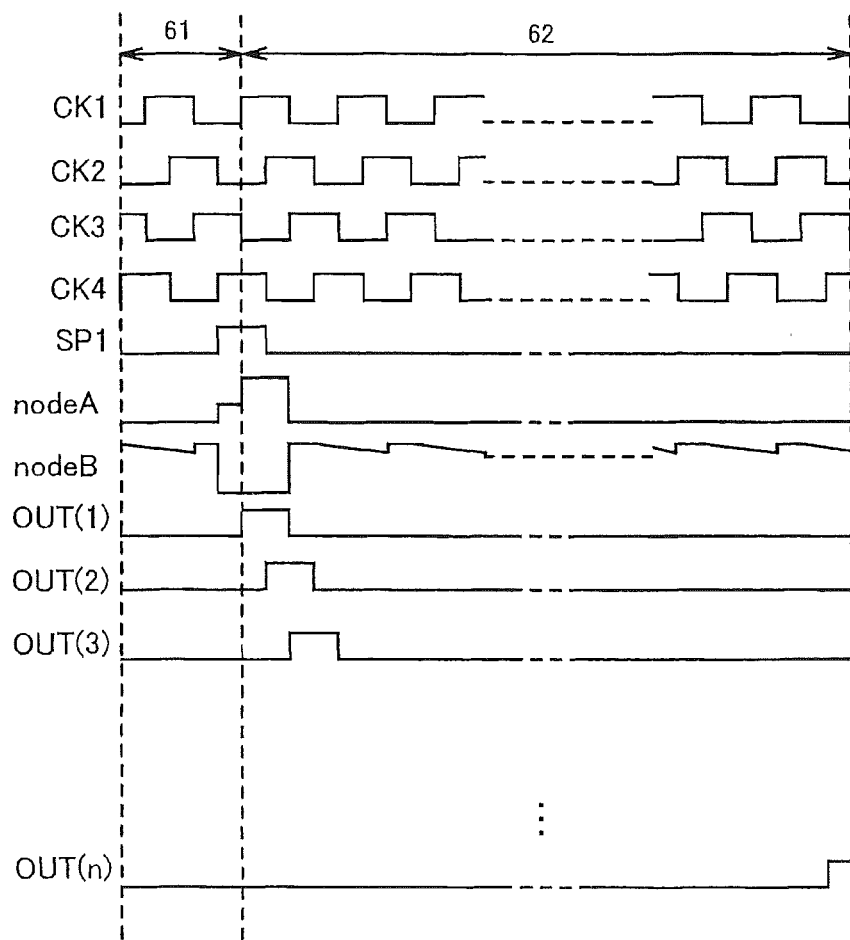

FIG. 17B is a timing chart of a shift register including a plurality of pulse output circuits illustrated in FIG. 17A. Note that when the shift register is included in a scan line driver circuit, a period 61 in FIG. 17B corresponds to a vertical retrace period and a period 62 corresponds to a gate selection period.

Note that by providing the ninth transistor 39 in which the second power supply potential VCC is applied to the gate as illustrated in FIG. 17A, the following advantages before and after bootstrap operation are provided.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the first terminal of the first transistor 31, that is, the terminal on the power supply line 51 side, comes to serve as a source of the first transistor 31. Consequently, in the first transistor 31, high bias voltage is applied and thus significant stress is applied between the gate and the source and between the gate and the drain, which might cause deterioration of the transistor. On the other hand, with the ninth transistor 39 in which the second power supply potential VCC is applied to the gate electrode, increase in the potential of the second terminal of the first transistor 31 can be prevented while the potential of the node A is raised by bootstrap operation. In other words, provision of the ninth transistor 39 can lower the level of negative bias voltage applied between the gate and the source of the first transistor 31. Thus, the circuit configuration in this embodiment can reduce negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected between the second terminal of the first transistor 31 and the gate of the third transistor 33. Note that when the shift register including a plurality of pulse output circuits in this embodiment is included in a signal line driver circuit having a larger number of stages than a scan line driver circuit, the ninth transistor 39 may be omitted, which is advantageous in that the number of transistors is reduced.

Note that an oxide semiconductor is used for semiconductor layers of the first to thirteenth transistors 31 to 43; thus, the off-current of the thin film transistors can be reduced, the on-current and field effect mobility can be increased, and the degree of deterioration of the transistors can be reduced. As a result, a malfunction in the circuit can be reduced. Moreover, the transistor including an oxide semiconductor less deteriorates by application of a high potential to a gate electrode as compared to a transistor including amorphous silicon. Consequently, even when the first power supply potential VDD is supplied to the power supply line which supplies the second power supply potential VCC, the shift register can operate similarly and the number of power supply lines between circuits can be reduced; thus, the size of the circuit can be reduced.

Note that the shift register will achieve similar effect even when the connection relation is changed so that a clock signal that is supplied to the gate electrodes (the lower gate electrode and the upper gate electrode) of the seventh transistor 37 from the third input terminal 23 and a clock signal that is supplied to the gate electrodes (the lower gate electrode and the upper gate electrode) of the eighth transistor 38 from the second input terminal 22 may be supplied from the second input terminal 22 and the third input terminal 23, respectively. In the shift register illustrated in FIG. 17A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B, which is caused by fall in potentials of the second input terminal 22 and the third input terminal 23, is caused twice by fall in potential of the gate electrode of the seventh transistor 37 and fall in potential of the gate electrode of the eighth transistor 38. On the other hand, in the case where a state of the seventh transistor 37 and the eighth transistor 38 is changed so that both the seventh transistor 37 and the eighth transistor 38 are on, then the seventh transistor 37 is on and the eighth transistor 38 is off, and then the seventh transistor 37 and the eighth transistor 38 are off; the fall in potential of the node B, which is caused by fall in potentials of the second input terminal 22 and the third input terminal 23, is caused only once by fall in potential of the gate electrode of the eighth transistor 38. Thus, the connection relation, that is, the clock signal CK3 is supplied from the third input terminal 23 to the gate electrodes (the lower gate electrode and the upper gate electrode) of the seventh transistor 37 and the clock signal CK2 is supplied from the second input terminal 22 to the gate electrodes (the lower gate electrode and the upper gate electrode) of the eighth transistor 38, is preferable. This is because the number of times of the change in the potential of the node B can be reduced, whereby the noise can be decreased.

In such a manner, an H-level signal is regularly supplied to the node B in a period during which the potentials of the first output terminal 26 and the second output terminal 27 are held at an L level; thus, a malfunction of the pulse output circuit can be suppressed.

Embodiment 9

By manufacturing thin film transistors and using the thin film transistors for a pixel portion and driver circuits, a semiconductor device having a display function (also referred to as a display device) can be manufactured. Moreover, some or all of the driver circuits which include the thin film transistors can be formed over a substrate where the pixel portion is formed, whereby a system-on-panel can be obtained.

The display device includes a display element. Examples of the display element include a liquid crystal element (also referred to as a liquid crystal display element) and a light-emitting element (also referred to as a light-emitting display element). The light-emitting element includes an element whose luminance is controlled by current or voltage in its category, and specifically includes an inorganic electroluminescent (EL) element, an organic EL element, and the like in its category. Furthermore, the display device may include a display medium whose contrast is changed by an electric effect, such as electronic ink.

In addition, the display device includes a panel in which the display element is sealed, and a module in which an IC and the like including a controller are mounted on the panel. Furthermore, an element substrate, which is one embodiment before the display element is completed in a manufacturing process of the display device, is provided with a means for supplying current to the display element in each of a plurality of pixels. Specifically, the element substrate may be in a state in which only a pixel electrode of the display element is formed, a state in which a conductive film to be a pixel electrode is formed but is not etched yet to form the pixel electrode, or any other states.

Note that a display device in this specification refers to an image display device, a display device, or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module having an integrated circuit (IC) that is directly mounted on a display element by a chip on glass (COG) method.

The appearance and a cross section of a liquid crystal display panel, which is one embodiment of a semiconductor device, will be described with reference to FIGS. 10A1, 10A2, and 10B. FIGS. 10A1 and 10A2 are plan views of panels in which thin film transistors 4010 and 4011 and a liquid crystal element 4013 are sealed between a first substrate 4001 and a second substrate 4006 with a sealant 4005. FIG. 10B is a cross-sectional view taken along M-N in FIGS. 10A1 and 10A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 10A1 illustrates an example in which the signal line driver circuit 4003 is mounted by a COG method. FIG. 10A2 illustrates an example in which the signal line driver circuit 4003 is mounted by a TAB method.

The pixel portion 4002 and the scan line driver circuit 4004 provided over the first substrate 4001 include a plurality of thin film transistors. FIG. 10B illustrates the thin film transistor 4010 included in the pixel portion 4002 and the thin film transistor 4011 included in the scan line driver circuit 4004, as an example. Insulating layers 4041*a*, 4041*b*, 4042*a*, 4042*b*, 4020, and 4021 are provided over the thin film transistors 4010 and 4011.

As the thin film transistors 4010 and 4011, any of the highly reliable thin film transistors including the oxide semiconductor layer, which are described in Embodiments 1, 2, 5, and 6, can be employed. As the thin film transistor 4011 used for the driver circuit, either of the thin film transistors 260 and 270 described in Embodiment 2 can be employed. As the thin film transistor 4010 used for a pixel, any of the thin film transistors 420, 448, 220, 280, and 290 described in Embodiments 1, 2, 5, and 6 can be employed. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the driver circuit. The conductive layer 4040 is provided in the position overlapping with the channel formation region of the oxide semiconductor layer, whereby the amount of change in threshold voltage of the thin film transistor 4011 before and after the BT test can be reduced. A potential of the conductive layer 4040 may be the same or different from that of a gate electrode layer of the thin film transistor 4011. The conductive layer 4040 can also function as a second gate electrode layer. Further, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is forming on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the electrode layers with the insulating layers 4032 and 4033 therebetween.

Note that a light-transmitting substrate can be used as the first substrate 4001 and the second substrate 4006; glass, ceramics, or plastics can be used. The plastic may be a fiberglass-reinforced plastics (FRP) plate, a polyvinyl fluoride (PVF) film, a polyester film, or an acrylic resin film.

Reference numeral 4035 is a columnar spacer which is obtained by selective etching of an insulating film and provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the thin film transistor 4010 is formed. The counter electrode layer 4031 and the common potential line can be electrically connected to each other through conductive particles provided between the pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is generated within a relatively narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small.

Note that this embodiment can also be applied to a transflective liquid crystal display device in addition to a transmissive liquid crystal display device.

Although a polarizing plate is provided on the outer surface of the substrate (on the viewer side) and a coloring layer (a color filter) and an electrode layer used for a display element are sequentially provided on the inner surface of the substrate in the example of the liquid crystal display device, the polarizing plate may be provided on the inner surface of the substrate. The stacked structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided in a portion other than the display portion.

In the thin film transistor 4011, the insulating layer 4041a which serves as a channel protective layer and the insulating layer 4041b which covers a peripheral portion (including a side surface) of the oxide semiconductor layer having are formed. In a similar manner, in the thin film transistor 4010, the insulating layer 4042a which serves as a channel protective layer and the insulating layer 4042b which covers a peripheral portion (including a side surface) of the oxide semiconductor layer are formed.

The insulating layers 4041b and 4042b which are oxide insulating layers covering the peripheral portion (including the side surface) of the oxide semiconductor layer increases the distance between the gate electrode layer and a wiring layer (such as a source wiring layer or a capacitor wiring layer) over or in the vicinity of the gate electrode layer, whereby parasitic capacitance can be reduced. The insulating layers 4041a, 4041b, 4042a, and 4042b may be formed using a material and a method which are similar to those of the oxide insulating layers 426a and 426b described in Embodiment 1. In addition, in order to reduce the surface roughness due to the thin film transistors, the thin film transistors are covered with the insulating layer 4021 serving as a planarization insulating film. Here, as the insulating layers 4041a, 4041b, 4042a, and 4042b, a silicon oxide film is formed by a sputtering method according to Embodiment 1.

The insulating layer 4020 is formed over the insulating layers 4041a, 4101b, 4042a, and 4042b. The insulating layer 4020 can be formed using a material and a method which are similar to those of the protective insulating layer 403 described in Embodiment 1. Here, a silicon nitride film is formed by an RF sputtering method as the insulating layer 4020.

The insulating layer 4021 is formed as the planarization insulating film. The insulating layer 4021 can be formed using a material and a method which are similar to those of the planarization insulating layer 404 described in Embodiment 1, and a heat-resistant organic material such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed using these materials.

In this embodiment, a plurality of thin film transistors in the pixel portion may be surrounded together by a nitride insulating film. For example, a structure may be employed in which nitride insulating films are used as the insulating layer 4020 and the gate insulating layer, and the insulating layer 4020 is in contact with the gate insulating layer at least in the periphery surrounding the pixel portion over the active matrix substrate, as illustrated in FIGS. 10A1, 10A2, and 10B. With such a structure, entry of moisture from the outside can be prevented. Moreover, entry of moisture from the outside can be prevented in the long term even after the device is completed as a semiconductor device, for example, as a display device; thus, the long-term reliability of the device can be improved.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. The organic group may include a fluoro group.

The formation method of the insulating layer 4021 is not limited to a particular method, and the following method can be used depending on the material: a sputtering method, an SOG method, a spin coating method, a dipping method, a spray coating method, a droplet discharge method (such as an inkjet method, screen printing, offset printing, or the like), or the like. Further, the planarization insulating layer 4021 can be formed with a doctor knife, a roll coater, a curtain coater, a knife coater, or the like. When the baking step of the insulating layer 4021 and the annealing of the semiconductor layer are combined, a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added.

Alternatively, a conductive composition including a conductive high molecule (also referred to as a conductive polymer) can be used for the pixel electrode layer 4030 and the counter electrode layer 4031. The pixel electrode formed using the conductive composition preferably has a sheet resistance of 10000 ohms per square or less and a light transmittance of 70% or more at a wavelength of 550 nm. Further, the resistivity of the conductive high molecule included in the conductive composition is preferably 0.1 Ω·cm or less.

As the conductive high molecule, a so-called π-electron conjugated conductive polymer can be used. Examples are polyaniline and a derivative thereof, polypyrrole and a derivative thereof, polythiophene and a derivative thereof, and a copolymer of two or more of these materials.

Further, a variety of signals and potentials are supplied to the signal line driver circuit 4003 which is separately formed and the scan line driver circuit 4004 or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 10A1, 10A2, and 10B illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 19:
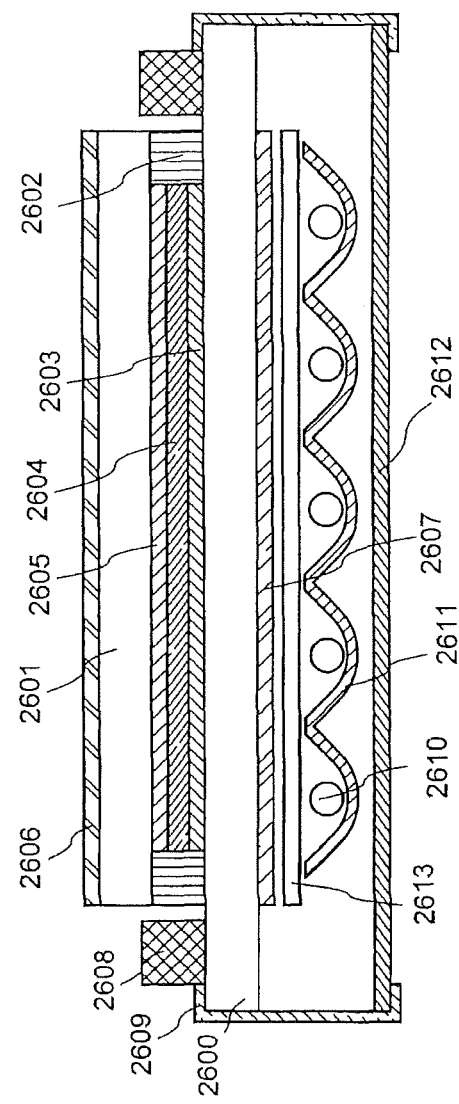
FIG. 19 illustrates a semiconductor device.

FIG. 19 illustrates an example of a liquid crystal display module which is formed as a semiconductor device using a TFT substrate 2600 manufactured according to the manufacturing method disclosed in this specification.

FIG. 19 illustrates an example of the liquid crystal display module, in which the TFT substrate 2600 and a counter substrate 2601 are bonded to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be employed.

Through the above process, a highly reliable liquid crystal display panel as a semiconductor device can be manufactured.

This embodiment can be implemented in appropriate combination with any of the structures described in the other embodiments.

Embodiment 10

An example of electronic paper will be described as an embodiment of a semiconductor device.

An embodiment of the present invention may be applied to electronic paper that drives electronic ink using an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute. Each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain a pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules is arranged as appropriate over an active matrix substrate so as to be interposed between two electrodes, an active matrix display device can be completed, and display can be performed by application of an electric field to the microcapsules. For example, the active matrix substrate obtained by the thin film transistors described in any of Embodiments 1, 2, 5, and 6 can be used.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, and a magnetophoretic material, or formed using a composite material of any of these.

Figure 18:
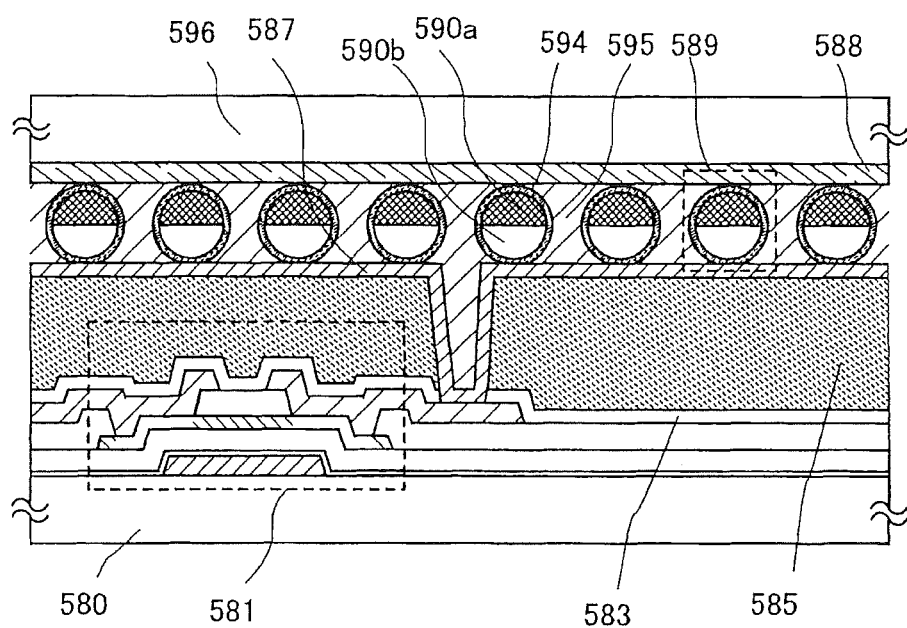
FIG. 18 illustrates a semiconductor device.

FIG. 18 illustrates active matrix electronic paper as an example of a semiconductor device. A thin film transistor 581 used for the semiconductor device can be manufactured in a manner similar to that of the thin film transistor described in Embodiment 1 and is a highly reliable thin film transistor including an oxide semiconductor layer. The thin film transistor described in any of Embodiments 2, 5, and 6 can also be used as the thin film transistor 581 of this embodiment.

The electronic paper in FIG. 18 is an example of a display device using a twisting ball display system. The twisting ball display system refers to a method in which spherical particles each colored in black or white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a bottom-gate thin film transistor and is covered with an insulating film 583 which is in contact with a semiconductor layer. A source or drain electrode layer of the thin film transistor 581 and a first electrode layer 587 are in contact with each other through an opening formed in an insulating layer 585 to be electrically connected. Between the first electrode layer 587 and a second electrode layer 588 formed on a substrate 596, spherical particles 589 each having a black region 590a, a white region 590b, and a cavity 594 around the regions which is filled with liquid are provided. A space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between a pair of substrates.

Instead of the twisting ball, an electrophoretic element can also be used. A microcapsule having a diameter of approximately 10 μm to 200 μm in which transparent liquid, positively-charged white microparticles, and negatively-charged black microparticles are encapsulated, is used. In the microcapsule which is provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element and is generally called electronic paper. The electrophoretic display element has higher reflectance than a liquid crystal display element, and thus an auxiliary light is unnecessary, power consumption is low, and a display portion can be recognized even in a dim place. In addition, even when power is not supplied to the display portion, an image which has been displayed once can be maintained. Accordingly, a displayed image can be stored even if a semiconductor device having a display function (also referred to simply as a display device or a semiconductor device provided with a display device) is distanced from an electric wave source.

Through this process, highly reliable electronic paper as a semiconductor device can be manufactured.

This embodiment can be implemented in appropriate combination with any of the structures described in the other embodiments.

Embodiment 11

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and current flows. Then, the carriers (electrons and holes) recombine, so that the light-emitting organic compound is excited. The light-emitting organic compound returns to a ground state from the excited state, thereby emitting light. Owing to such a mechanism, such a light-emitting element is referred to as a current-excitation light-emitting element.

The inorganic EL elements are classified according to their element structures into a dispersion type inorganic EL element and a thin-film inorganic EL element. A dispersion type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here with the use of an organic EL element as a light-emitting element.

Figure 12:
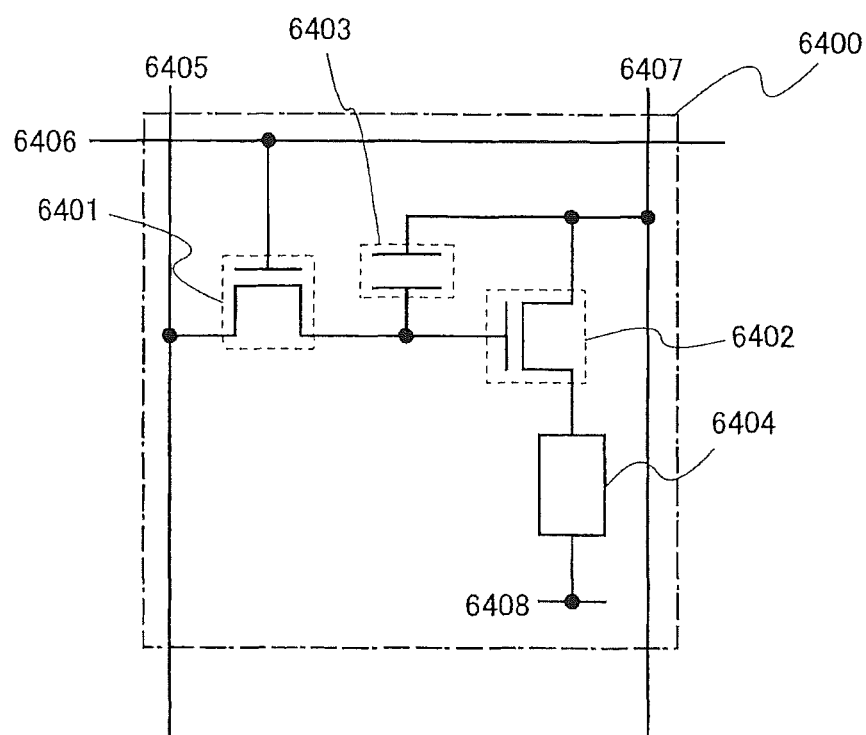
FIG. 12 illustrates a pixel equivalent circuit of a semiconductor device.

FIG. 12 illustrates an example of a pixel structure as an example of a semiconductor device which can be driven by a digital time grayscale method.

The structure and operation of a pixel which can be driven by a digital time grayscale method will be described. An example is described here in which one pixel includes two n-channel transistors each using an oxide semiconductor layer in a channel formation region.

A pixel 6400 includes a switching transistor 6401, a light-emitting element driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the light-emitting element driving transistor 6402. The gate of the light-emitting element driving transistor 6402 is connected to a power supply line 6407 through the capacitor 6403, a first electrode of the light-emitting element driving transistor 6402 is connected to the power supply line 6407, and a second electrode of the light-emitting element driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (a common electrode 6408) of the light-emitting element 6404 is set to a low power supply potential. Note that the low power supply potential is a potential satisfying the low power supply potential<a high power supply potential with the high power supply potential set to the power supply line 6407 as a reference. For example, GND, 0 V, or the like may be set as the low power supply potential. The difference between the high power supply potential and the low power supply potential is applied to the light-emitting element 6404 so that a current flows through the light-emitting element 6404, whereby the light-emitting element 6404 emits light. Thus, each potential is set so that the difference between the high power supply potential and the low power supply potential is greater than or equal to a forward threshold voltage.

When the gate capacitance of the light-emitting element driving transistor 6402 is used as a substitute for the capacitor 6403, the capacitor 6403 can be omitted. The gate capacitance of the light-emitting element driving transistor 6402 may be formed between a channel region and a gate electrode.

Here, in the case of using a voltage-input voltage driving method, a video signal is input to the gate of the light-emitting element driving transistor 6402 to make the light-emitting element driving transistor 6402 completely turn on or off. That is, the light-emitting element driving transistor 6402 operates in a linear region, and thus, voltage higher than the voltage of the power supply line 6407 is applied to the gate of the light-emitting element driving transistor 6402. Note that voltage greater than or equal to (power supply line voltage+$V_{th}$ of the light-emitting element driving transistor 6402) is applied to the signal line 6405.

In the case of using an analog grayscale method instead of the digital time grayscale method, the same pixel structure as in FIG. 12 can be employed by inputting signals in a different way.

In the case of using the analog grayscale method, voltage greater than or equal to (forward voltage of the light-emitting element 6404+$V_{th}$ of the light-emitting element driving transistor 6402) is applied to the gate of the light-emitting element driving transistor 6402. The forward voltage of the light-emitting element 6404 refers to voltage to obtain a desired luminance, and includes at least forward threshold voltage. By inputting a video signal which enables the light-emitting element driving transistor 6402 to operate in a saturation region, current can be supplied to the light-emitting element 6404. In order that the light-emitting element driving transistor 6402 can operate in the saturation region, the potential of the power supply line 6407 is higher than a gate potential of the light-emitting element driving transistor 6402. Since the video signal is an analog signal, current in accordance with the video signal flows in the light-emitting element 6404, and the analog grayscale method can be performed.

Note that the pixel structure is not limited to that illustrated in FIG. 12. For example, the pixel in FIG. 12 can further include a switch, a resistor, a capacitor, a transistor, a logic circuit, or the like.

Next, structures of the light-emitting element will be described with reference to FIGS. 13A to 13C. Here, a cross-sectional structure of a pixel will be described by taking an n-channel light-emitting element driving TFT as an example. Light-emitting element driving TFTs 7001, 7011, and 7021 used for semiconductor devices illustrated in FIGS. 13A to 13C can be manufactured in a manner similar to that of the thin film transistor provided in a pixel, which is described in Embodiment 1, and are highly reliable thin film transistors each including an oxide semiconductor layer. Alternatively, the thin film transistor provided in a pixel, which is described in any of Embodiments 2, 5, and 6, can be employed as the light-emitting element driving TFTs 7001, 7011, and 7021.

In order to extract light emitted from the light-emitting element, at least one of an anode and a cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel structure can be applied to a light-emitting element having any of these emission structures.

A light-emitting element having a top emission structure will be described with reference to FIG. 13A.

Figure 13A:
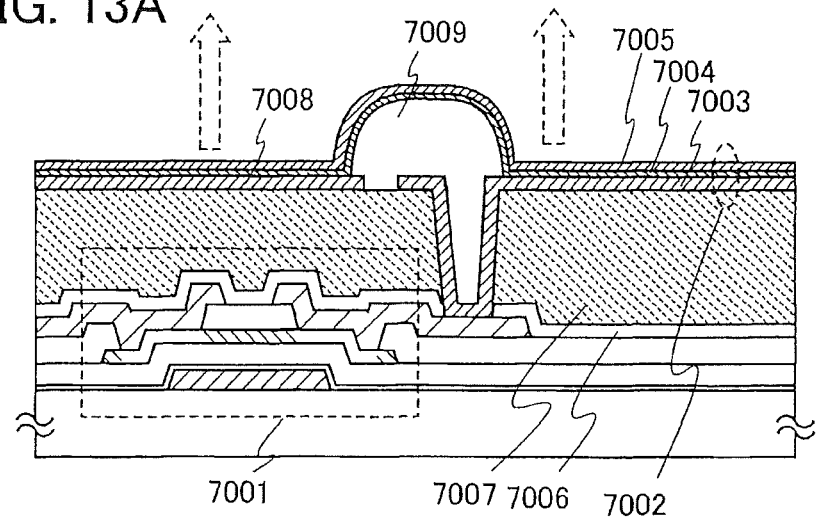
FIGS. 13A to 13C illustrate semiconductor devices.

FIG. 13A is a cross-sectional view of a pixel in the case where the light-emitting element driving TFT 7001 is of an n-type and light is emitted from a light-emitting element 7002 to an anode 7005 side. In FIG. 13A, a cathode 7003 of the light-emitting element 7002 is electrically connected to the light-emitting element driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed as a single layer or a plurality of layers stacked. When the light-emitting layer 7004 is formed using a plurality of layers, the light-emitting layer 7004 is formed by stacking an electron injection layer, an electron transport layer, a light-emitting layer, a hole transport layer, and a hole injection layer in this order over the cathode 7003. Note that not all of these layers need to be provided. The anode 7005 is formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Further, a partition wall 7009 is provided between the cathode 7003 and a cathode 7008 of an adjacent pixel so as to, cover an end portion of each of them. The partition wall 7009 is formed using an organic resin film of polyimide, acrylic, polyamide, epoxy, or the like, an inorganic insulating film, or organic polysiloxane. It is particularly preferable that the partition wall 7009 be forming using a photosensitive resin material and a side surface of the partition wall 7009 be formed as an inclined surface with continuous curvature. When the partition wall 7009 is formed using a photosensitive resin material, a step of forming a resist mask can be omitted.

The light-emitting element 7002 corresponds to a region where the light-emitting layer 7004 is sandwiched between the cathode 7003 and the anode 7005. In the case of the pixel illustrated in FIG. 13A, light is emitted from the light-emitting element 7002 to the anode 7005 side as indicated by an arrow.

Next, a light-emitting element having a bottom emission structure will be described with reference to FIG. 13B. FIG. 13B is a cross-sectional view of a pixel in the case where the light-emitting element driving TFT 7011 is of an n-type and light is emitted from a light-emitting element 7012 to a cathode 7013 side. In FIG. 13B, the cathode 7013 of the light-emitting element 7012 is formed over a light-transmitting conductive film 7017 which is electrically connected to the light-emitting element driving TFT 7011, and a light-emitting layer 7014 and an anode 7015 are stacked in this order over the cathode 7013. Note that a light-blocking film 7016 for reflecting or blocking light may be formed to cover the anode 7015 when the anode 7015 has a light-transmitting property. For the cathode 7013, various materials can be used, as in the case of FIG. 13A, as long as they are conductive materials having a low work function. Note that the cathode 7013 is formed to have a thickness that can transmit light (preferably, approximately 5 nm to 30 nm). For example, an aluminum film with a thickness of 20 nm can be used as the cathode 7013. Similarly to the case of FIG. 13A, the light-emitting layer 7014 may be formed using either a single layer or a plurality of layers stacked. The anode 7015 is not required to transmit light, but can be formed using a light-transmitting conductive material as in the case of FIG. 13A. As the light-blocking film 7016, a metal which reflects light can be used for example; however, it is not limited to a metal film. For example, a resin to which black pigments are added can also be used.

Further, a partition wall 7019 is provided between the conductive film 7017 and a conductive film 7018 of an adjacent pixel so as to cover an end portion of each of them. The partition wall 7019 is formed using an organic resin film of polyimide, acrylic, polyamide, epoxy, or the like, an inorganic insulating film, or organic polysiloxane. It is particularly preferable that the partition wall 7019 be formed using a photosensitive resin material and a side surface of the partition wall 7019 be formed as an inclined surface with continuous curvature. When the partition wall 7019 is formed using a photosensitive resin material, a step of forming a resist mask can be omitted.

The light-emitting element 7012 corresponds to a region where the light-emitting layer 7014 is sandwiched between the cathode 7013 and the anode 7015. In the case of the pixel illustrated in FIG. 13B, light is emitted from the light-emitting element 7012 to the cathode 7013 side as indicated by an arrow.

Next, a light-emitting element having a dual emission structure will be described with reference to FIG. 13C. In FIG. 13C, a cathode 7023 of a light-emitting element 7022 is formed over a light-transmitting conductive film 7027 which is electrically connected to the light-emitting element driving TFT 7021, and a light-emitting layer 7024 and an anode 7025 are stacked in this order over the cathode 7023. As in the case of FIG. 13A, the cathode 7023 can be formed using a variety of conductive materials as long as they have a low work function. Note that the cathode 7023 is formed to have a thickness that can transmit light. For example, an Al film with a thickness of 20 nm can be used as the cathode 7023. As in FIG. 13A, the light-emitting layer 7024 may be formed using either a single layer or a plurality of layers stacked. The anode 7025 can be formed using a light-transmitting conductive material as in the case of FIG. 13A.

Further, a partition wall 7029 is provided between the conductive film 7027 and a conductive film 7028 of an adjacent pixel so as to cover an end portion of each of them. The partition wall 7029 is formed using an organic resin film of polyimide, acrylic, polyamide, epoxy, or the like, an inorganic insulating film, or organic polysiloxane. It is particularly preferable that the partition wall 7029 be formed using a photosensitive resin material and a side surface of the partition wall 7029 be formed as an inclined surface with continuous curvature. When the partition wall 7029 is formed using a photosensitive resin material, a step of forming a resist mask can be omitted.

The light-emitting element 7022 corresponds to a region where the cathode 7023, the light-emitting layer 7024, and the anode 7025 overlap with one another. In the case of the pixel illustrated in FIG. 13C, light is emitted from the light-emitting element 7022 to both the anode 7025 side and the cathode 7023 side as indicated by arrows.

Although an organic EL element is described here as a light-emitting element, an inorganic EL element can also be provided as a light-emitting element.

Note that an example is described in which a thin film transistor (a light-emitting element driving TFT) which controls the driving of a light-emitting element is electrically connected to the light-emitting element; however, a structure may be employed in which a TFT for current control is connected between the light-emitting element driving TFT and the light-emitting element.

Figure 13B:
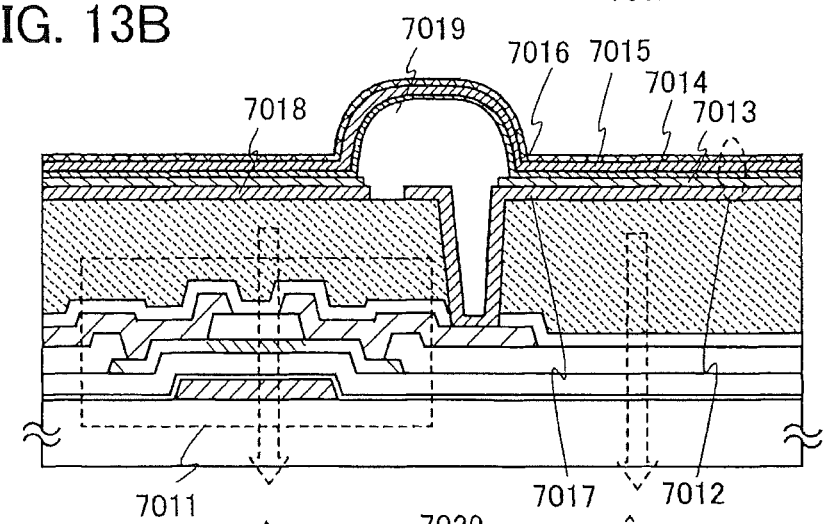
Figure 13C:
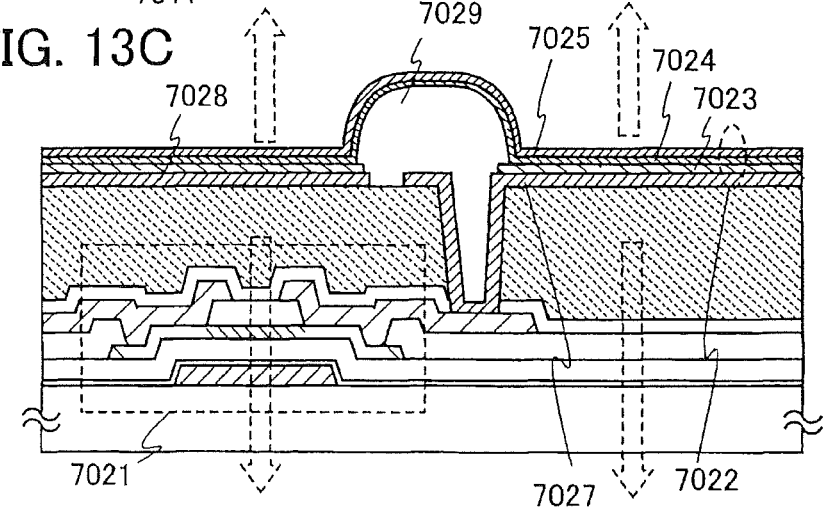

Note that the structure of the semiconductor device is not limited to those illustrated in FIGS. 13A to 13C and can be modified in various ways based on the spirit of techniques disclosed in this specification.

Figure 11A:
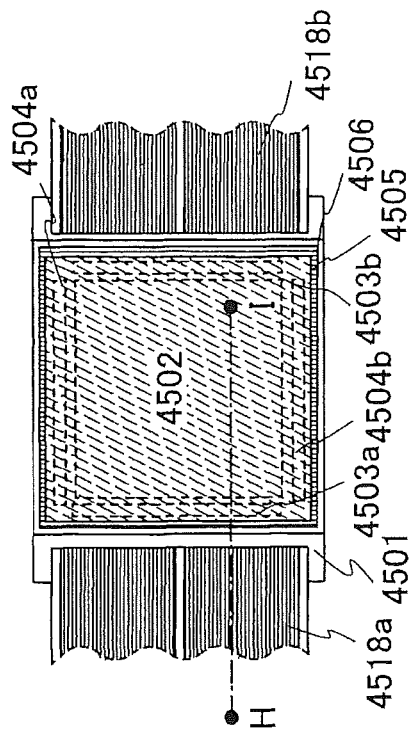
FIGS. 11A and 11B illustrate a semiconductor device.
Figure 11B:
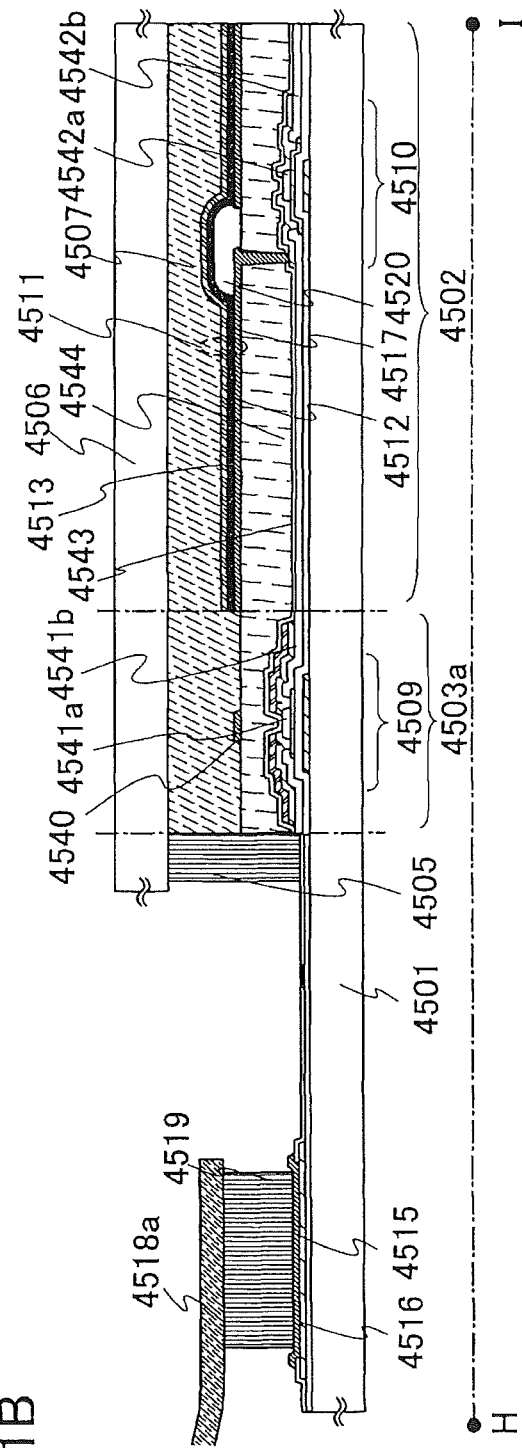

Next, the appearance and a cross section of a light-emitting display panel (also referred to as a light-emitting panel), which is one embodiment of the semiconductor device, will be described with reference to FIGS. 11A and 11B. FIG. 11A is a plan view of a panel in which a thin film transistor and a light-emitting element formed over a first substrate are sealed between the first substrate and a second substrate with a sealant. FIG. 11B is a cross-sectional view taken along line H-I of FIG. 11A.

A sealant 4505 is provided to surround a pixel portion 4502, signal line driver circuits 4503*a* and 4503*b*, and scan line driver circuits 4504*a* and 4504*b*, which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so as not to be exposed to the outside air.

The pixel portion 4502, the signal line driver circuits 4503*a* and 4503*b*, and the scan line driver circuits 4504*a* and 4504*b* formed over the first substrate 4501 each include a plurality of thin film transistors, and a thin film transistor 4510 included in the pixel portion 4502 and a thin film transistor 4509 included in the signal line driver circuit 4503*a* are illustrated as an example in FIG. 11B.

As the thin film transistors 4509 and 4510, the highly-reliable thin film transistor including an oxide semiconductor layer, which is described in any of Embodiments 1, 2, 5, and 6, can be employed. As the thin film transistor 4509 which is provided in a driver circuit, either of the thin film transistors 260 and 270 described in Embodiment 2 can be employed. As the thin film transistor 4510 which is provided in a pixel, any of the thin film transistors 420, 448, 220, 280, and 290 described in Embodiments 1, 2, 5, and 6 can be used. In this embodiment, the thin film transistors 4509 and 4510 are n-channel thin film transistors.

Over an insulating layer 4544, a conductive layer 4540 is provided in a position overlapping with a channel formation region of an oxide semiconductor layer of the thin film transistor 4509 used for a driver circuit. When the conductive layer 4540 is provided in the position overlapping with the channel formation region of the oxide semiconductor layer, the amount of change in threshold voltage of the thin film transistor 4509 between before and after a BT test can be reduced. In addition, the conductive layer 4540 may have a potential which is the same as or different from that of a gate electrode layer of the thin film transistor 4509, and can function as a second gate electrode layer. The potential of the conductive layer 4540 may be GND, 0 V, or floating state.

Over the thin film transistor 4509, an insulating layer 4541*a* which functions as a channel protective layer and an insulating layer 4541*b* which covers a peripheral portion (including a side surface) of the oxide semiconductor layer are formed. In the thin film transistor 4510, similarly, an insulating layer 4542*a* which functions as a channel protective layer and an insulating layer 4542*b* which covers a peripheral portion (including a side surface) of the oxide semiconductor layer are formed.

Each of the insulating layers 4541*b* and 4542*b* which cover the peripheral portions (including side surfaces) of the oxide semiconductor layers is provided to increase the distance between the gate electrode layer and a wiring layer (such as a source wiring layer or a capacitor wiring layer) formed over or in the periphery of the gate electrode layer, whereby parasitic capacitance can be reduced. The insulating layers 4541*a*, 4541*b*, 4542*a*, and 4542*b* may be formed using a material and a method similar to those of the oxide insulating layers 426*a* and 426*b* which are described in Embodiment 1. In addition, the thin film transistors are covered with an insulating layer 4543 which functions as a planarization insulating film so that surface roughness of the thin film transistors is reduced. Here, in accordance with Embodiment 1, a silicon oxide film is formed as the insulating layers 4541*a*, 4541*b*, 4542*a*, and 4542*b*.

Further, the insulating layer 4543 is formed over the insulating layers 4541*a*, 4541*b*, 4542*a*, and 4542*b*. The insulating layer 4543 may be formed using a material and a method similar to those of the protective insulating layer 403 which is described in Embodiment 1. Here, a silicon nitride film is formed as the insulating layer 4543 by an RF sputtering method.

Furthermore, the insulating layer 4544 is formed as a planarization insulating film. The insulating layer 4544 may be formed using a material and a method similar to those of the planarization insulating layer 404 which is described in Embodiment 1. Here, acrylic is used for the insulating layer 4544.

In this embodiment, a plurality of thin film transistors in the pixel portion may be surrounded together by a nitride insulating film. A structure may be employed in which nitride insulating films are used for the insulating layer 4543 and a gate insulating layer and a region where the insulating layer 4543 and the gate insulating layer are in contact with each other is provided so as to surround at least a periphery of the pixel portion of the active matrix substrate, as illustrated in FIGS. 11A and 11B. This manufacturing process can prevent entry of moisture from the outside. Moreover, entry of moisture from the outside can be prevented for a long time after the device is completed as a semiconductor device such as a display device, and thus long-term reliability can be improved.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that the structure of the light-emitting element 4511 is not limited to the stacked structure which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material to have an opening over the first electrode layer 4517 and a sidewall of the opening be formed as an inclined surface with continuous curvature.

The electroluminescent layer 4512 may be formed using either a single layer or a plurality of layers stacked.

A protective film may be formed over the second electrode layer 4513 and the partition wall 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

A connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal of the FPC 4518*a* through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen may be used as the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted, without limitation to the structure illustrated in FIGS. 11A and 11B.

Through the above process, a highly reliable light-emitting display device (a display panel) as a semiconductor device can be manufactured.

This embodiment can be implemented in appropriate combination with any of the structures described in Embodiments 1 to 4 and Embodiments 6 to 8.

Embodiment 12

A semiconductor device disclosed in this specification can be applied to electronic paper. Electronic paper can be used for electronic appliances of a variety of fields as long as they display data. For example, electronic paper can be applied to an electronic book reader (an e-book reader), a poster, an advertisement in a vehicle such as a train, or displays of various cards such as a credit card. Examples of the electronic appliances are illustrated in FIG. 20.

Figure 20:
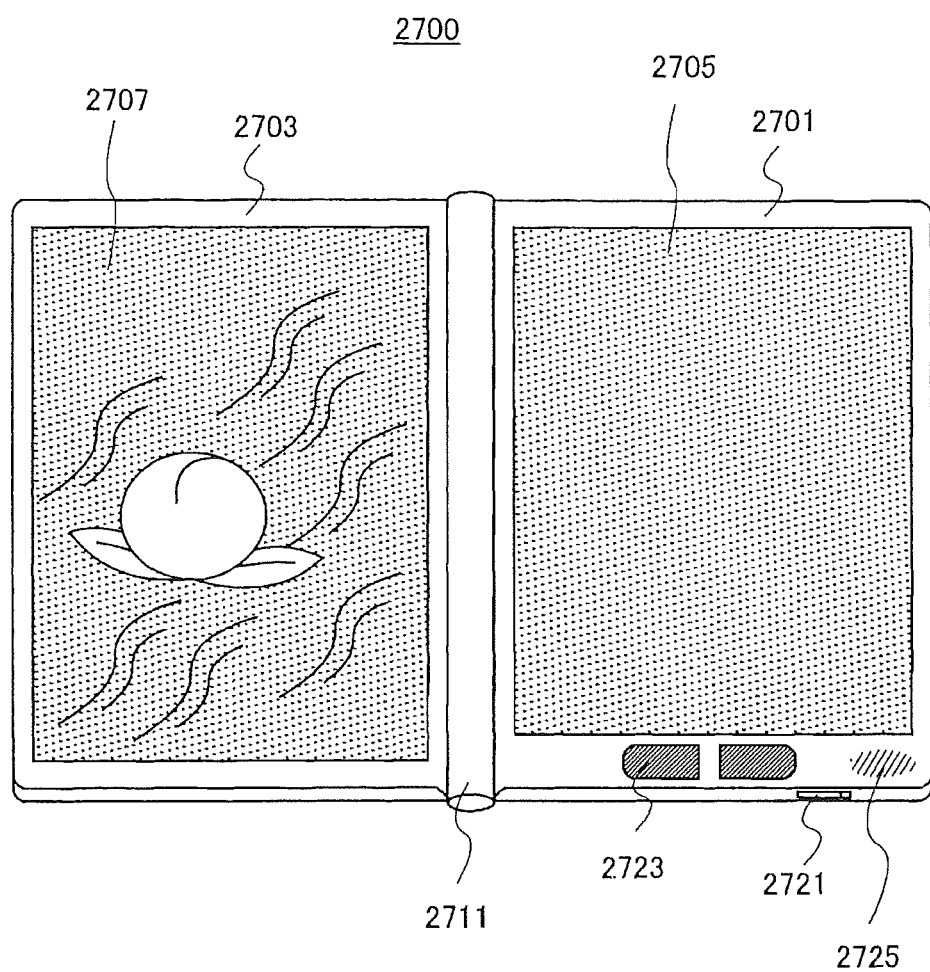
FIG. 20 is an external view illustrating an example of an electronic book reader.

FIG. 20 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where different images are displayed, for example, text can be displayed on a display portion on the right side (the display portion 2705 in FIG. 20) and graphics can be displayed on a display portion on the left side (the display portion 2707 in FIG. 20).

FIG. 20 illustrates an example in which the housing 2701 is provided with an operation portion and the like. For example, the housing 2701 is provided with a power switch 2721, an operation key 2723, a speaker 2725, and the like. With the operation key 2723, pages can be turned. A keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Embodiment 13

A semiconductor device disclosed in this specification can be applied as a variety of electronic appliances (including amusement machines). Examples of electronic appliances include television sets (also referred to as televisions or television receivers), monitor of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 21A:
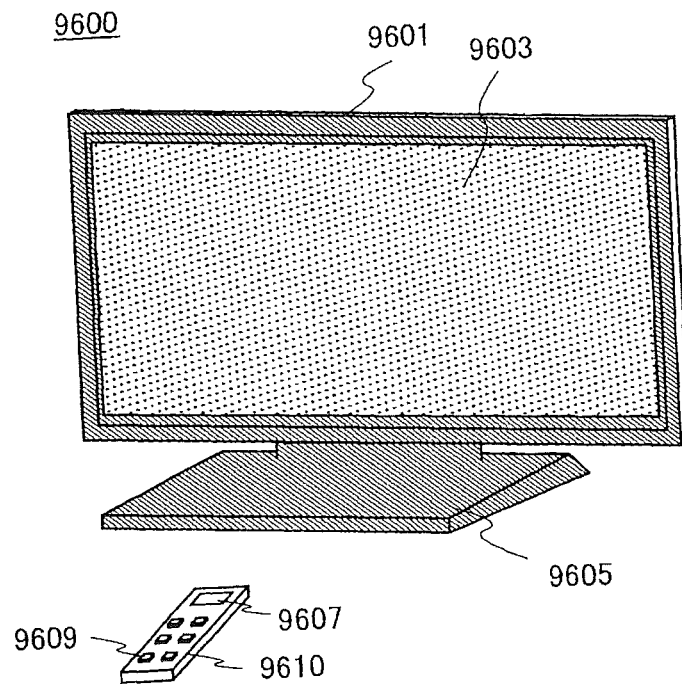
FIGS. 21A and 21B are external views respectively illustrating an example of a television set and an example of a digital photo frame.

FIG. 21A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 21B:
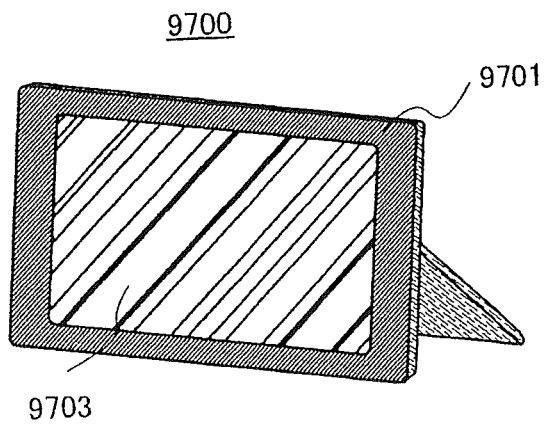

FIG. 21B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred and displayed on the display portion 9703.

The digital photo frame 9700 may have a configuration capable of wirelessly transmitting and receiving data. Through wireless communication, desired image data can be transferred to be displayed.

Figure 22A:
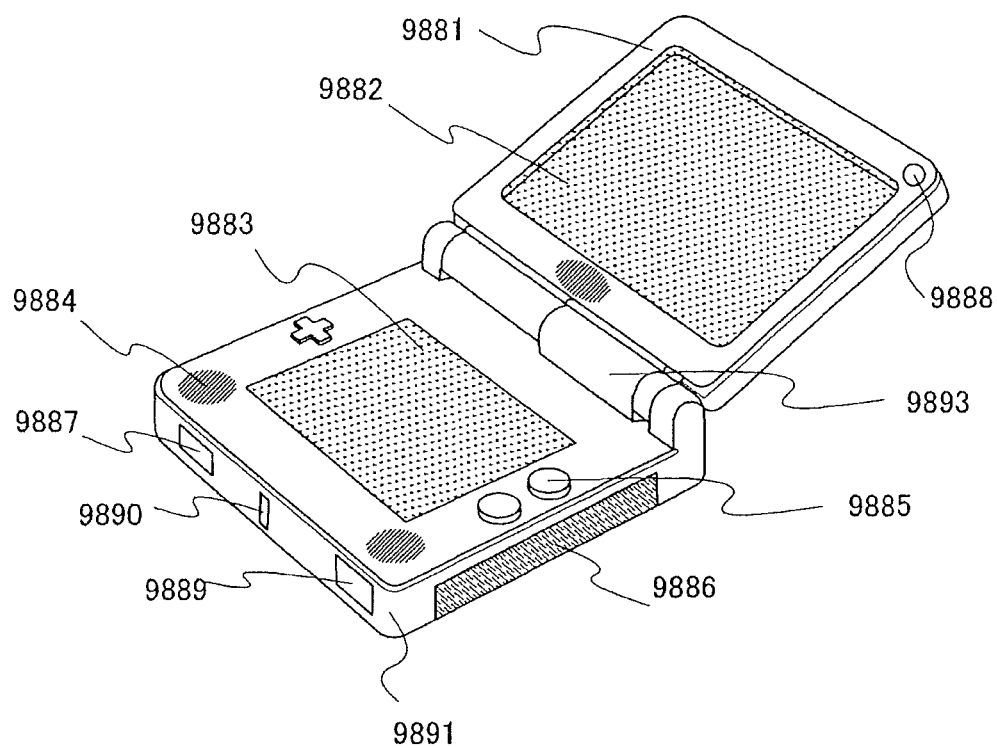
FIGS. 22A and 22B are external views each illustrating an example of an amusement machine.

FIG. 22A illustrates a portable amusement machine including two housings, a housing 9881 and a housing 9891. The housings 9881 and 9891 are connected with a joint portion 9893 so as to be opened and closed. A display portion 9882 and a display portion 9883 are incorporated in the housing 9881 and the housing 9891, respectively. In addition, the portable amusement machine illustrated in FIG. 22A includes a speaker portion 9884, a recording medium insertion portion 9886, an LED lamp 9890, input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9889), and the like. It is needless to say that the structure of the portable amusement machine is not limited to the above and other structures provided with at least a semiconductor device disclosed in this specification may be employed. The portable amusement machine can include other accessory equipment as appropriate. The portable amusement machine illustrated in FIG. 22A has a function of reading a program or data stored in a recording medium to display it on the display portion, and a function of sharing information with another portable amusement machine by wireless communication. The portable amusement machine illustrated in FIG. 22A can have various functions without limitation to the above.

Figure 22B:
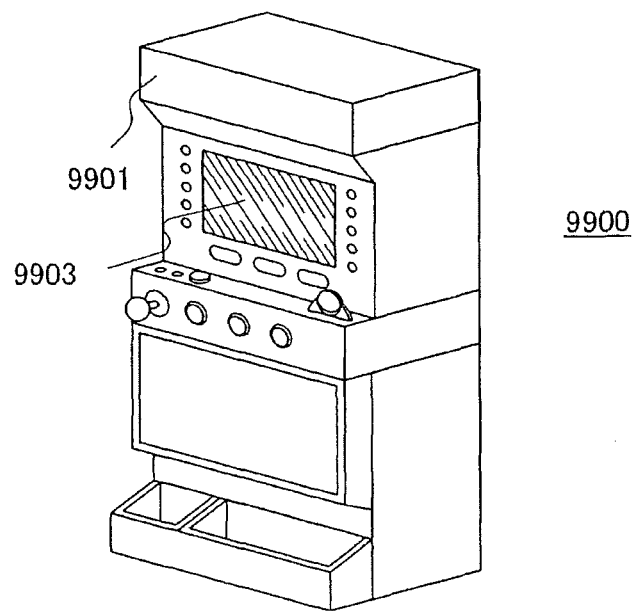

FIG. 22B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device disclosed in this specification may be employed. The slot machine 9900 can include other accessory equipment as appropriate.

Figure 23A:
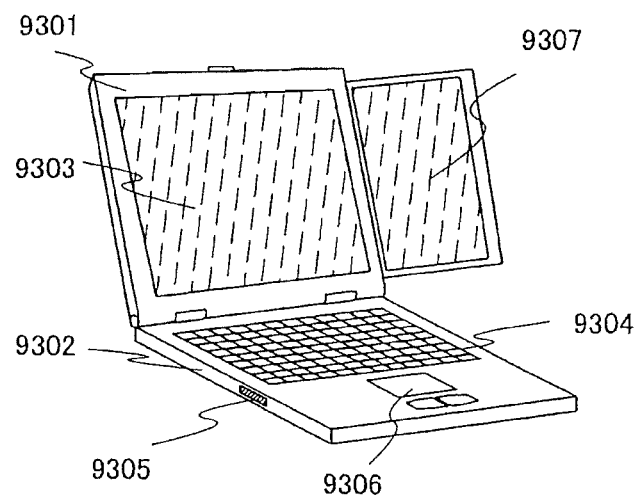
FIGS. 23A and 23B are external views respectively illustrating an example of a portable computer and an example of a cellular phone.

FIG. 23A is a perspective view illustrating an example of a portable computer.

In the portable computer of FIG. 23A, a top housing 9301 having a display portion 9303 and a bottom housing 9302 having a keyboard 9304 can overlap with each other by closing a hinge unit which connects the top housing 9301 and the bottom housing 9302. The portable computer of FIG. 23A is convenient for carrying, and in the case of using the keyboard for input, the hinge unit is opened and the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device such as a communication cable conformable to communication standards of a USB is inserted.

The top housing 9301 further includes a display portion 9307 which can be stored in the top housing 9301 by being slid therein. Thus, a large display screen can be realized. In addition, the user can adjust the orientation of a screen of the storable display portion 9307. When the storable display portion 9307 is a touch input panel, input can be performed by touching part of the storable display portion.

The display portion 9303 or the storable display portion 9307 is formed using an image display device of a liquid crystal display panel, a light-emitting display panel such as an organic light-emitting element or an inorganic light-emitting element, or the like.

In addition, the portable computer of FIG. 23A can be provided with a receiver and the like and can receive a television broadcast to display an image on the display portion. While the hinge unit which connects the top housing 9301 and the bottom housing 9302 is kept closed, the whole screen of the display portion 9307 is exposed by sliding the display portion 9307 out and the angle of the screen is adjusted; thus, the user can watch a television broadcast. In this case, the hinge unit is not opened and display is not performed on the display portion 9303. In addition, start up of only a circuit for displaying a television broadcast is performed. Therefore, power consumption can be minimized, which is useful for the portable computer whose battery capacity is limited.

Figure 23B:
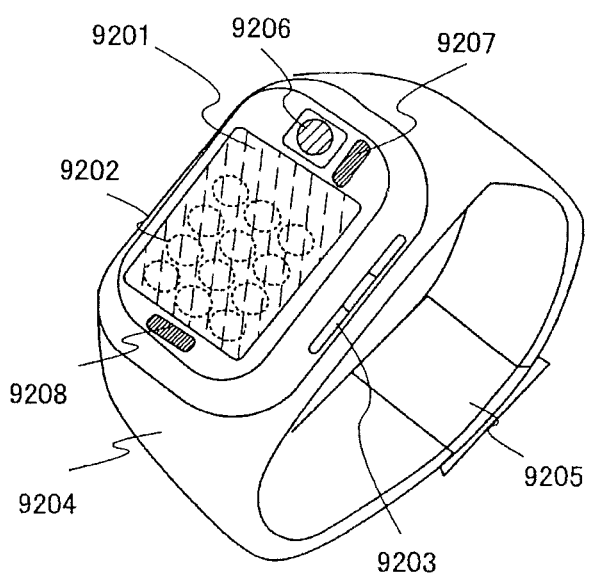

FIG. 23B is a perspective view illustrating an example of a cellular phone that the user can wear on the wrist like a wristwatch.

This cellular phone includes a main body which includes a communication device having at least a telephone function, and battery; a band portion 9204 which enables the main body to be worn on the wrist; an adjusting portion 9205 for adjusting the fixation of the band portion fixed for the wrist; a display portion 9201; a speaker 9207; and a microphone 9208.

In addition, the main body includes operation switches 9203. The operation switches 9203 serve, for example, as a switch for starting a program for the Internet when the switch is pushed, in addition to serving as a switch for turning on a power source, a switch for shifting a display, a switch for instructing to start taking images, or the like, and can be used so as to correspond to each function.

Input to this cellular phone is performed by touching the display portion 9201 with a finger, an input pen, or the like, operating the operation switches 9203, or inputting voice into the microphone 9208. Note that displayed buttons 9202 which are displayed on the display portion 9201 are illustrated in FIG. 23B. Input can be performed by touching the displayed buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The cellular phone illustrated in FIG. 23B can be provided with a receiver of a television broadcast and the like, and can display an image on the display portion 9201 by receiving a television broadcast. In addition, the cellular phone illustrated in FIG. 23B can be provided with a memory device and the like such as a memory, and can record a television broadcast in the memory. The cellular phone illustrated in FIG. 23B may have a function of collecting location information such as GPS.

An image display device of a liquid crystal display panel, a light-emitting display panel such as an organic light-emitting element or an inorganic light-emitting element, or the like is used as the display portion 9201. The cellular phone illustrated in FIG. 23B is compact and lightweight, and the battery capacity thereof is limited. Therefore, a panel which can be driven with low power consumption is preferably used as a display device for the display portion 9201.

Note that FIG. 23B illustrates the electronic apparatus which is worn on the wrist; however, this embodiment is not limited thereto as long as a portable shape is employed.

Embodiment 14

In this embodiment, an example of a display device including the thin film transistor described in any of Embodiments 1, 2, 5, and 6 will be described as an embodiment of a semiconductor device with reference to FIG. 24, FIG. 25, FIG. 26, FIG. 27, FIG. 28, FIG. 29, FIG. 30, FIG. 31, FIG. 32, FIG. 33, FIG. 34, and FIG. 35. In this embodiment, an example of a liquid crystal display device including a liquid crystal element as a display element will be described with reference to FIG. 24, FIG. 25, FIG. 26, FIG. 27, FIG. 28, FIG. 29, FIG. 30, FIG. 31, FIG. 32, FIG. 33, FIG. 34, and FIG. 35. As TFTs 628 and 629 used for the liquid crystal display devices in FIG. 24, FIG. 25, FIG. 26, FIG. 27, FIG. 28, FIG. 29, FIG. 30, FIG. 31, FIG. 32, FIG. 33, FIG. 34, and FIG. 35, the thin film transistor described in any of Embodiments 1, 2, 5, and 6 can be employed. The TFTs 628 and 629 are thin film transistors having high electric characteristics and reliability, which can be manufactured in a process similar to that described in any of Embodiments 1, 2, 5, and 6. The TFT 628 and the TFT 629 include a channel protective layer 608 and a channel protective layer 611, respectively, and are each an inverted staggered thin film transistor including a semiconductor film as a channel formation region.

First, a vertical alignment (VA) liquid crystal display device is described. The VA is a method of controlling alignment of liquid crystal molecules of a liquid crystal display panel. In the VA liquid crystal display device, liquid crystal molecules are aligned in a vertical direction with respect to a panel surface when no voltage is applied. In this embodiment, in particular, a pixel is divided into several regions (subpixels), and molecules are aligned in different directions in their respective regions. This is referred to as multi-domain or multi-domain design. A liquid crystal display device of multi-domain design is described below.

Figure 24:
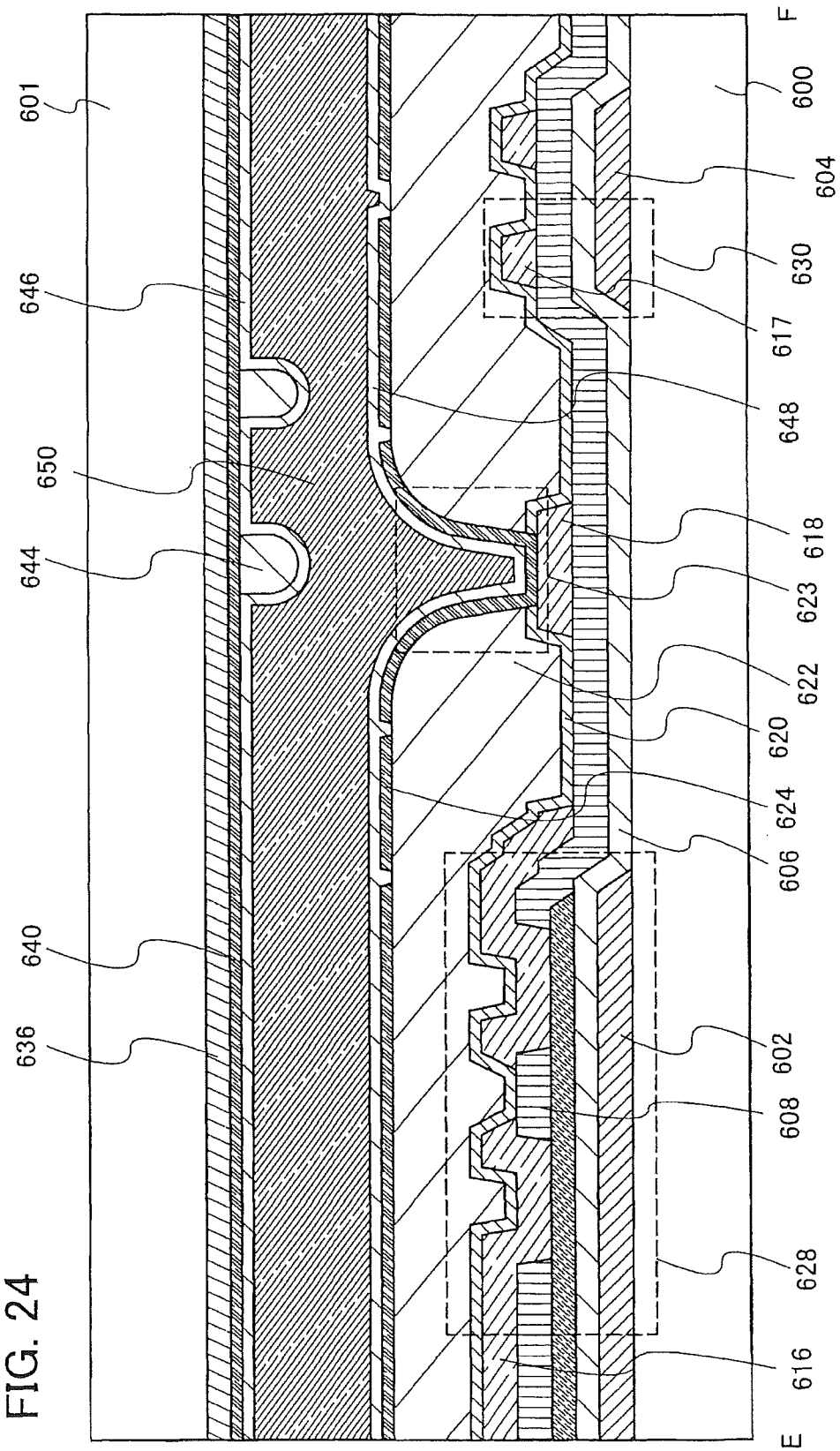
FIG. 24 illustrates a semiconductor device.
Figure 25:
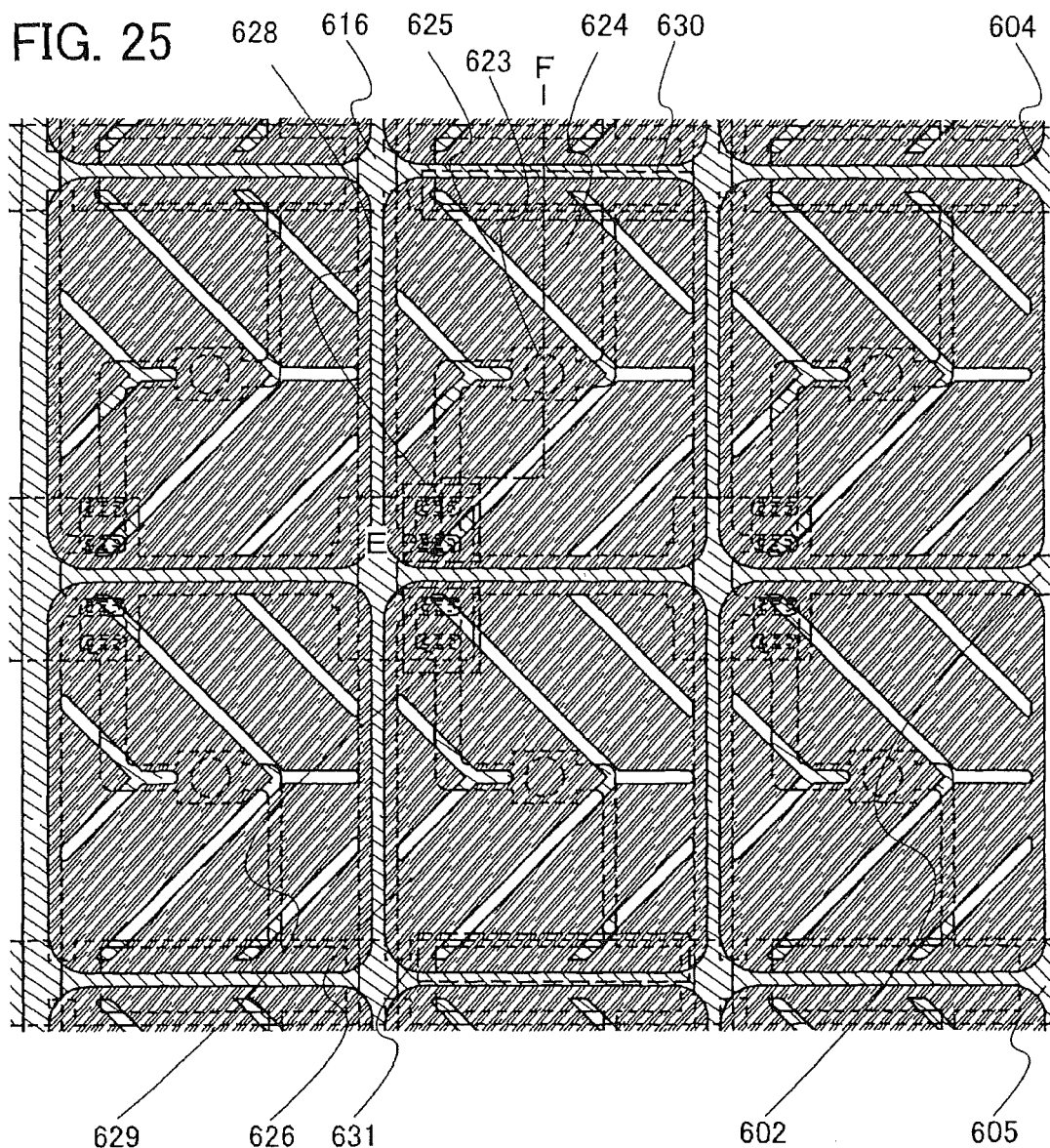
FIG. 25 illustrates a semiconductor device.
Figure 26:
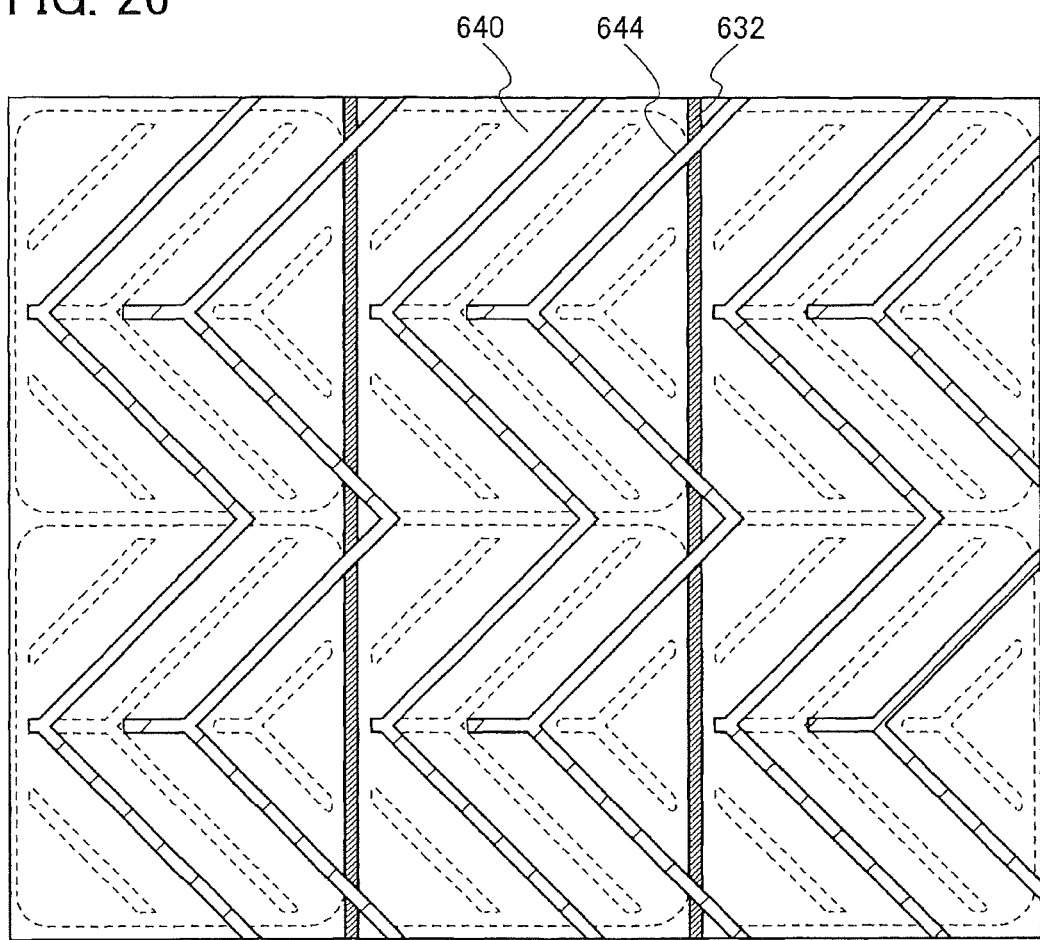
FIG. 26 illustrates a semiconductor device.

FIG. 25 and FIG. 26 illustrate a pixel electrode and a counter electrode, respectively. FIG. 25 is a plan view on a substrate side over which the pixel electrode is formed. FIG. 24 illustrates a cross-sectional structure taken along line E-F of FIG. 25. FIG. 26 is a plan view on a substrate side on which the counter electrode is formed. Hereinafter, description is made with reference to these drawings.

In FIG. 24, a substrate 600 over which a TFT 628, a pixel electrode layer 624 connected to the TFT 628, and a storage capacitor portion 630 are formed and a counter substrate 601 on which a counter electrode layer 640 and the like are formed overlap with each other, and liquid crystal is injected between the substrates.

The counter substrate 601 is provided with a coloring film 636 and the counter electrode layer 640, and projections 644 are formed on the counter electrode layer 640. This structure makes the height of the projections 644 for controlling alignment of liquid crystal different from that of a spacer. An alignment film 648 is formed over the pixel electrode layer 624. Similarly, the counter electrode layer 640 and the projections 644 are provided with an alignment film 646. A liquid crystal layer 650 is formed between the substrate 600 and the counter substrate 601.

As the spacer, a columnar spacer may be formed or a bead spacer may be dispersed. When the spacer has a light-transmitting property, it may be formed over the pixel electrode layer 624 over the substrate 600.

The TFT 628, the pixel electrode layer 624 connected to the TFT 628, and the storage capacitor portion 630 are formed over the substrate 600. The pixel electrode layer 624 is connected to a wiring 618 in a contact hole 623 that is formed in an insulating film 620 covering the TFT 628, the wiring 616, and the storage capacitor portion 630, and a third insulating film 622 covering the insulating film 620. The thin film transistor described in any of Embodiments 1, 2, 5, and 6 can be used as appropriate as the TFT 628. Further, the storage capacitor portion 630 includes a first capacitor wiring 604 that is formed at the same time as a gate wiring 602 of the TFT 628; a gate insulating film 606; and a second capacitor wiring 617 that is formed at the same time as the wirings 616 and 618.

The pixel electrode layer 624, the liquid crystal layer 650, and the counter electrode layer 640 overlap with each other, so that a liquid crystal element is formed.

FIG. 25 illustrates a plan structure over the substrate 600. The pixel electrode layer 624 is formed using a material described in Embodiment 1. Slits 625 are formed in the pixel electrode layer 624. The slits 625 are forming to control alignment of the liquid crystal.

A TFT 629, a pixel electrode layer 626 connected to the TFT 629, and a storage capacitor portion 631, which are illustrated in FIG. 25, can be formed in a similar manner to that of the TFT 628, the pixel electrode layer 624, and the storage capacitor portion 630, respectively. Both of the TFTs 628 and 629 are connected to the wiring 616. A pixel of this liquid crystal display panel includes the pixel electrode layers 624 and 626. The pixel electrode layers 624 and 626 are subpixels.

FIG. 26 illustrates a plan structure on the counter substrate side. The counter electrode layer 640 is formed over the light-blocking film 632. The counter electrode layer 640 is preferably formed using a material similar to that of the pixel electrode layer 624. The projections 644 that controls alignment of liquid crystal is formed over the counter electrode layer 640. Note that in FIG. 26, the dashed line indicates the pixel electrode layers 624 and 626 which are formed over the substrate 600, and the counter electrode layer 640 is provided to overlap with the pixel electrode layers 624 and 626.

Figure 27:
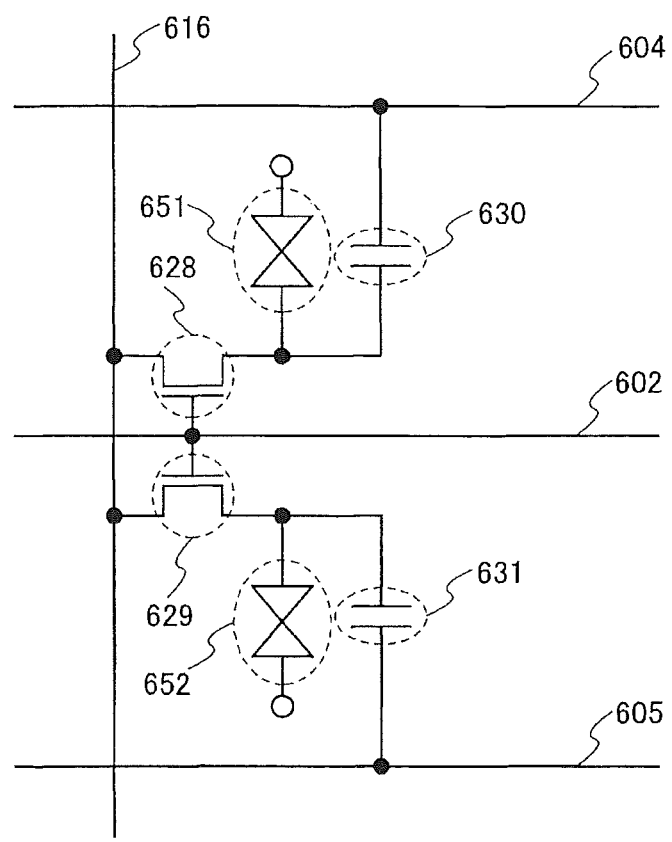
FIG. 27 illustrates a semiconductor device.

FIG. 27 illustrates an equivalent circuit of this pixel structure. Both of the TFTs 628 and 629 are connected to the gate wiring 602 and the wiring 616. In this case, by making the potential of the capacitor wiring 604 different from that of a capacitor wiring 605, operation of a liquid crystal element 651 can be different from that of a liquid crystal element 652. That is, potentials of the capacitor wirings 604 and 605 are controlled individually, whereby alignment of liquid crystal is precisely controlled and the viewing angle is increased.

When voltage is applied to the pixel electrode layer 624 provided with the slits 625, a distorted electric field (an oblique electric field) is generated in the vicinity of the slits 625. The slits 625 and the projections 644 on the counter substrate 601 side are disposed so as not to overlap with each other, whereby the oblique electric field is effectively generated to control alignment of the liquid crystal, and thus the direction in which liquid crystal is aligned is different depending on the location. That is, the viewing angle of a liquid crystal display panel is increased by employing multi-domain.

Next, a VA liquid crystal display device different from the above is described with reference to FIG. 28, FIG. 29, FIG. 30, and FIG. 31.

Figure 28:
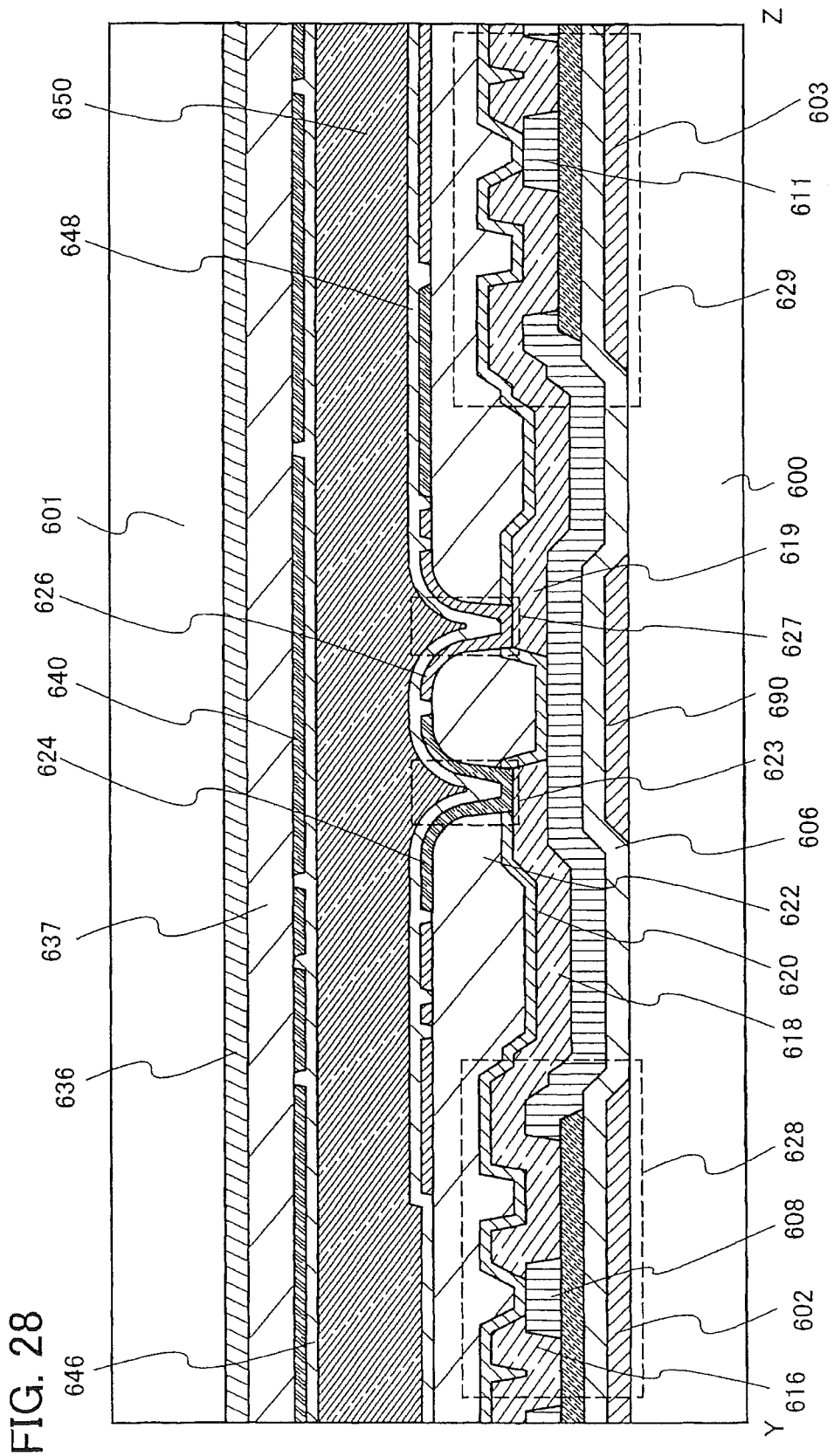
FIG. 28 illustrates a semiconductor device.
Figure 29:
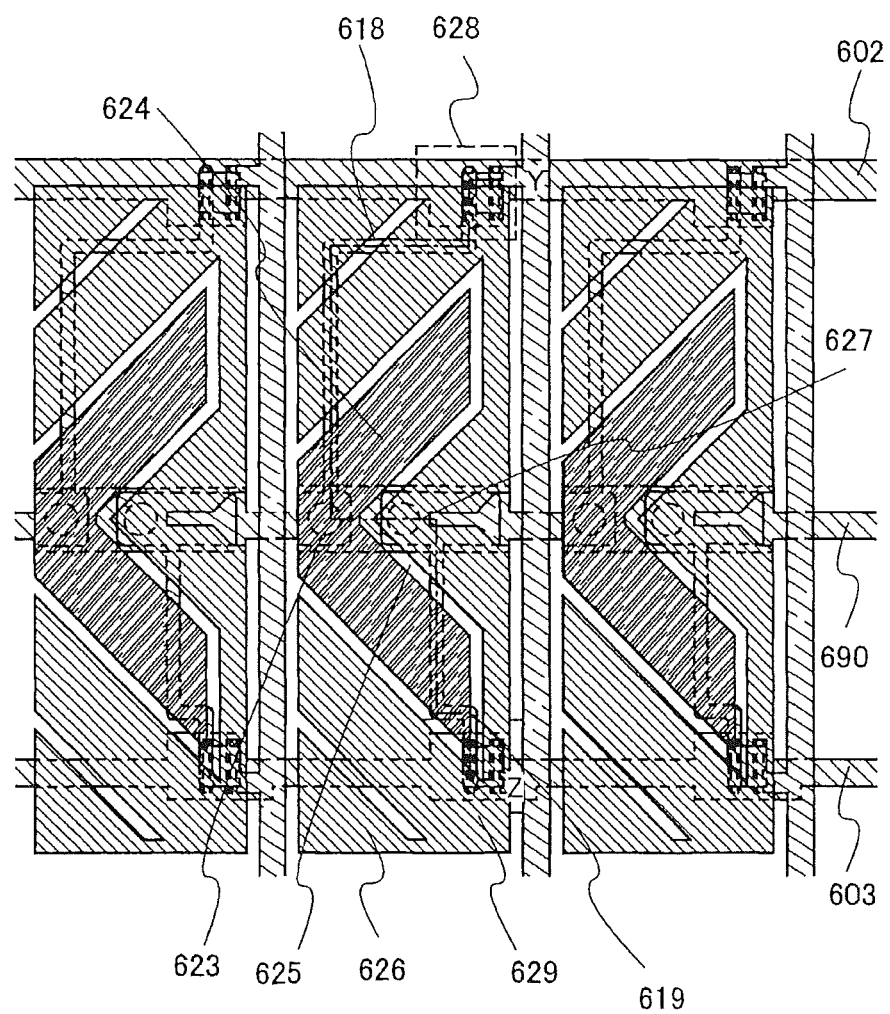
FIG. 29 illustrates a semiconductor device.

FIG. 28 and FIG. 29 illustrate a pixel structure of a VA liquid crystal display panel. FIG. 29 is a plan view over the substrate 600. FIG. 28 illustrates a cross-sectional structure taken along line Y-Z in FIG. 29. Hereinafter, description is made with reference to both of the drawings.

In this pixel structure, one pixel has a plurality of pixel electrodes, and a TFT is connected to each of the pixel electrodes. Each TFT is driven with a gate signal different from each other. Specifically, in the pixel of multi-domain design, a signal applied to each pixel electrode is controlled independently.

The pixel electrode layer 624 is connected to the TFT 628 in the contact hole 623 which is formed in the insulating film 620, an insulating film 621, and the insulating film 622 through the wiring 618. In addition, the pixel electrode layer 626 is connected to the TFT 629 in a contact hole 627 which is forming in the insulating film 620, the insulating film 621, and the insulating film 622 through a wiring 619. The gate wiring 602 of the TFT 628 is separated from a gate wiring 603 of the TFT 629 so that different gate signals can be supplied. On the other hand, the wiring 616 functioning as a data line is shared by the TFTs 628 and 629. The thin film transistors described in any of Embodiments 1, 2, 5, and 6 can be used as appropriate as the TFTs 628 and 629. Note that the gate insulating film 606 is formed over the gate wiring 602, the gate wiring 603, and a capacitor wiring 690.

Figure 31:
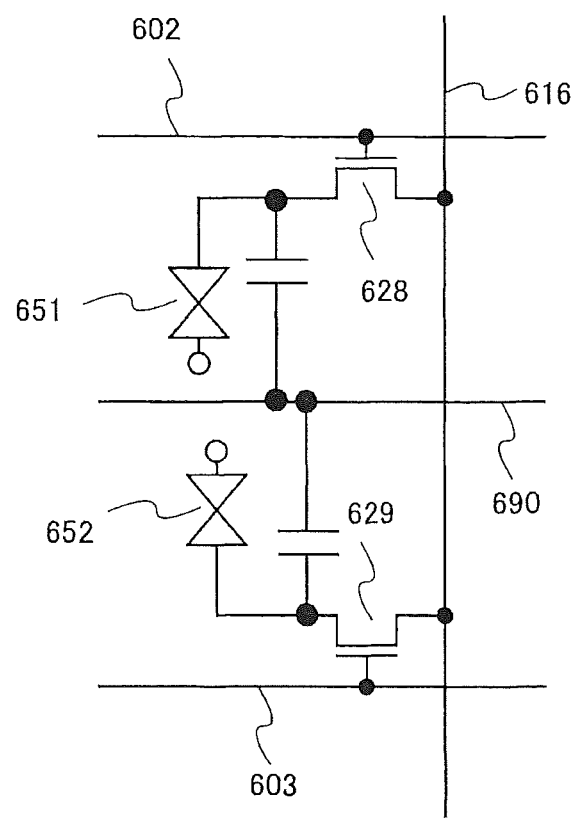
FIG. 31 illustrates a semiconductor device.

The shape of the pixel electrode layer 624 is different from that of the pixel electrode layer 626, and the pixel electrode layers are separated by slits 625. The pixel electrode layer 626 surrounds the pixel electrode layer 624, which has a V-shape. The TFTs 628 and 629 make the timing of applying voltage to the pixel electrode layers 624 and 626 different from each other, thereby controlling alignment of liquid crystal. FIG. 31 illustrates an equivalent circuit of this pixel structure. The TFT 628 is connected to the gate wiring 602, and the TFT 629 is connected to the gate wiring 603. Further, the TFTs 628 and 629 are both connected to the wiring 616. If different gate signals are supplied to the gate wirings 602 and 603, operation timing of the TFTs 628 and 629 can be different. In other words, when operation of the TFTs 628 and 629 is individually controlled, alignment of liquid crystal in the liquid crystal elements 651 and 652 can be precisely controlled; accordingly, viewing angle can be increased.

Figure 30:
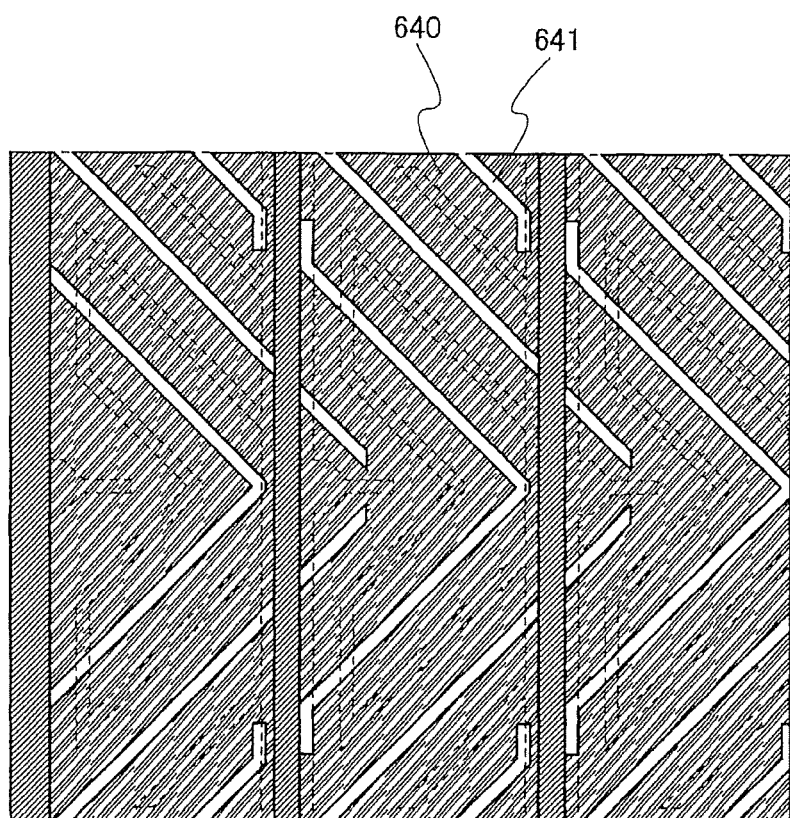
FIG. 30 illustrates a semiconductor device.

The counter substrate 601 is provided with the coloring film 636 and the counter electrode layer 640. In addition, a planarization film 637 is formed between the coloring film 636 and the counter electrode layer 640, thereby preventing alignment disorder of liquid crystal. FIG. 30 illustrates a plan structure of the counter substrate side. The counter electrode layer 640 is shared by plural pixels, and slits 641 are formed in the counter electrode layer 640. The slits 641 and the slits 625 on the pixel electrode layers 624 and 626 side are disposed so as not to overlap with each other, whereby an oblique electric field is effectively generated and alignment of liquid crystal is controlled. Accordingly, the direction in which liquid crystal is aligned can be different depending on the location, and thus the viewing angle is increased. Note that in FIG. 30, the dashed line indicates the pixel electrode layers 624 and 626 which are formed over the substrate 600, and the counter electrode layer 640 is provided to overlap with the pixel electrode layers 624 and 626.

The alignment film 648 is formed over the pixel electrode layers 624 and 626, and the alignment film 646 is formed on the counter electrode layer in a similar manner. The liquid crystal layer 650 is formed between the substrate 600 and the counter substrate 601. Further, the pixel electrode layer 624, the liquid crystal layer 650, and the counter electrode layer 640 overlap with each other, so that a first liquid crystal element is formed. The pixel electrode layer 626, the liquid crystal layer 650, and the counter electrode layer 640 overlap with each other, so that a second liquid crystal element is formed. Furthermore, the pixel structure of the display panel illustrated in FIG. 28, FIG. 29, FIG. 30, and FIG. 31 is a multi-domain structure in which the first liquid crystal element and the second liquid crystal element are provided in one pixel.

Next, a liquid crystal display device of a horizontal electric field mode is described. In a horizontal electric field mode, an electric field is applied in a horizontal direction with respect to liquid crystal molecules in a cell, whereby liquid crystal is driven to express gray scales. In accordance with this method, the viewing angle can be expanded to approximately 180°. Hereinafter, a liquid crystal display device of the horizontal electric field mode is described.

Figure 32:
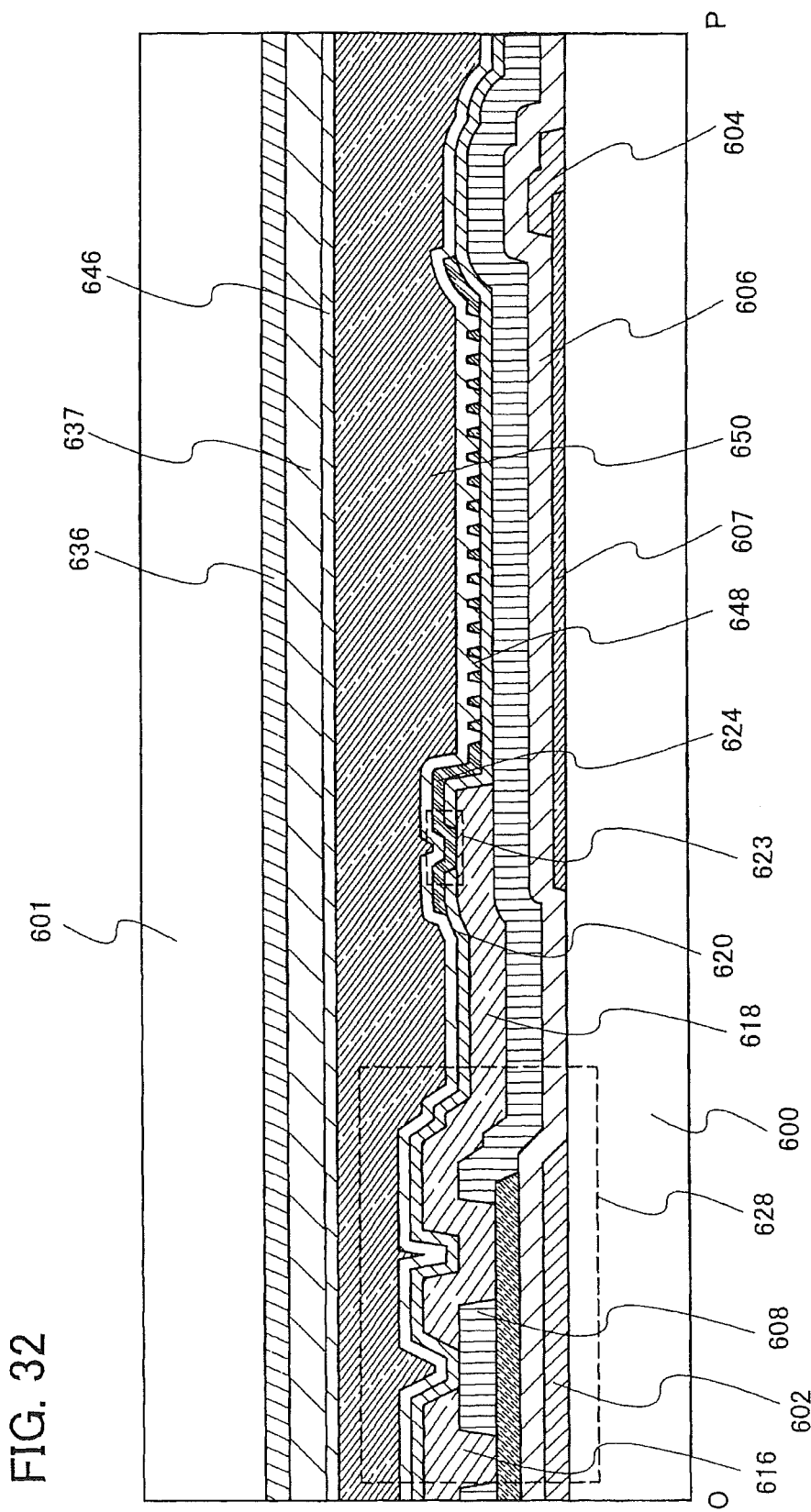
FIG. 32 illustrates a semiconductor device.

In FIG. 32, the counter substrate 601 is superposed on the substrate 600 over which an electrode layer 607, the TFT 628, and the pixel electrode layer 624 connected to the TFT 628 are formed, and liquid crystal is injected therebetween. The counter substrate 601 is provided with the coloring film 636, the planarization film 637, and the like. Note that a counter electrode layer is not provided on the counter substrate 601 side. The liquid crystal layer 650 is formed between the substrate 600 and the counter substrate 601 with the alignment film 646 and the alignment film 648 interposed therebetween.

The electrode layer 607, the capacitor wiring 604 connected to the electrode layer 607, and the TFT 628 are formed over the substrate 600. The capacitor wiring 604 can be formed at the same time as the gate wiring 602 of the TFT 628. The thin film transistor described in any of Embodiments 1 to 5 can be employed as the TFT 628. The electrode layer 607 can be formed using a material similar to that of the pixel electrode layer 427 described in Embodiment 1. The electrode layer 607 is formed in a shape which is compartmentalized roughly in a pixel shape. The gate insulating film 606 is formed over the electrode layer 607 and the capacitor wiring 604.

The wirings 616 and 618 of the TFT 628 are formed over the gate insulating film 606. The wiring 616 is a data line through which a video signal travels, extends in one direction in the liquid crystal display panel, is connected to a source or drain region of the TFT 628, and serves as one of source and drain electrodes. The wiring 618 serves as the other of the source and drain electrodes and is connected to the pixel electrode layer 624.

The second insulating film 620 is formed over the wirings 616 and 618. Further, the pixel electrode layer 624 that is connected to the wiring 618 through the contact hole 623 formed in the insulating film 620 is formed over the insulating film 620. The pixel electrode layer 624 is formed using a material similar to that of the pixel electrode layer described in Embodiment 1.

In this manner, the TFT 628 and the pixel electrode layer 624 connected thereto are formed over the substrate 600. Storage capacitance is formed between the electrode layer 607 and the pixel electrode layer 624.

Figure 33:
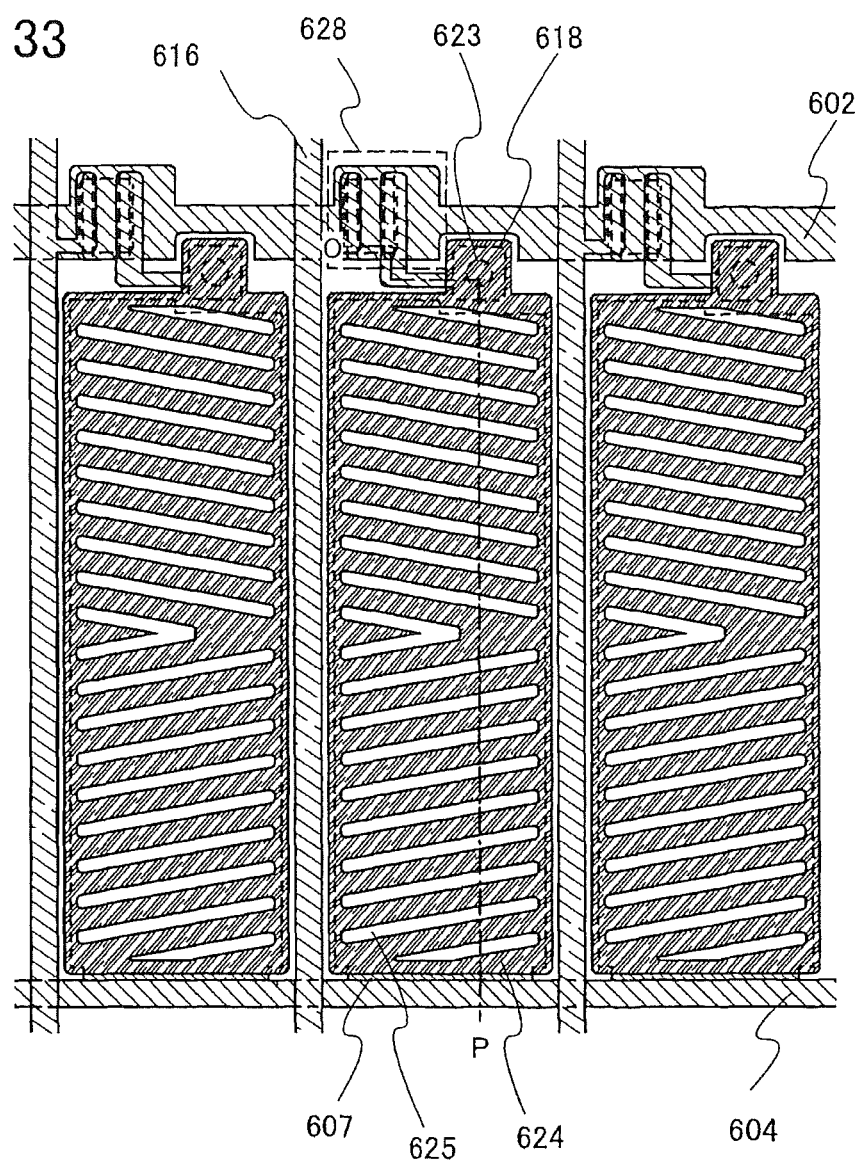
FIG. 33 illustrates a semiconductor device.

FIG. 33 is a plan view illustrating a structure of the pixel electrode layer. A cross-sectional structure taken along line O-P of FIG. 33 is illustrated in FIG. 32. The pixel electrode layer 624 is provided with the slits 625. The slits 625 are provided to control alignment of liquid crystal. In this case, an electric field is generated between the electrode layer 607 and the pixel electrode layer 624. The gate insulating film 606 is formed between the electrode layer 607 and the pixel electrode layer 624; however, the gate insulating film 606 has a thickness of 50 nm to 200 nm, which is thin enough as compared with that of the liquid crystal layer with a thickness of 2 µm to 10 µm. Therefore, an electric field is generated in a direction which is substantially parallel to the substrate 600 (a horizontal direction). The alignment of the liquid crystal is controlled with this electric field. Liquid crystal molecules are horizontally rotated with the use of the electric field in the direction roughly parallel to the substrate. In this case, since the liquid crystal molecules are horizontally aligned in any state, the contrast or the like is less influenced by the viewing angle; thus, the viewing angle is increased. In addition, the aperture ratio can be improved because both the electrode layer 607 and the pixel electrode layer 624 are light-transmitting electrodes.

Next, another example of a liquid crystal display device of a horizontal electric field mode is described.

Figure 34:
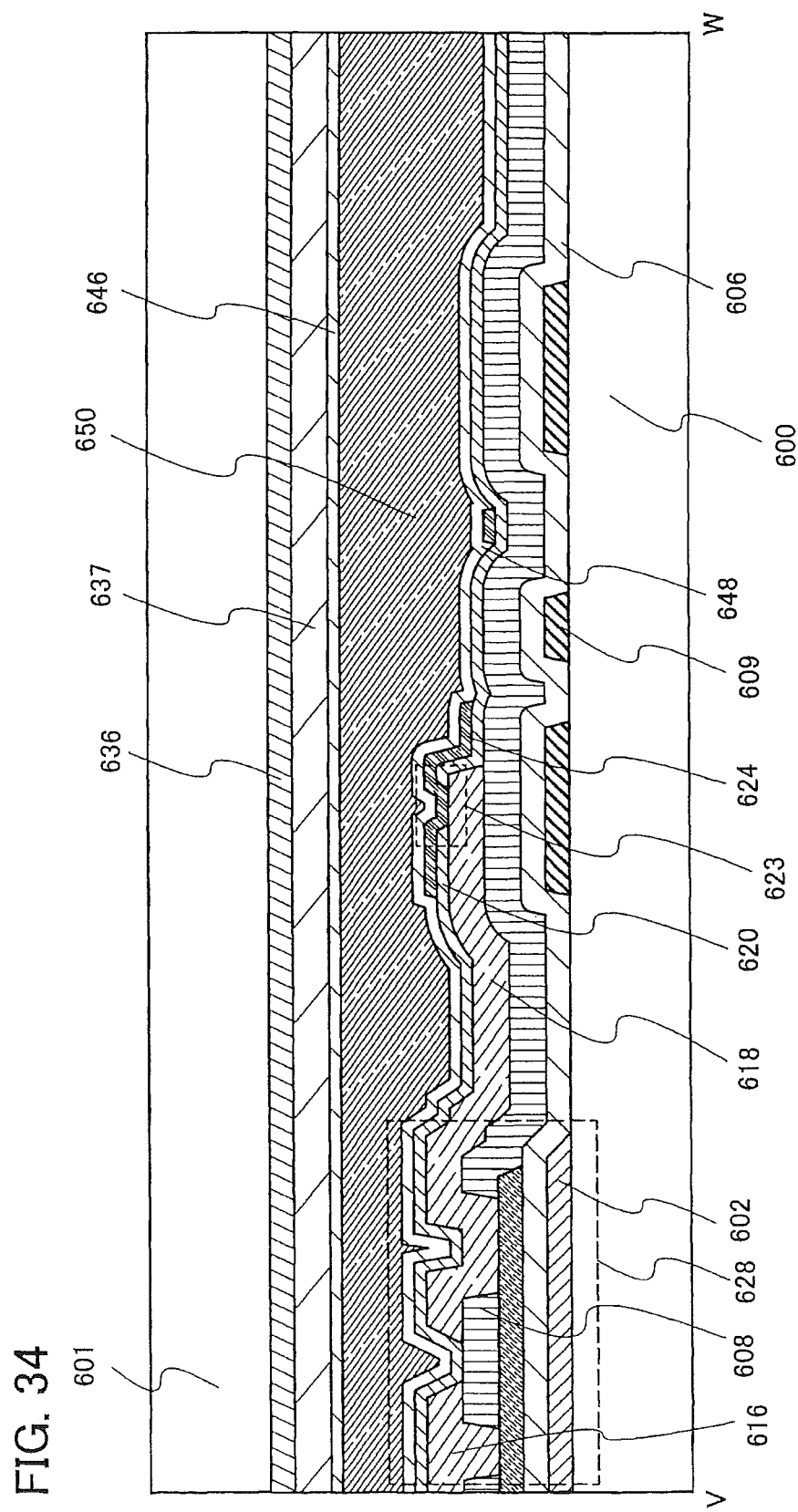
FIG. 34 illustrates a semiconductor device.
Figure 35:
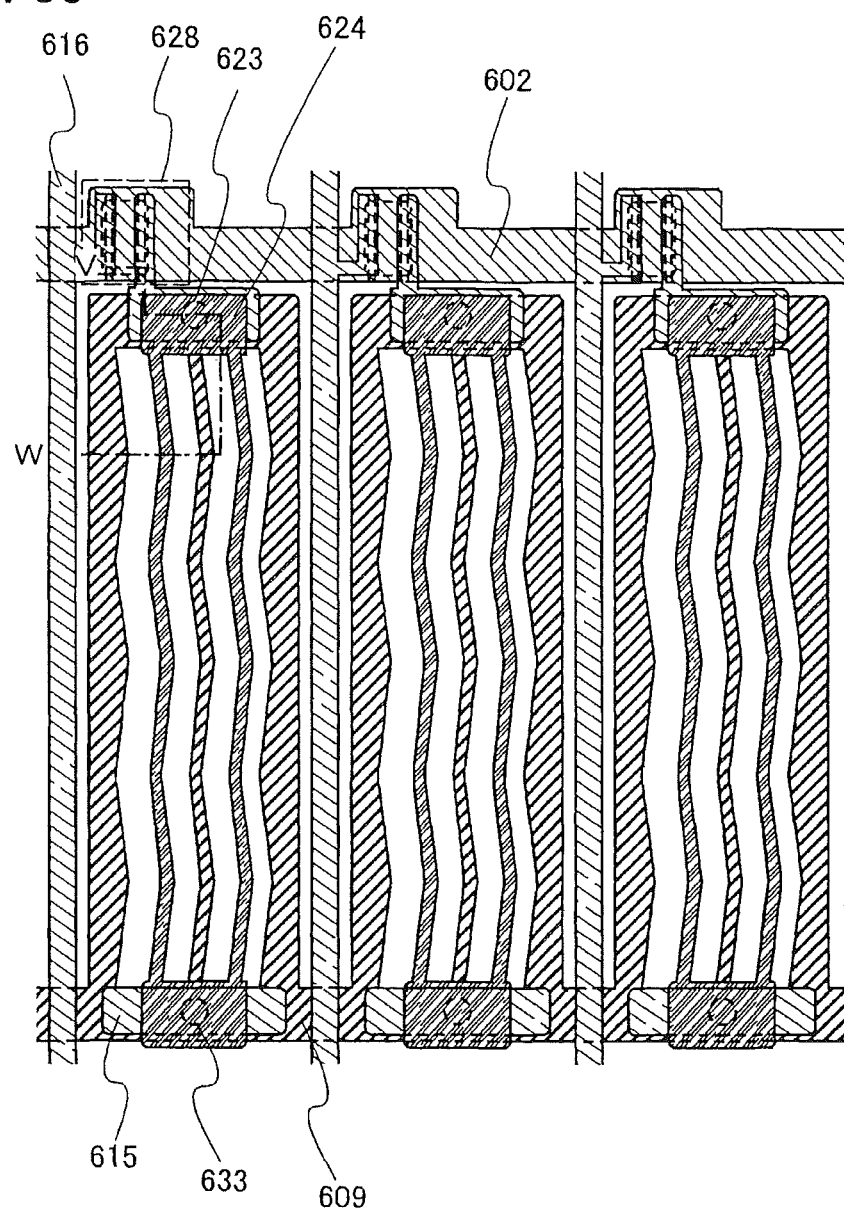
FIG. 35 illustrates a semiconductor device.

FIG. 34 and FIG. 35 illustrate a pixel structure of a liquid crystal display device of an IPS mode. FIG. 35 is a plan view, and FIG. 34 illustrates a cross-sectional structure taken along line V-W of FIG. 35. Hereinafter, description is made with reference to both of the drawings.

In FIG. 34, the counter substrate 601 is superposed on the substrate 600 over which the TFT 628 and the pixel electrode layer 624 connected thereto are formed, and liquid crystal is injected between the substrates. The counter substrate 601 is provided with the coloring film 636, the planarization film 637, and the like. Note that a counter electrode layer is not provided on the counter substrate 601 side. The liquid crystal layer 650 is formed between the substrate 600 and the counter substrate 601 with the alignment films 646 and 648 interposed therebetween.

A common potential line 609 and the TFT 628 are formed over the substrate 600. The common potential line 609 can be formed at the same time as the gate wiring 602 of the TFT 628. The thin film transistor described in any of Embodiments 1, 2, 5, and 6 can be employed as the TFT 628.

The wirings 616 and 618 of the TFT 628 are formed over a gate insulating film 606. The wiring 616 is a data line through which a video signal travels, extends in one direction in the liquid crystal display panel, is connected to a source or drain region of the TFT 628, and serves as one of source and drain electrodes. The wiring 618 serves as the other of the source and drain electrodes and is connected to the pixel electrode layer 624.

The insulating film 620 is formed over the wirings 616 and 618. Further, the pixel electrode layer 624 that is connected to the wiring 618 through the contact hole 623 formed in the insulating film 620 is formed over the insulating film 620. The pixel electrode layer 624 is formed using a material similar to that of the pixel electrode layer 427 described in Embodiment 1. As illustrated in FIG. 35, the pixel electrode layer 624 is formed such that the pixel electrode layer 624 and a comb-like electrode that is formed at the same time as the common potential line 609 can generate a horizontal electric field. Further, a comb-like portion of the pixel electrode layer 624 and the comb-like electrode that is formed at the same time as the common potential line 609 are formed so as not to overlap with each other.

When an electric field is generated between the potential applied to the pixel electrode layer 624 and that applied to the common potential line 609, the alignment of liquid crystal is controlled with this electric field. Liquid crystal molecules are horizontally rotated with the use of the electric field in the direction roughly parallel to the substrate. In this case, since the liquid crystal molecules are horizontally aligned in any state, the contrast or the like is less influenced by the viewing angle; thus, the viewing angle is increased.

In this manner, the TFT 628 and the pixel electrode layer 624 connected thereto are formed over the substrate 600. A storage capacitor is formed by providing the gate insulating film 606 between the common potential line 609 and a capacitor electrode 615. The capacitor electrode 615 is connected to the pixel electrode layer 624 through a contact hole 633.

Through the above process, the liquid crystal display device can be manufactured as a display device. The liquid crystal display device of this embodiment is a liquid crystal display device having a high aperture ratio.

Embodiment 15

When a liquid crystal display panel has a size of more than 10 inches, such as 60 inches or 120 inches, wiring resistance of a wiring having a light-transmitting property may be a problem; therefore, in this embodiment, an example in which wiring resistance is reduced by using a metal wiring as part of a gate wiring will be described.

Note that the same reference numerals are used for the same portions in FIG. 3A and FIG. 36A, and detailed description thereof is omitted. Note that this embodiment can be applied to the active matrix substrate described in Embodiment 1.

FIGS. 36A and 36B are examples in which a gate electrode layer of a thin film transistor of a driver circuit is formed using a metal wiring. In the driver circuit, the material of the gate electrode layer is not limited to a material having a light-transmitting property. Note that since the metal wiring is formed, the number of photomasks is larger than those of Embodiment 1 and Embodiment 2.

In FIG. 36A, the thin film transistor 260 of a driver circuit includes a gate electrode layer in which a second metal wiring layer 241 is stacked over a first metal wiring layer 242. Note that the first metal wiring layer 242 can be formed using the same material and through the same process as a first metal wiring layer 236. The second metal wiring layer 241 can be formed using the same material and through the same process as a second metal wiring layer 237.

In a similar manner, in FIG. 36B, the thin film transistor 270 of a driver circuit includes a gate electrode layer in which a second metal wiring layer 243 is stacked over a first metal wiring layer 244. Note that the first metal wiring layer 244 can be formed using the same material and through the same process as the first metal wiring layer 236. The second metal wiring layer 243 can be formed using the same material and through the same process as the second metal wiring layer 237.

In the case where the first metal wiring layer 242 and a conductive layer 267 are electrically connected to each other, the second metal wiring layer 241 which is provided for preventing oxidation of the first metal wiring layer 242 is preferably formed using a metal nitride film. In a similar manner, in the case where the first metal wiring layer 244 and a conductive layer 277 are electrically connected to each other, the second metal wiring layer 243 which is provided for preventing oxidation of the first metal wiring layer 244 is preferably formed using a metal nitride film.

First, a heat-resistant conductive material film (the thickness thereof is greater than or equal to 100 nm and less than or equal to 500 nm) which can endure first heat treatment for dehydration or dehydrogenation is formed over the substrate 200.

In this embodiment, a tungsten film with a thickness of 370 nm and a tantalum nitride film with a thickness of 50 nm are formed. Here, the conductive film is formed with a stack of the tantalum nitride film and the tungsten film; however, this embodiment is not particularly limited thereto. The conductive film is formed using an element selected from Ta, W, Ti, Mo, Al, and Cu, an alloy containing any of these elements as its component, an alloy film containing a combination of any of these elements, or a nitride containing any of these elements as its component. Further, the heat-resistant conductive material film is not limited to a single-layer structure containing any of the above elements, and can have a stacked-layer structure of two or more layers.

A metal wiring is formed by a first photolithography step to form the first metal wiring layer 236 and the second metal wiring layer 237, the first metal wiring layer 242 and the second metal wiring layer 241, and the first metal wiring layer 244 and the second metal wiring layer 243. An inductively coupled plasma (ICP) etching method is preferably used for etching of the tungsten film and the tantalum nitride film. The films can be etched into a desired tapered shape by appropriately adjusting the etching condition (the amount of power applied to a coil-shaped electrode, the amount of power applied to an electrode on the substrate side, the electrode temperature on the substrate side, or the like) using an ICP etching method. When the first metal wiring layer 236 and the second metal wiring layer 237 are etched into a tapered shape, defects in formation of the light-transmitting conductive film which is formed over and in contact with the metal wiring layers can be reduced.

Then, after formation of the light-transmitting conductive film, a gate wiring layer 238 and the gate electrode layer of the thin film transistor 220 are formed by a second photolithography step. The light-transmitting conductive film is formed using the conductive material having a light-transmitting property with respect to visible light, which is described in Embodiment 1.

For example, if there is an interface of the gate wiring layer 238, which is in contact with the first metal wiring layer 236 or the second metal wiring layer 237, an oxide film may be formed by heat treatment performed later so that contact resistance may be increased depending on the material of the light-transmitting conductive film; therefore, the second metal wiring layer 237 is preferably formed using a metal nitride film which prevents oxidation of the first metal wiring layer 236.

Next, the gate insulating layer, the oxide semiconductor layer, and the like are formed in the same process as Embodiment 1. Subsequent steps are performed in accordance with Embodiment 1, so that an active matrix substrate is manufactured.

The gate wiring layer 238 overlapping with part of the second metal wiring layer 237 is illustrated in FIGS. 36A and 36B. Alternatively, the gate wiring layer may cover the whole part of the first metal wiring layer 236 and the second metal wiring layer 237. In other words, the first metal wiring layer 236 and the second metal wiring layer 237 can be referred to as auxiliary wirings for reducing resistance of the gate wiring layer 238.

In addition, in a terminal portion, a first terminal electrode whose potential is the same as that of the gate wiring is formed over the protective insulating layer 203 and electrically connected to the second metal wiring layer 237. A wiring led from the terminal portion is also formed using a metal wiring.

In addition, the metal wiring for reducing the wiring resistance, that is, the first metal wiring layer 236 and the second metal wiring layer 237 can be used as auxiliary wirings for a gate wiring layer and a capacitor wiring layer in a portion other than a display portion.

In this embodiment, the wiring resistance is reduced by partly using the metal wiring. Accordingly, even in the case where a liquid crystal display panel has a size of more than 10 inches, such as 60 inches or 120 inches, high definition of a displayed image can be obtained, so that a high aperture ratio can be achieved.

Example 1

In this example, an oxygen diffusion phenomenon due to heat treatment in an oxide semiconductor layer including a region having high oxygen density and a region having low oxygen density was simulated. The results are described with reference to FIG. 37 and FIG. 38. Here, as software for the simulation, Materials Explorer 5.0 manufactured by Fujitsu Limited was used.

Figure 37:
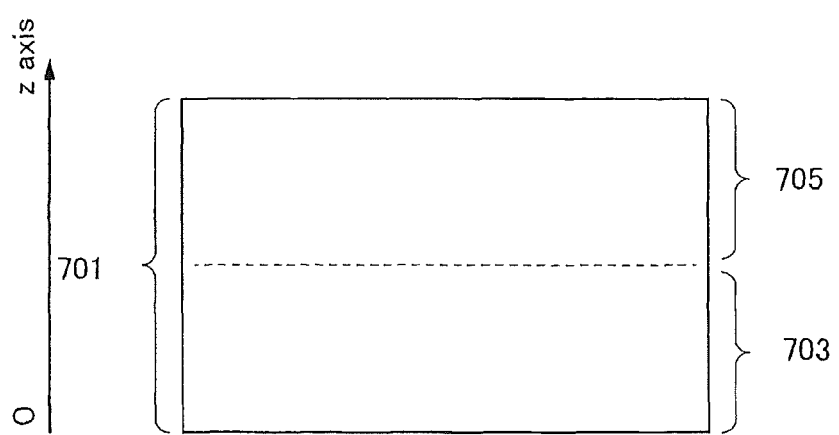
FIG. 37 illustrates a structure of an oxide semiconductor layer used for simulation.

FIG. 37 illustrates a model of an oxide semiconductor layer which was used for the simulation. An oxide semiconductor layer 701 has a stacked structure of a layer 703 having low oxygen density and a layer 705 having high oxygen density.

Here, the layer 703 having low oxygen density was formed to have an amorphous structure in which the numbers of In atoms, Ga atoms, and Zn atoms were each 15 and the number of O atoms was 54.

Further, the layer 705 having high oxygen density was formed to have an amorphous structure in which the numbers of In atoms, Ga atoms, and Zn atoms were each 15 and the number of O atoms was 66.

Furthermore, the density of the oxide semiconductor layer 701 was set to 5.9 g/cm$^3$.

Next, a classical MD (molecular dynamics) simulation was performed on the oxide semiconductor layer 701 under conditions of NVT ensemble and a temperature of 250° C. The time step and the total simulation time were set to 0.2 fs and 200 ps, respectively. A Born-Mayer-Huggins potential was applied to metal-oxygen bonding and oxygen-oxygen bonding. Movement of the atoms of an upper end and a lower end of the oxide semiconductor layer 701 was fixed.

Figure 38:
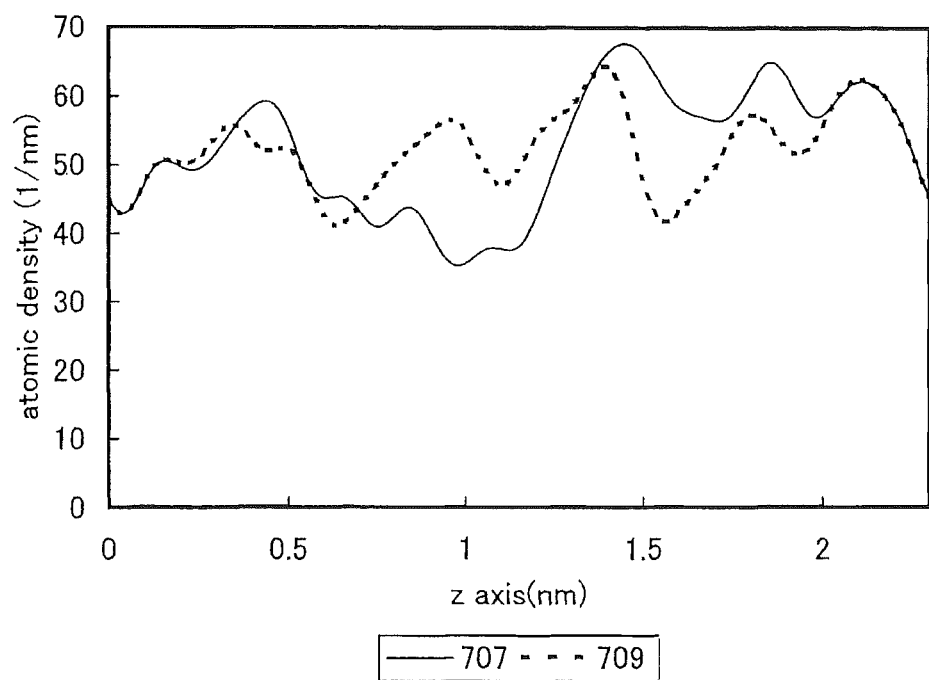
FIG. 38 shows simulation results of oxygen density of an oxide semiconductor layer.

The simulation results are shown in FIG. 38. The layer 703 having low oxygen density is indicated by the range from 0 nm to 1.15 nm in a z-axis coordinate, and the layer 705 having high oxygen density is indicated by the range from 1.15 nm to 2.3 nm in the z-axis coordinate. Distribution of oxygen density before the MD simulation is indicated by a solid line 707, and distribution of oxygen density after the MD simulation is indicated by a dashed line 709.

The solid line 707 shows that the oxide semiconductor layer 701 has higher oxygen densities in a region ranging from the interface between the layer 703 having low oxygen density and the layer 705 having high oxygen density to the layer 705 having high oxygen density.

Therefore, in the case where distribution of oxygen density is uneven as in a stacked state of the layer 703 having low oxygen density and the layer 705 having high oxygen density, it is found that by heat treatment, oxygen diffuses from a region having high oxygen density to a region having low oxygen density and the oxygen density becomes uniform.

In other words, as described in Embodiments 1 and 6, since the oxygen density at the interface between an oxide semiconductor layer and an oxide insulating layer is increased by formation of the oxide insulating layer over the oxide semiconductor layer, the oxygen diffuses into a region having low oxygen density of the oxide semiconductor layer and the resistance of the oxide semiconductor layer is increased.

Figure 39A:
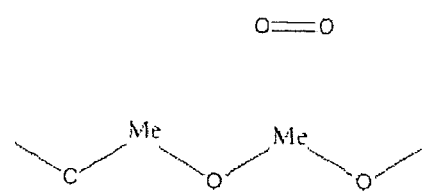
FIGS. 39A to 39C illustrate an interaction between oxygen and a surface of an oxide semiconductor film.
Figure 39B:
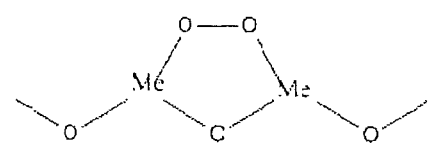
Figure 39C:
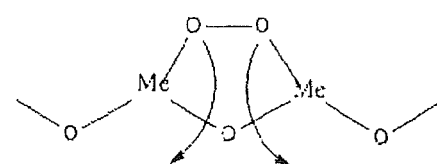

As described in this example, oxygen adsorbed to a surface of the oxide semiconductor layer is ionically bonded to a metal ion (Me) contained in the oxide semiconductor layer and diffuses inside the oxide semiconductor layer in a state of an oxygen atom (see FIGS. 39A to 39C).

This application is based on Japanese Patent Application serial no. 2009-179773 filed with Japan Patent Office on Jul. 31, 2009, the entire contents of which are hereby incorporated by reference.

The invention claimed is:

1. A display device comprising:
   a driver circuit and a pixel portion,
   wherein the driver circuit includes:
      a first conductive layer;
      a first insulating layer over the first conductive layer;
      a first semiconductor layer over the first insulating layer, the first semiconductor layer overlapping with the first conductive layer;
      a second insulating layer over the first semiconductor layer, the second insulating layer including a first contact hole and a second contact hole, wherein the second insulating layer covers a periphery of the first semiconductor layer;
      a second conductive layer over the second insulating layer, the second conductive layer electrically connected to the first semiconductor layer through the first contact hole;

a third conductive layer over the second insulating layer, the third conductive layer electrically connected to the first semiconductor layer through the second contact hole; and a fourth conductive layer over the second insulating layer, the fourth conductive layer overlapping with the first semiconductor layer, wherein the pixel portion includes:
a fifth conductive layer;
a third insulating layer over the fifth conductive layer;
a second semiconductor layer over the third insulating layer, the second semiconductor layer overlapping with the fifth conductive layer;
a fourth insulating layer over the second semiconductor layer, the fourth insulating layer including a third contact hole and a fourth contact hole, wherein the fourth insulating layer covers a periphery of the second semiconductor layer;
a sixth conductive layer over the fourth insulating layer, the sixth conductive layer electrically connected to the second semiconductor layer through the third contact hole; and
a seventh conductive layer over the fourth insulating layer, the seventh conductive layer electrically connected to the second semiconductor layer through the fourth contact hole, wherein the fourth conductive layer is electrically connected to the first conductive layer, and wherein the fourth conductive layer is a same material with the seventh conductive layer.

2. The display device according to claim 1,
wherein the pixel portion further comprising:
an eighth conductive layer over the fourth insulating layer, the eighth conductive layer being in contact with the second semiconductor layer through the fourth contact hole.

3. The display device according to claim 2, wherein the seventh conductive layer is electrically connected to the second semiconductor layer through the eighth conductive layer.

4. The display device according to claim 1, further comprising:
a fifth insulating layer over the second conductive layer, the third conductive layer, and sixth conductive layer,
wherein the fourth conductive layer and the seventh conductive layer is positioned on the fifth insulating layer.

5. The display device according to claim 1, wherein an entirety of the first semiconductor layer overlaps with the first conductive layer.

6. The display device according to claim 1, wherein an entirety of the second semiconductor layer overlaps with the fifth conductive layer.

7. The display device according to claim 1, wherein the first contact hole overlaps with the first conductive layer, and wherein the second contact hole overlaps with the first conductive layer.

8. The display device according to claim 1, wherein the third contact hole overlaps with the fifth conductive layer, and wherein the fourth contact hole overlaps with the fifth conductive layer.

9. A display device comprising:
a driver circuit and a pixel portion,
wherein the driver circuit includes:
a first conductive layer;
a first insulating layer over the first conductive layer;
a first oxide semiconductor layer over the first insulating layer, the first oxide semiconductor layer overlapping with the first conductive layer;
a second insulating layer over the first oxide semiconductor layer, the second insulating layer including a first contact hole and a second contact hole, wherein the second insulating layer covers a periphery of the first oxide semiconductor layer;
a second conductive layer over the second insulating layer, the second conductive layer electrically connected to the first oxide semiconductor layer through the first contact hole;
a third conductive layer over the second insulating layer, the third conductive layer electrically connected to the first oxide semiconductor layer through the second contact hole; and
a fourth conductive layer over the second insulating layer, the fourth conductive layer overlapping with the first oxide semiconductor layer, wherein the pixel portion includes:
a fifth conductive layer;
a third insulating layer over the fifth conductive layer;
a second oxide semiconductor layer over the third insulating layer, the second oxide semiconductor layer overlapping with the fifth conductive layer;
a fourth insulating layer over the second oxide semiconductor layer, the fourth insulating layer including a third contact hole and a fourth contact hole, wherein the fourth insulating layer covers a periphery of the second oxide semiconductor layer;
a sixth conductive layer over the fourth insulating layer, the sixth conductive layer electrically connected to the second oxide semiconductor layer through the third contact hole; and
a seventh conductive layer over the fourth insulating layer, the seventh conductive layer electrically connected to the second oxide semiconductor layer through the fourth contact hole, wherein the fourth conductive layer is electrically connected to the first conductive layer, and wherein the fourth conductive layer is a same material with the seventh conductive layer.

10. The display device according to claim 9,
wherein the pixel portion further comprising:
an eighth conductive layer over the fourth insulating layer, the eighth conductive layer being in direct contact with the second oxide semiconductor layer through the fourth contact hole.

11. The display device according to claim 10, wherein the seventh conductive layer is electrically connected to the second oxide semiconductor layer through the eighth conductive layer.

12. The display device according to claim 9, further comprising:
a fifth insulating layer over the second conductive layer, the third conductive layer, and sixth conductive layer,
wherein the fourth conductive layer and the seventh conductive layer is positioned on the fifth insulating layer.

13. The display device according to claim 9, wherein an entirety of the first oxide semiconductor layer overlaps with the first conductive layer.

14. The display device according to claim 9, wherein an entirety of the second oxide semiconductor layer overlaps with the fifth conductive layer.

15. The display device according to claim 9,
wherein the first contact hole overlaps with the first conductive layer, and
wherein the second contact hole overlaps with the first conductive layer.

16. The display device according to claim 9,
wherein the third contact hole overlaps with the fifth conductive layer, and
wherein the fourth contact hole overlaps with the fifth conductive layer.

17. A display device comprising:
a driver circuit and a pixel portion,
wherein the driver circuit includes:
- a first conductive layer;
- a first insulating layer over the first conductive layer;
- a first semiconductor layer over the first insulating layer, the first semiconductor layer overlapping with the first conductive layer;
- a second insulating layer over the first semiconductor layer, the second insulating layer including a first contact hole and a second contact hole, wherein the second insulating layer covers a periphery of the first semiconductor layer;
- a second conductive layer over the second insulating layer, the second conductive layer electrically connected to the first semiconductor layer through the first contact hole;
- a third conductive layer over the second insulating layer, the third conductive layer electrically connected to the first semiconductor layer through the second contact hole; and
- a fourth conductive layer over the second insulating layer, the fourth conductive layer overlapping with the first semiconductor layer, wherein the pixel portion includes:
- a fifth conductive layer;
- a third insulating layer over the fifth conductive layer;
- a second semiconductor layer over the third insulating layer, the second semiconductor layer overlapping with the fifth conductive layer;
- a fourth insulating layer over the second semiconductor layer, the fourth insulating layer including a third contact hole and a fourth contact hole, wherein the fourth insulating layer covers a periphery of the second semiconductor layer;
- a sixth conductive layer over the fourth insulating layer, the sixth conductive layer electrically connected to the second semiconductor layer through the third contact hole;
- a seventh conductive layer over the fourth insulating layer, the seventh conductive layer electrically connected to the second semiconductor layer through the fourth contact hole;
- a fifth insulating layer over and in contact with the fourth insulating layer in an entire region in which the second semiconductor layer overlaps with the fifth conductive layer,
wherein the fourth conductive layer is electrically connected to the first conductive layer, and
wherein the fourth conductive layer is a same material with the seventh conductive layer.

* * * * *